(12) United States Patent
Andrews et al.

(10) Patent No.: US 9,172,012 B2
(45) Date of Patent: Oct. 27, 2015

(54) MULTI-CHIP LIGHT EMITTER PACKAGES AND RELATED METHODS

(71) Applicant: CREE, Inc., Durham, NC (US)

(72) Inventors: Peter S. Andrews, Durham, NC (US); Kurt S. Wilcox, Libertyville, IL (US); Theodore Lowes, Lompoc, CA (US); Bernd P. Keller, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/796,045

(22) Filed: Mar. 12, 2013

(65) Prior Publication Data

US 2013/0256710 A1 Oct. 3, 2013

Related U.S. Application Data

(63) Continuation-in-part of application No. 13/441,620, filed on Apr. 6, 2012, and a continuation-in-part of
(Continued)

(51) Int. Cl.
*H01L 21/00* (2006.01)
*H01L 33/00* (2010.01)
(Continued)

(52) U.S. Cl.
CPC ............... *H01L 33/58* (2013.01); *H01L 24/97* (2013.01); *H01L 25/0753* (2013.01); *H01L 33/54* (2013.01); *H01L 33/62* (2013.01);
(Continued)

(58) Field of Classification Search
CPC .................... H01L 2924/12041; H01L 25/048

USPC ............... 257/95–100, 699–712, E33.056; 438/22–29
See application file for complete search history.

(56) References Cited

U.S. PATENT DOCUMENTS 4,946,547 A 8/1990 Palmour
5,200,022 A 4/1993 Kong
(Continued)

FOREIGN PATENT DOCUMENTS

CN ZL201230476421.3 5/2014
EP 002114934-0001 10/2012
(Continued)

OTHER PUBLICATIONS

Chinese Office Action for Application No. 201230476421.3 dated Jul. 18, 2013.
(Continued)

*Primary Examiner* — Calvin Lee
(74) *Attorney, Agent, or Firm* — Jenkins, Wilson, Taylor & Hunt, P.A.

(57) ABSTRACT

Light emitter packages having multiple light emitter chips, such as light emitting diode (LED) chips, and related methods are provided. In one embodiment, a light emitter package can include a ceramic submount. An array of light emitter chips can be disposed over a portion of the submount, and each light emitter chip can include a horizontal chip structure having positive and negative electrical contacts disposed on a same side. The positive and negative electrical contacts can be adapted to electrically communicate to conductive portions of the submount. Light emitter packages can further include a lens overmolded on the submount and covering a portion of the array.

27 Claims, 32 Drawing Sheets

Related U.S. Application Data application No. 13/017,502, filed on Jan. 31, 2011, which is a continuation-in-part of application No. 11/982,275, filed on Oct. 31, 2007.

(60) Provisional application No. 61/644,913, filed on May 9, 2012, provisional application No. 61/384,623, filed on Sep. 20, 2010, provisional application No. 61/390,963, filed on Oct. 7, 2010.

(51) Int. Cl.
*H01L 33/58* (2010.01)
*H01L 25/075* (2006.01)
*H01L 33/54* (2010.01)
*H01L 33/62* (2010.01)
*H01L 33/64* (2010.01)
*H01L 33/40* (2010.01)
*H01L 23/00* (2006.01)

(52) U.S. Cl.
CPC .............. *H01L 33/64* (2013.01); *H01L 24/48* (2013.01); *H01L 24/49* (2013.01); *H01L 33/405* (2013.01); *H01L 33/647* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2924/00014* (2013.01); *H01L 2924/01019* (2013.01); *H01L 2924/01087* (2013.01); *H01L 2924/01322* (2013.01); *H01L 2924/12041* (2013.01); *H01L 2924/19107* (2013.01)

(56) References Cited

U.S. PATENT DOCUMENTS

| | | | |
|---|---|---|---|
| RE34,861 E | 2/1995 | Davis | |
| 6,410,940 B1 | 6/2002 | Jiang et al. | |
| 6,853,010 B2 | 2/2005 | Slater, Jr. | |
| 7,213,940 B1 | 5/2007 | Van De Ven | |
| 7,244,965 B2 * | 7/2007 | Andrews et al. | 257/98 |
| 7,549,786 B2 | 6/2009 | Higley | |
| 7,550,319 B2 | 6/2009 | Wang et al. | |
| 7,790,485 B2 | 9/2010 | Nomura et al. | |
| 7,791,061 B2 | 9/2010 | Edmond | |
| 7,821,023 B2 * | 10/2010 | Yuan et al. | 257/98 |
| D634,718 S | 3/2011 | Chuang et al. | |
| 7,967,652 B2 | 6/2011 | Emerson | |
| 8,044,418 B2 | 10/2011 | Loh et al. | |
| 8,058,088 B2 | 11/2011 | Cannon | |
| D650,343 S | 12/2011 | Andrews et al. | |
| 8,113,699 B2 | 2/2012 | Tsutsumi | |
| D658,139 S | 4/2012 | Andrews et al. | |
| 8,267,550 B2 | 9/2012 | Wang | |
| 8,309,974 B2 | 11/2012 | Nakayama et al. | |
| 8,337,214 B2 | 12/2012 | Sheek | |
| 8,379,407 B2 | 2/2013 | Bibee | |
| 8,421,089 B2 | 4/2013 | Kim | |
| D703,624 S | 4/2014 | Andrews et al. | |
| D704,154 S | 5/2014 | Andrews et al. | |
| 2002/0085390 A1 | 7/2002 | Kiyomoto et al. | |
| 2007/0057364 A1 | 3/2007 | Wang et al. | |
| 2007/0158668 A1 | 7/2007 | Tarsa | |
| 2008/0054286 A1 | 3/2008 | Loh et al. | |
| 2008/0173884 A1 | 7/2008 | Chitnis | |
| 2008/0179611 A1 | 7/2008 | Chitnis | |
| 2008/0258130 A1 | 10/2008 | Bergmann | |
| 2008/0291688 A1 | 11/2008 | Higashi | |
| 2009/0039379 A1 | 2/2009 | Shiraishi et al. | |
| 2009/0108281 A1 | 4/2009 | Keller | |
| 2009/0283787 A1 | 11/2009 | Donofrio | |
| 2010/0149771 A1 | 6/2010 | Villard | |
| 2010/0155763 A1 | 6/2010 | Donofrio | |
| 2010/0258819 A1 | 10/2010 | Marfeld et al. | |
| 2010/0259916 A1 * | 10/2010 | Sun | 362/84 |
| 2011/0068696 A1 | 3/2011 | Van de Ven | |
| 2011/0068702 A1 | 3/2011 | Van de Ven | |
| 2011/0090691 A1 | 4/2011 | Markle | |
| 2011/0220929 A1 | 9/2011 | Collins | |
| 2011/0309396 A1 | 12/2011 | Wang et al. | |
| 2012/0068198 A1 | 3/2012 | Andrews | |
| 2012/0091496 A1 | 4/2012 | Chien et al. | |
| 2012/0193648 A1 | 8/2012 | Donofrio | |
| 2012/0193649 A1 | 8/2012 | Donofrio | |
| 2012/0193660 A1 | 8/2012 | Donofrio | |
| 2012/0305949 A1 | 12/2012 | Donofrio | |
| 2013/0092960 A1 | 4/2013 | Wilcox et al. | |
| 2013/0160248 A1 | 6/2013 | Keyaki et al. | |
| 2013/0240918 A1 | 9/2013 | Herrmann et al. | |
| 2013/0270581 A1 | 10/2013 | Lowes | |
| 2013/0322068 A1 | 12/2013 | Clark et al. | |
| 2014/0104865 A1 | 4/2014 | Hutchins | |

FOREIGN PATENT DOCUMENTS

| | | |
|---|---|---|
| EP | 002114934-0002 | 10/2012 |
| EP | 2008316 | 3/2014 |
| JP | 1485299 | 11/2013 |

OTHER PUBLICATIONS

Japanese Invitation for Amendment for Application No. 2012-024518 dated Jul. 30, 2013.
Japanese Decision of Registration for Design Application No. 2012-024518 dated Sep. 24, 2013.
Restriction Requirement for U.S. Appl. No. 29/417,704 dated Oct. 2, 2013.
Restriction Requirement for U.S. Appl. No. 29/433,842 dated Oct. 2, 2013.
Chinese Office Action for Application No. 201230476421.3 dated Oct. 14, 2013.
Notice of Allowance for U.S. Appl. No. 29/417,704 dated Nov. 26, 2013.
Notice of Allowance for U.S. Appl. No. 29/433,842 dated Dec. 6, 2013.
Chinese Notice of Grant for Application No. 201230476421.3 dated Jan. 16, 2014.
Restriction Requirement for U.S. Appl. No. 13/441,620 dated Mar. 4, 2014.
U.S. Appl. No. 13/424,699 dated Mar. 20, 2012.
Japanese Office Action for Application No. 2012-024518 dated Feb. 26, 2013.
Restriction Requirement for U.S. Appl. No. 13/796,954 dated Sep. 5, 2014.
Non-Final Office Action for U.S. Appl. No. 13/441,620 dated Sep. 5, 2014.
Final Office Action for U.S. Appl. No. 13/441,620 dated Dec. 23, 2014.
Notice of Allowance for U.S. Appl. No. 13/441,620 dated Mar. 6, 2015.
Corrected Notice of Allowability for U.S. Appl. No. 13/441,620 dated May 7, 2015.
Notice of Allowance for U.S. Appl. No. 13/441,620 dated May 21, 2015.

* cited by examiner

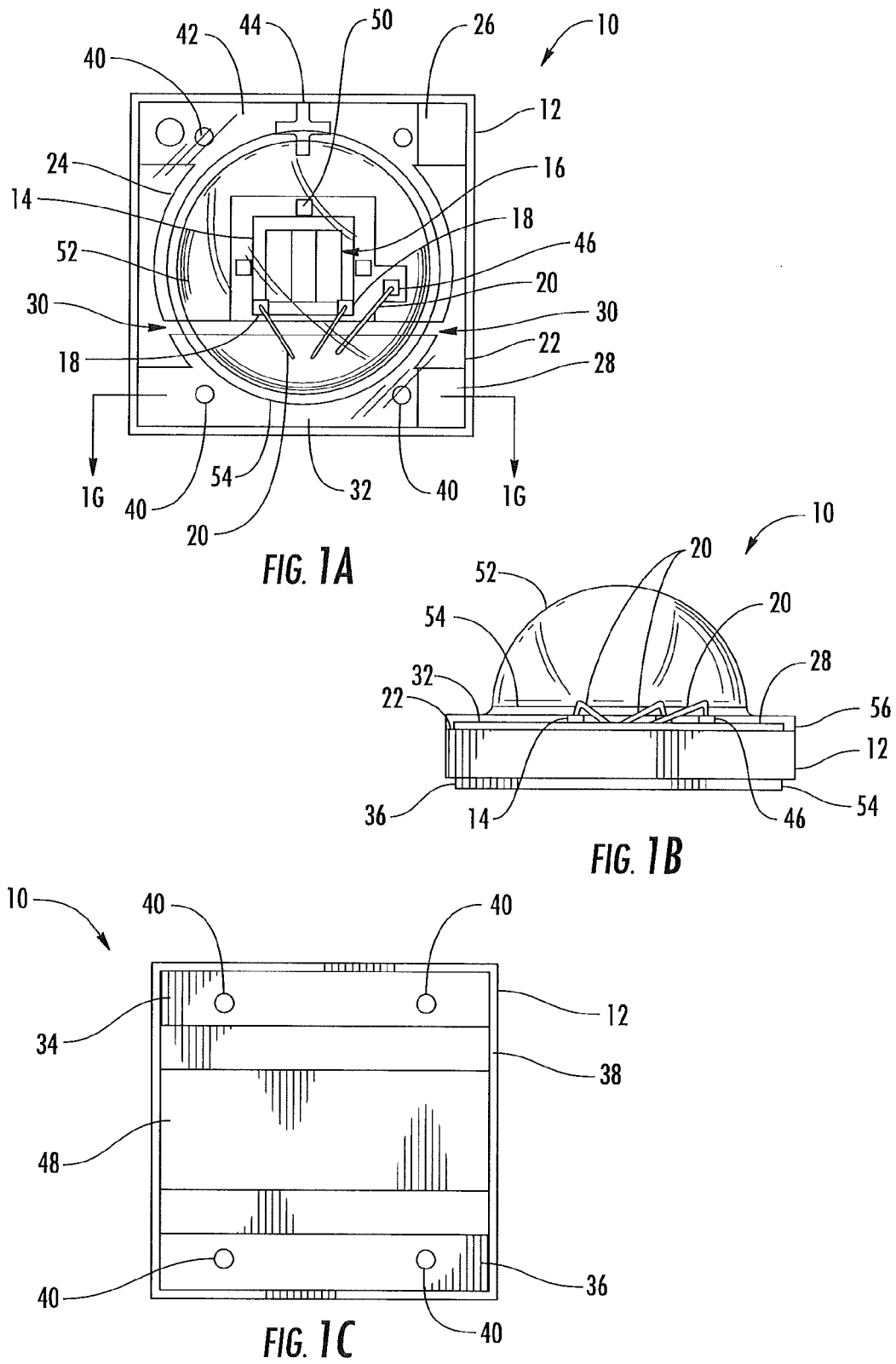

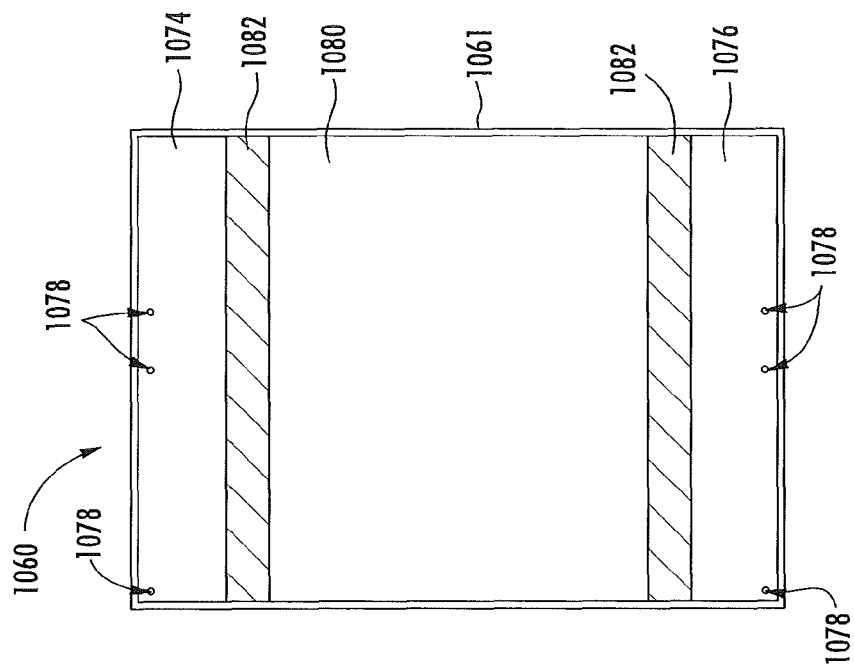
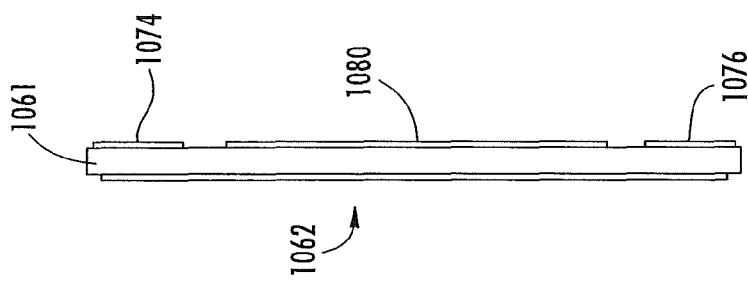
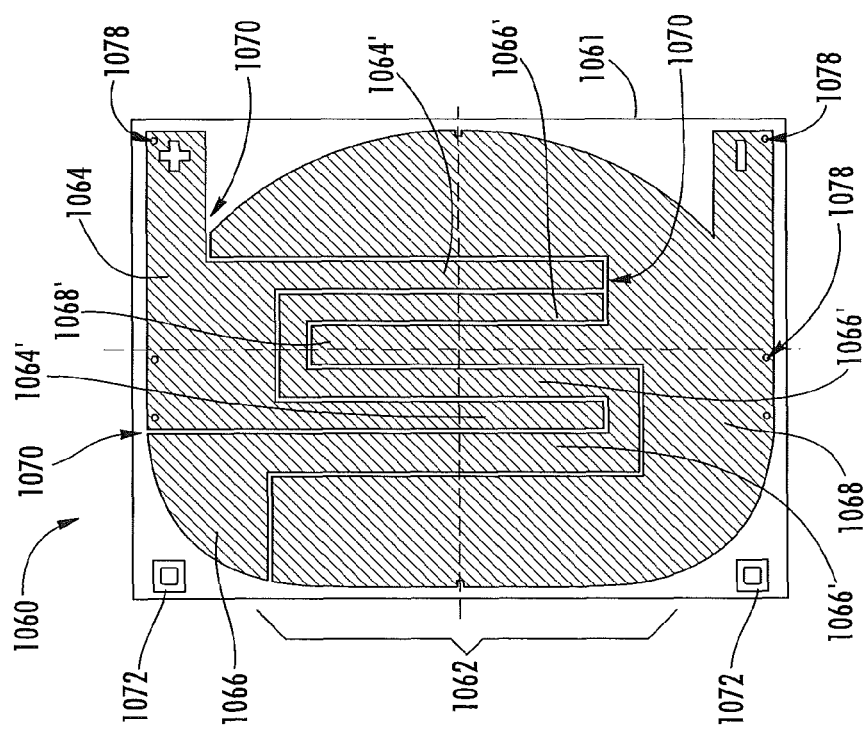

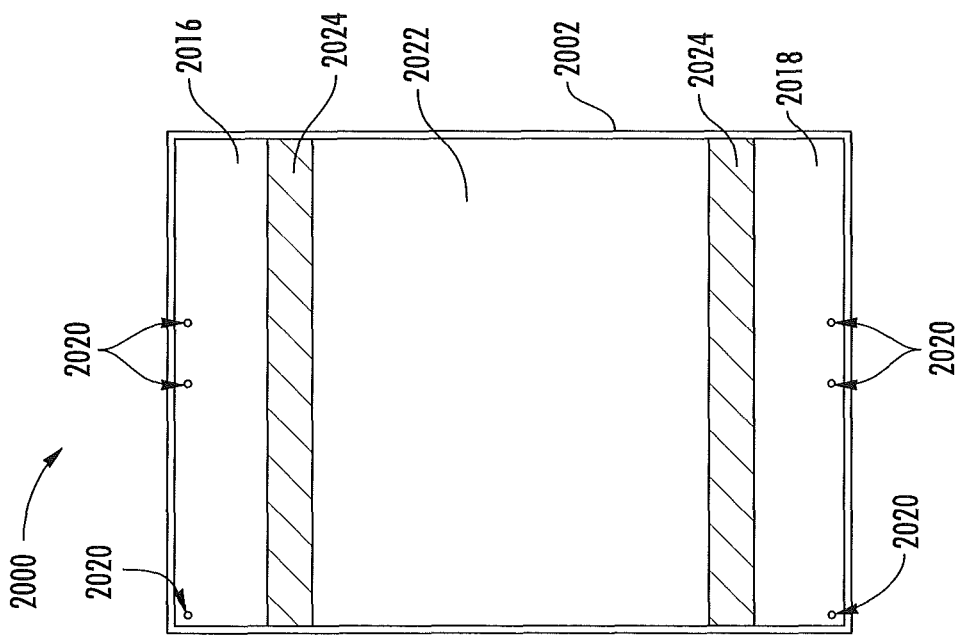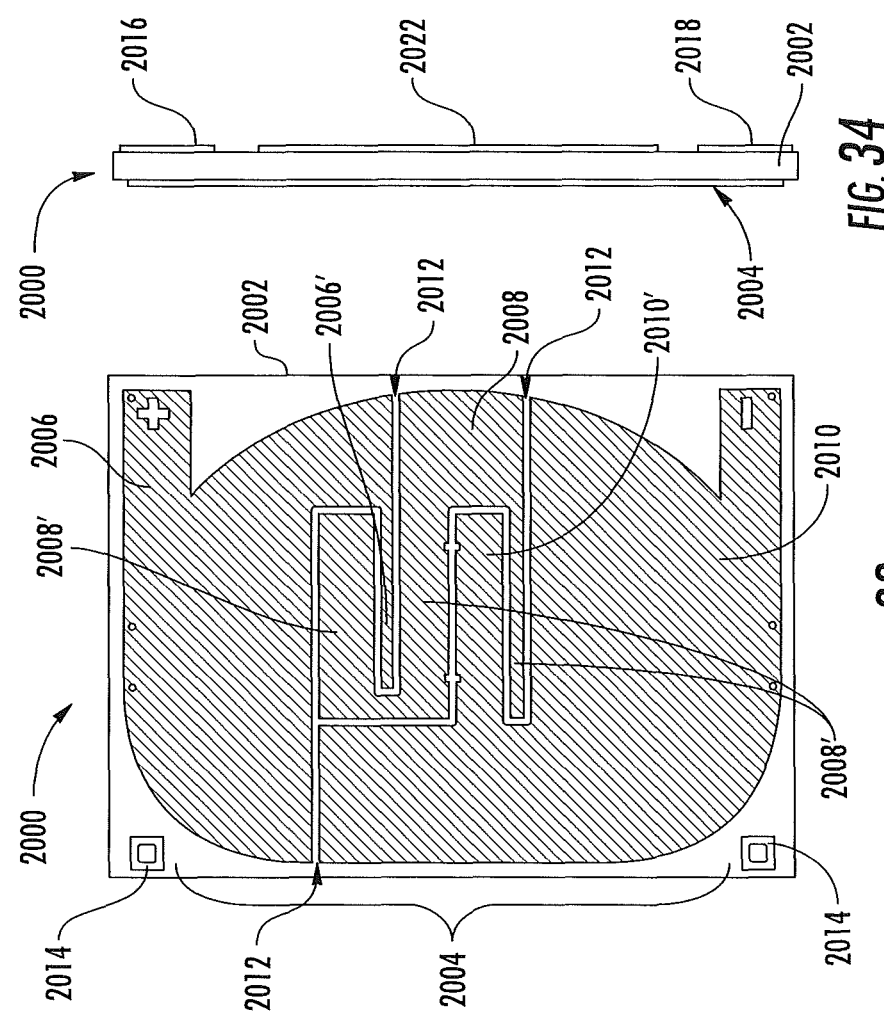

MULTI-CHIP LIGHT EMITTER PACKAGES AND RELATED METHODS

RELATED APPLICATIONS

This application claims priority to U.S. Provisional Patent Application Ser. No. 61/644,913, filed on May 9, 2012, and is also a continuation-in-part of co-pending U.S. patent application Ser. No. 13/441,620, filed on Apr. 6, 2012, which is a continuation-in-part of co-pending U.S. patent application Ser. No. 11/982,275, filed Oct. 31, 2007, and which is also a continuation-in-part of co-pending U.S. patent application Ser. No. 13/017,502, filed Jan. 31, 2011, which is based on Provisional Patent Application Ser. No. 61/384,623, filed Sep. 20, 2010 and which is also based on Provisional Patent Application Ser. No. 61/390,963, filed Oct. 7, 2010. The entire contents of each of these references are hereby incorporated by reference herein.

TECHNICAL FIELD

This present subject matter relates to packages for light emitters such as light emitting diode (LED) chips. More particularly, the present subject matter relates to light emitter packages having multiple LED chips and related methods.

BACKGROUND

Light emitter chips, such as light emitting diode (LED) chips are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED chip.

In order to use an LED chip in a circuit or other like arrangement, it is known to enclose the LED chip in an LED package to provide environmental and/or mechanical protection, color selection, focusing and the like. The LED package can include electrical leads, contacts, and/or traces for electrically connecting package to an external circuit. Conventional packages can experience heat dissipation problems, for example, arising from poor heat dissipation from areas below and/or adjacent to the LED chip. Heat can localize underneath LED chips and can continue to increase during operation. This can result in failure and/or a reduced lifetime of the LED package. A need exists for improving thermal management within LED packages. Multiple LED chips used within an LED package increases the need for improved thermal management.

In addition to thermal management considerations, manufacturers of LED lighting products are constantly seeking ways to reduce their cost in order to provide a lower initial cost to customers, and encourage the adoption of LED products. Brighter, more efficient LED chips and/or packages can allow lighting manufacturers to use fewer LED chips to get the same brightness at a lower cost or increase brightness levels using the same LED chip count and power. Such improvements can enable delivery of improved LED for less total cost than other solutions.

Thus, despite the availability of various LED packages in the marketplace, a need remains for cooler, brighter, more cost-effective LED packages and/or methods which consume the same and/or less power as compared to conventional packages. Such packages and methods can also make it easier for end-users to justify switching to LED products from a return on investment or payback perspective.

SUMMARY

In accordance with this disclosure, multiple chip light emitter packages and related methods having improved performance are provided and described herein. For example, packages and methods described herein can advantageously exhibit improved thermal properties, brightness, light extraction, and/or ease of manufacture at a lower overall cost. In one aspect, packages and methods described herein offer cost-effective lighting solutions well suited for a variety of applications such as personal, industrial, and commercial lighting products and applications including, for example, indoor lighting, LED light bulbs, accent and track lighting, directional, low bay, high bay, roadway, parking, portable lighting, bicycle lighting, solar-powered lighting, battery-powered lighting, and high end lighting fixtures, products and/or applications. It is, therefore, an object of the present disclosure to provide light emitter packages and methods having improved performance, in one aspect, by using LED chips that can be directly attached (e.g., bond pad-down design which eliminates the need for wire bonds) to underlying package components as well as incorporation of an asymmetrical lens. Notably, packages and methods described herein can exhibit at least approximately 100 lumens per watt (LPW) or more at 1.5 amps (A) and/or 9 watts (W), which is brighter and more efficient than conventional LED packages.

These and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which:

FIGS. 1A to 1G are top, side, bottom, upper perspective, bottom perspective, and sectional views, respectively, illustrating an embodiment of a light emitter package, such as a light emitting diode (LED) package according to the present subject matter;

FIGS. 29 to 31 are top, side, and bottom views illustrating a submount and electrical traces or pads according to another embodiment of the present subject matter;

FIGS. 33 to 35 are top, side, and bottom views illustrating a submount and electrical traces or pads according to another embodiment of the present subject matter.

DETAILED DESCRIPTION

Figure 1D:
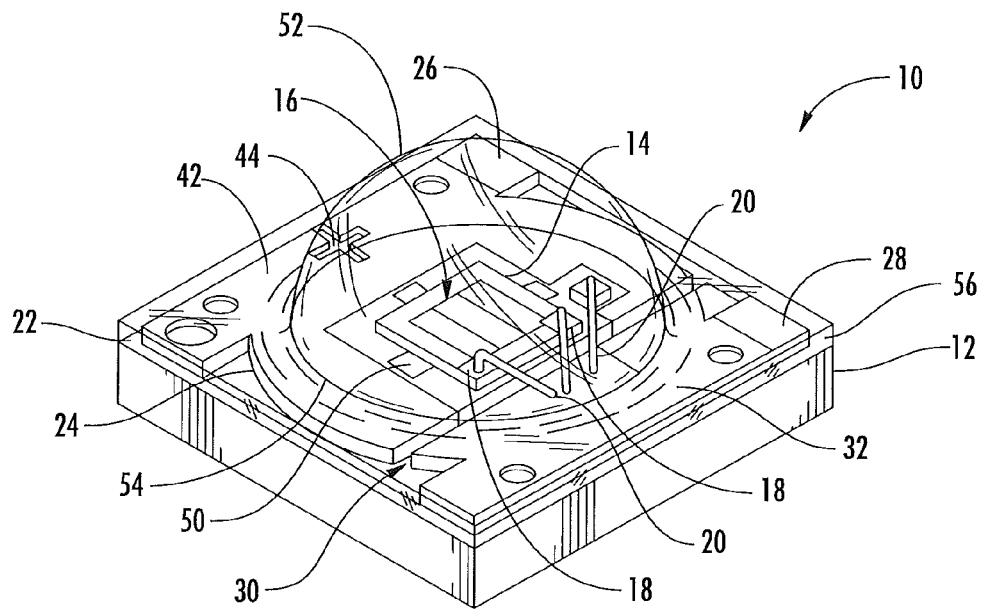
Figure 1E:
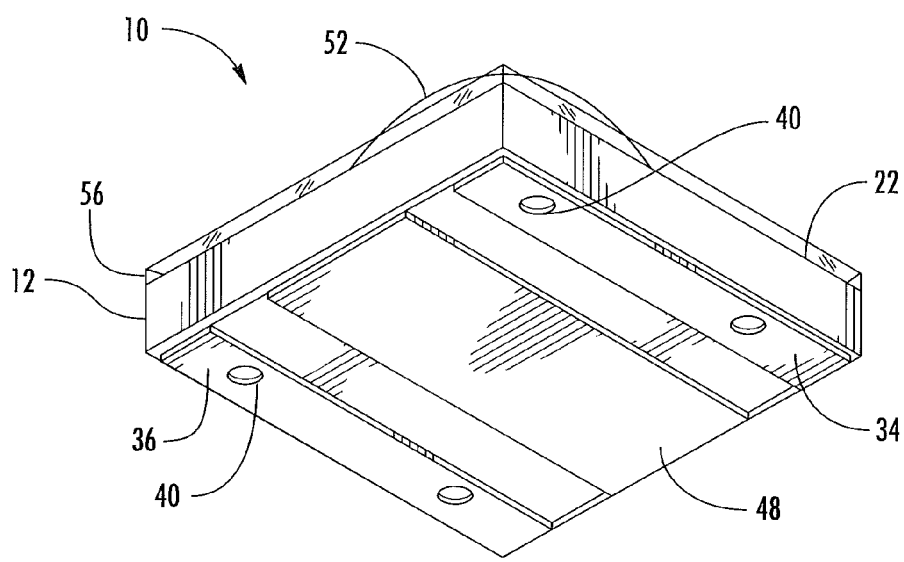

The subject matter disclosed herein is directed to packages and methods for use with light emitters, such as light emitting diodes (LEDs). Packages and methods described herein exhibit improved performance, for example, improved efficiency, brightness, and/or light extraction at a lower cost than conventional packages. Packages described herein can utilize one or more LED chips directly attached (e.g., without wire bonds) to package components. In one aspect, packages described herein can exhibit improved light output, reliability, and efficacy by delivering up to and/or more than approximately 100 lumens per watt (LPW) at 1.5 amps (A) and approximately 25° C. in selected color temperatures. Selected color temperatures can comprise cool white (CW) color temperatures of around 6000K or warm white (WW) color temperatures of around 3000K. Reference will be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions may be exaggerated relative to other structures or portions for illustrative purposes and, thus, are provided to illustrate the general structures of the present subject matter and may or may not be drawn to scale. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the package or component in addition to the orientation depicted in the figures. For example, if the package or component in the figures is turned over, structure or portion described as "above" other structures or portions would now be oriented "below" the other structures or portions. Likewise, if the package or component in the figures are rotated along an axis, structure or portion described as "above", other structures or portions would be oriented "next to" or "left of" the other structures or portions. Like numbers refer to like elements throughout.

Unless the absence of one or more elements is specifically recited, the terms "comprising", including", and "having" as used herein should be interpreted as open-ended terms that do not preclude the presence of one or more elements.

As used herein a "ceramic based material" or the term "ceramic based" includes a material that consists primarily of a ceramic material, such as an inorganic, non-metallic material made from compounds of a metal or metalloid and a non-metal (e.g., aluminum nitride, aluminum oxide, beryllium oxide, silicon carbide). A "non-ceramic based material" consists primarily a metallic material, a primarily organic (e.g., polymeric) material, and/or a primarily synthetic or semi-synthetic organic solid that can be dispensed or molded (e.g., plastic).

In some embodiments, the light emitter package can be configured to refract LED chip emitted light toward a preferential direction. For example, the LED chip array can defines an emitter axis, and the lens can have an outer surface and a centerline which can be offset from the emitter axis toward the preferential direction. Further, the lens can be shaped for refraction of LED chip emitted light toward the preferential direction. In some aspects, the light emitter package can comprise an asymmetric overmolded lens.

As used herein with respect to lenses, the term "asymmetric", when unmodified by any further limiting description, refers to a lens shape which is not rotationally symmetric about any axis perpendicular to its base plane. Types of asymmetric lenses can comprise, without limitation, bilaterally symmetric lenses.

As used herein, the terms "LED populated area", "LED chip populated area", or other variations thereof, refer to an area (i.e., an area on the submount) the outer boundaries of which can include the outermost edges of the outermost LED chips (of an LED chip array) in any direction. As used herein, the term "aspect ratio" refers to the ratio of the maximum cross-dimension of the LED chip populated area to the maximum of the cross-dimensions orthogonal thereto.

The array of the packages disclosed herein can define an LED chip-populated area on the submount. In some embodiments, the LED chip-populated area has an aspect ratio greater than 1. In some of these embodiments, the aspect ratio may be at least 2, and in some, the aspect ratio may be about 3.

As used herein, the term "emitter axis" refers to the line orthogonal to the plane defined by the LED chip populated area and passing through the geometric center of the minimum-area rectangle bounding the LED chip populated area, i.e., the center of the rectangle of minimum area which includes all of the LED chip populated area.

The terms "conductive pad(s)", "electrical trace(s)", "electrically conductive trace(s)", "conductive portions", or "portions of conductive material" can be used interchangeably to refer to those portions of a light emitter package which are electrically conductive and can be configured to collectively pass electrical current into and out of one or more light emitters, such as LED chips.

Light emitter or LED packages according to embodiments described herein can comprise group III-V nitride (e.g., gallium nitride (GaN)) based LED chips or lasers. Fabrication of LED chips and lasers is generally known and only briefly described herein. LED chips or lasers can be fabricated on a growth substrate, for example, a silicon carbide (SiC) substrate, such as those chips or devices manufactured and sold by Cree, Inc. of Durham, N.C. Other growth substrates are also contemplated herein, for example and not limited to sapphire, silicon (Si), and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. Nos. 4,946,547; and 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{(1-x)}N$ where $1>x>0$ are often used to describe these compounds. Techniques for epitaxial growth of Group III nitrides have become reasonably well developed and reported in the appropriate scientific literature.

Although various embodiments of LED chips disclosed herein can comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based LED chips according to some embodiments of the present subject matter, for example, can be fabricated on growth substrates (e.g., Si, SiC, or sapphire substrates) to provide horizontal chips or devices (with at least two electrical contacts on a same side of the LED chip) or vertical chips or devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal chip (with or without the growth substrate), for example, can be flip chip bonded (e.g., using solder) to a carrier substrate or printed circuit board (PCB), or wire bonded. In one aspect, horizontal chips are provided such that they are of a bond-pad-down design which eliminates the need for wire bonds. A vertical chip (with or without the growth substrate) can have a first terminal (e.g., anode or cathode) solder bonded to a carrier substrate, mounting pad, or PCB and a second terminal (e.g., the opposing anode or cathode) wire bonded to the carrier substrate, electrical element, or PCB. Examples of vertical and horizontal LED chip structures are discussed by way of example in U.S. Publication No. 2008/0258130 to Bergmann et al. and in U.S. Pat. No. 7,791,061 to Edmond et al. which issued on Sep. 7, 2010, the disclosures of which are hereby incorporated by reference herein in their entireties.

One or more LED chips and/or portions of light emitter packages described herein such as portions of the submount, lens, electrical or electrically conductive traces, and/or wire bonds can be at least partially coated with one or more phosphors. The phosphors can absorb a portion of light from the LED chip and emit a different wavelength of light such that the light emitter package emits a combination of light from each of the LED chip and the phosphor. In one embodiment, the light emitter package emits what is perceived as white light resulting from a combination of light emission from the LED chip and the phosphor. In one embodiment according to the present subject matter, a white emitting package can consist of an LED chip that emits light in the blue wavelength spectrum and a phosphor that absorbs some of the blue light and re-emits light in the yellow wavelength spectrum. The package can therefore emit a white light combination of blue and yellow light. In other embodiments, the LED chips emit a non-white light combination of blue and yellow light as described in U.S. Pat. No. 7,213,940. LED chips emitting red light or LED chips covered by a phosphor that absorbs LED light and emits a red light are also contemplated herein.

Emitter packages described herein can comprise any suitable color temperature such as warm white or cool white color temperatures.

LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. Pat. No. 8,058,088 entitled "Phosphor Coating Systems and Methods for Light Emitting Structures and Packaged Light Emitting Diodes Including Phosphor Coating" which issued on Nov. 15, 2011, and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter packages and methods according to the present subject matter can also have multiple LED chips of different colors, one or more of which can be white emitting.

Referring now to FIGS. 1A to 36, FIGS. 1A to 1G illustrate various views of one embodiment of a light emitter package, or an LED package generally designated 10. LED package 10 can comprise a substrate or submount 12 and one or more light emitters disposed over substrate 12. In one aspect, the one or more light emitters can comprise at least one LED chip 14 mounted over submount 12. Where multiple LED chips 14 are used, the chips can emit the same and/or different colors. For illustration purposes, a single LED chip 14 is shown mounted over submount 12; however, multiple LED chips 14 are contemplated herein as described further below. LED chip 14 can comprise many different semiconductor layers arranged in any suitable structure. As noted above, LED chips 14 can comprise vertically structured chips (e.g., electrical contacts/bond pads on opposing sides/surfaces) or horizontally structured chips (e.g., electrical contacts or bond pads on a same side/surface). Vertically and/or horizontally structured chips can be configured to attach to electrical components (e.g., electrically conductive traces or conductive pads) within package 10 either directly or via one or more wire bonds (e.g., 20, FIG. 1A).

In one aspect, a vertically structured LED chip 14 can be provided where a first electrical contact or bond pad is disposed on a top surface of the chip and a second electrical contact or a second bond pad of opposing electrical polarity is disposed on a bottom surface of the chip. The bond pad on the top surface of the chip can be wire bonded to an electrically conductive trace of package 10, and the bond pad on the bottom surface of the chip can be attached via solder, epoxy, silicone, flux, a flux eutectic die attach material, combinations thereof, and/or any suitable material and/or process for attaching LED chip 14 to an electrically conductive trace comprised, for example, at least partially of metal. In further aspects, a horizontally structured LED chip 14 can be provided where two electrical contacts or two bond pads of opposing electrical polarity (e.g., an anode and a cathode) are disposed on a top surface of the chip. Each bond pad can be wire bonded to an electrically conductive trace of package 10. In other aspects, a horizontally structured LED chip 14 can be provided where two electrical contacts or two bond pads of opposing polarity (e.g., an anode and a cathode) are disposed on a bottom surface of the chip. In this regard, wire bonds can be obviated as each bond pad can directly attach to an underlying electrically conductive trace via a die attach process using flux, flux-eutectic, solder, reflow, epoxy, silicone, combinations thereof, or any suitable die attach material and/or method. Any materials and/or processes capable of attaching LED chip 14 to an electrical component (e.g., a trace) of package 10 are contemplated herein.

As shown in FIG. 1A, LED chip 14 can further comprise one or more electrically conductive current spreading structures generally designated 16. Where wire bonds are used, LED chip 14 can also comprise one or more bond pads 18 disposed on a top surface of LED chip 14. Current spreading structure 16 and bond pads 18 can comprise an electrically conductive material and can be deposited using known methods. Some materials that can be used for these features include Au, Cu, Ni, In, Al, Ag, Pt, conducting oxides, transparent conducting oxides, and/or combinations thereof. Current spreading structure 16 can for example generally comprise conductive fingers arranged in a grid on LED chip 14 with the fingers spaced to enhance current spreading from bond pads 18 into a top surface of LED chip 14. In operation, an electrical signal can be applied to the bond pads 18, such as through a wire bond 20 as described below, and the electrical signal can spread through the fingers of current spreading structure 16 and into LED chip 14. Current spreading structure 16 can often be used in LED chips where the top surface is a p-type material, but can also be used with n-type materials.

Submount 12 can be formed of many different materials with a preferred material having a high thermal resistance, low thermal conductivity, and/or be electrically insulating. Suitable materials can include, but are not limited to ceramic based and/or organic materials such as aluminum oxide ($Al_2O_3$), aluminum nitride (AlN), polyimide (PI), polyphthalamide (PPA), combinations thereof, or any other suitable material having a high thermal resistance. In other embodiments, submount 12 can comprise a portion of printed circuit board (PCB), a metal core printed circuit board (MCPCB), a flexible circuit, sapphire, silicon, silicon carbide, or any other suitable material, such as T-Clad thermal clad insulated substrate material, available from The Bergquist Company of Chanhassen, Minn. For PCB embodiments different PCB types can be used such as standard FR-4 PCB, MCPCB, or any other type of printed circuit board. As more fully described below, LED packages according to the present subject matter can be fabricated using a method that utilizes a submount panel sized to accommodate a plurality of submounts 12. Multiple LED packages can be formed on the panel, wherein each individual package can be singulated from the panel.

Submount 12 can have a top surface 22 comprising conductive features that can include a first electrically conductive trace comprising a die attach pad 24 and an integral first contact pad 26. A second electrically conductive trace 32 comprising an integral second contact pad 28 can also be included on top surface 22 of submount 12. LED chip 14 can be mounted approximately at the center of attach pad 24. Each conductive feature can be patterned over submount 12 using known methods for providing conductive paths for electrical current to pass into and out of LED chip 14, thereby illuminating LED chip 14. LED chip 14 can be mounted to attach pad 24 using known methods and/or materials such as a solder material that may or may not contain a flux material, silicone, epoxy, and/or dispensed polymeric materials that may be thermally and electrically conductive.

The size of submount 12 can vary depending on different factors, including the size of LED chip 14. For example, the size of package 10 can be essentially of the same dimension as the effective heat spreading area in the attach pad, and first and second contact pads 24, 26, and 28. In a package having an approximately 1 millimeter (mm) LED chip 14, submount 12 can be approximately 3.5 mm by 3.5 mm. In a package having an approximately 0.7 mm chip, submount 12 can be approximately 3.2 mm by 3.2 mm. A square, rectangular, non-square, circular, symmetrically, and/or asymmetrically shaped submount 12 is contemplated herein.

Attach pad 24 and first and second contact pads 26, 28 can comprise different materials such as metal and/or other electrically conductive materials. In one embodiment, each pad 24, 26, and 28 can comprise copper that is plated (e.g., electroplated, immersion, immersion-less plating) or deposited (e.g., physically or chemically) using known techniques. In some aspects, a Ti adhesion layer and a copper seed layer are sequentially sputtered onto a substrate. Approximately 40 microns (μm) to 50 μm, approximately 50 μm to 60 μm, or greater than approximately 60 μm, for example, approximately 75 μm of copper, can be plated onto the copper seed layer. The resulting copper layer can then be patterned using standard lithographic processes. In other embodiments the Cu layer can be sputtered using a mask to form the desired pattern. In yet further embodiments, pads 24, 26, and 28 can comprise one or more layers of deposited or plated Ti, Cu (electrolytic Cu), and/or Ag (e.g., electrolytic Ag). The Ti layer can for example comprise approximately 0 to 0.6 μm, the Cu layer can comprise approximately 40 μm to 50 μm, approximately 50 μm to 60 μm, or approximately 75 μm. Where used, the Ag layer can comprise approximately 0.2 μm to 0.5 μm. Pads 24, 26, and 28 can comprise Cu only and/or a combination of Cu, Ti, and Ag and can further and optionally be plated or coated with additional metals or materials to the make the pads more suitable for mounting an LED chip 14 and/or improving wire bondability between wire bonds 20 and traces or pads 24, 26, and/or 28. For example, one or more of pads 24, 26, and/or 28 can be plated with adhesive or bonding materials, reflective and barrier layers, and/or electroless nickel immersion gold (ENIG) materials.

A gap 30 (best shown in FIGS. 1A and 1D) can be disposed between portions of second trace 32 and portions of opposing first trace or attach pad 24. Gap 30 can extend down to top surface 22 of the submount 12 for electrically separating portions of attach pad 24 and second trace 32. As further described below, an electrical signal can be applied to LED chip 14 via signal passing between second contact pad 28 and first contact pad 26. Electrical signal from first contact pad 26 can pass directly to LED chip 14 by virtue of electrical communication between first contact pad 26 and attach pad 24, and electrical communication between attach pad 24 and LED chip 14. Electrical signal from second contact pad 28 can be communicated to LED chip 14 via wire bonds 20. Gap 30 can provide electrical isolation between second contact pad 28 and attach pad 24, and therefore, between second contact pad 28 and first contact pad 26.

Referring to FIG. 1C, electrical signal can be applied to package 10 from an external circuit or power source (not shown) by applying electrical current to one or more surface mount pads, such as first and second surface mount pads 34 and 36 (FIG. 1C). In the embodiment shown LED package 10 is arranged for mounting over an external power source or circuit (e.g., a PCB, flex circuit, MCPCB, etc.), using surface mount technology and can have internal electrically conductive paths also known as "vias" or "thru-holes". LED package 10 can comprise a first surface mount pad 34 and a second surface mount pad 36 disposed on a lower surface 38 of submount 12. First surface mount pad 34 can at least partially align with portions of first trace or attach pad 24 and first contact pad 26 and second surface mount pad 36 can at least partially align with portions of second contact pad 28. Electrically conductive thru-holes or vias 40 can be disposed internally within portions of submount 12 such as between portions of first mounting pad 34 and first contact pad 26 and between portions of second surface mount pad 36 and second contact pad 28 such that electrical signal is applied to first mounting pad 34 can be conducted to first contact pad 26 and signal applied to second mounting pad 36 can be conducted to second contact pad 28, and vice versa. First and second mounting pads 34 and 36 can allow for surface mounting of LED package 10 such that electrical signal applied across first and second mounting pads 34 and 36 can pass into and illuminate LED chip 14 by electrical communication between surface mount pads 34 and 36 contact pads 26 and 28, where the electrical communication can be facilitated by vias 40. Vias 40 and first and second mounting pads 34 and 36 can comprise any suitable material(s) deposited and/or plated using different techniques, such as those used for the attach and contact pads 24, 26, and 28. In other aspects, vias 40 can comprise Ag or a Ag-alloy deposited or plated during fabrication of a large submount panels.

It is understood that first and second mounting pads 34 and 36 as well as vias 40 can be arranged in many different ways and can have many different shapes and/or sizes. It is also understood that instead of vias, one or more electrically conductive traces can be provided along internal and/or external surfaces of submount 12 between portions of first mounting pad 34 and first contact pad 26 and between portions of second mounting pad 36 and second contact pad 28.

An optional solder mask 42 comprising any suitable material can be provided on or over portions of submount 12, and can at least partially cover attach pad 24 and/or be disposed in portions of gap 30. Solder mask 42 can advantageously reflect light from portions of package 10 as well as protect package components during subsequent processing steps. Solder mask 42 can comprise a layer that is approximately 5-10 μm, 10-13 μm, or 13-15 μm thick. Solder mask 42 can comprise any color, for example, a silver white, white, or green, however, white or silver white may be more reflective than green. Openings can be formed in the solder mask 42, for example, over portions of attach pad 24, second trace 32, and first and second contact pads 26 and 28, respectively, for mounting LED chip 14 and attaching wire bonds 20 to second trace 32. Side openings (not shown) can also be disposed or provided in portions of solder mask 42 for allow convenient electrical access to first and second contact pads 26, 28 during testing of package 10 during fabrication. Solder mask 42 can also comprise alignment holes for providing alignment during subsequent fabrication of package 10 and also allow for alignment when mounted in place by an end user.

Package 10 can comprise a symbol or indicator 44 for designating electrical polarity of a given side of LED package 10. This can ensure accurate mounting of LED 14 within LED package 10 as well as accurate mounting of LED package 10 to a PCB or other component, whether by machine or by hand. In the embodiment shown the symbol 44 comprises a plus (+) sign over the first contact pad 44, indicating that package 10 should be mounted with the positive side of electrical signal coupled to first mounting pad 24. It is understood that many different symbol types can be used and that a symbol can also be included over the second trace 32. It is also understood that the symbols can be placed in other locations other than in a portion of solder mask 44.

LED package 10 can also comprise elements to protect against damage from electrostatic discharge (ESD). In the embodiment, an ESD protection device 46 can be mounted such that it is reversed biased to LED chip 14. ESD protection device 46 can comprise vertical silicon (Si) Zener diode, a different LED chip arranged in parallel and reverse biased to LED chip 14, a surface mount varistor, and/or a lateral Si diode. Solder mask 42 can comprise an opening such that ESD protection device 46 can be mounted to a portion of attach pad 24 and/or second trace 32. ESD protection device 46 can be mounted using any known material and/or technique. ESD protection device 46 can be smaller than LED chip 14 so that it does not cover an excessive area on the surface of the submount 12, and so that it does not block and/or absorb a significant amount of light. ESD protection device 46 allows excessive voltage and/or current passing through LED package 10 from an ESD event to pass through device 46 instead of LED chip 14. ESD protection device 46 can be wire bonded via wire bond 20 to a portion of second trace 20. Wire bonds 20 can comprise any suitable electrically conductive material such as Au or a Au-alloy. It is understood that in other embodiments of an LED package according to the present subject matter can be provided without an ESD protection device 46 or with an ESD protection device 46 that is external to LED package 10.

To improve heat dissipation within LED package 10, pads 24, 26, 28, and portions of second trace 32 can provide thermally conductive paths extending laterally for conducting heat away from LED chip 14 such that it can spread to other areas of the submount beyond the areas just below LED chip 14. Attach pad 24 can cover more of the surface of submount 42 than LED chip 14, with attach pad 24 extending from the edges of LED chip 14 toward the edges of the submount 12. In the embodiment shown, attach pad 24 can be generally circular and extending radially from LED chip 14 toward the edges of the submount 12. However, it is understood that the contact pad 42 can be many other shapes and in some embodiments it can extend to the edge of submount 12.

LED package 10 can further comprise a metallized area 48 on bottom surface 38 of submount 12. Metallized area 48 an optionally be disposed between first and second mounting pads 34 and 36. The metallized area 48 can comprise a thermally conductive material and can be at least partially vertical aligned below LED chip 14. In one embodiment, metallized area 48 is not in electrical contact with any of the elements on top surface 22 of submount 12 and/or first and second mounting pads 34 and 36 on the bottom surface 38 of submount 12. Although heat from the LED can laterally spread over the top surface 22 of submount 12 via attach pad 24, second trace 32, and pads 26 and 28, more heat can pass into submount 12 directly below and around LED chip 14. Metallized 48 area can assist with heat dissipation by allowing heat to spread into the metallized area where it can dissipate more readily and can be passed into an external heat sink (not shown). Metallized area 48 can the substantially the same thickness as first and second surface mount pads 34 and 36, respectively. Or, in the alternative, metallized area 48 can be either thicker or thinner than one or both of first and second surface mount pads 34 and 36.

Figure 1F:
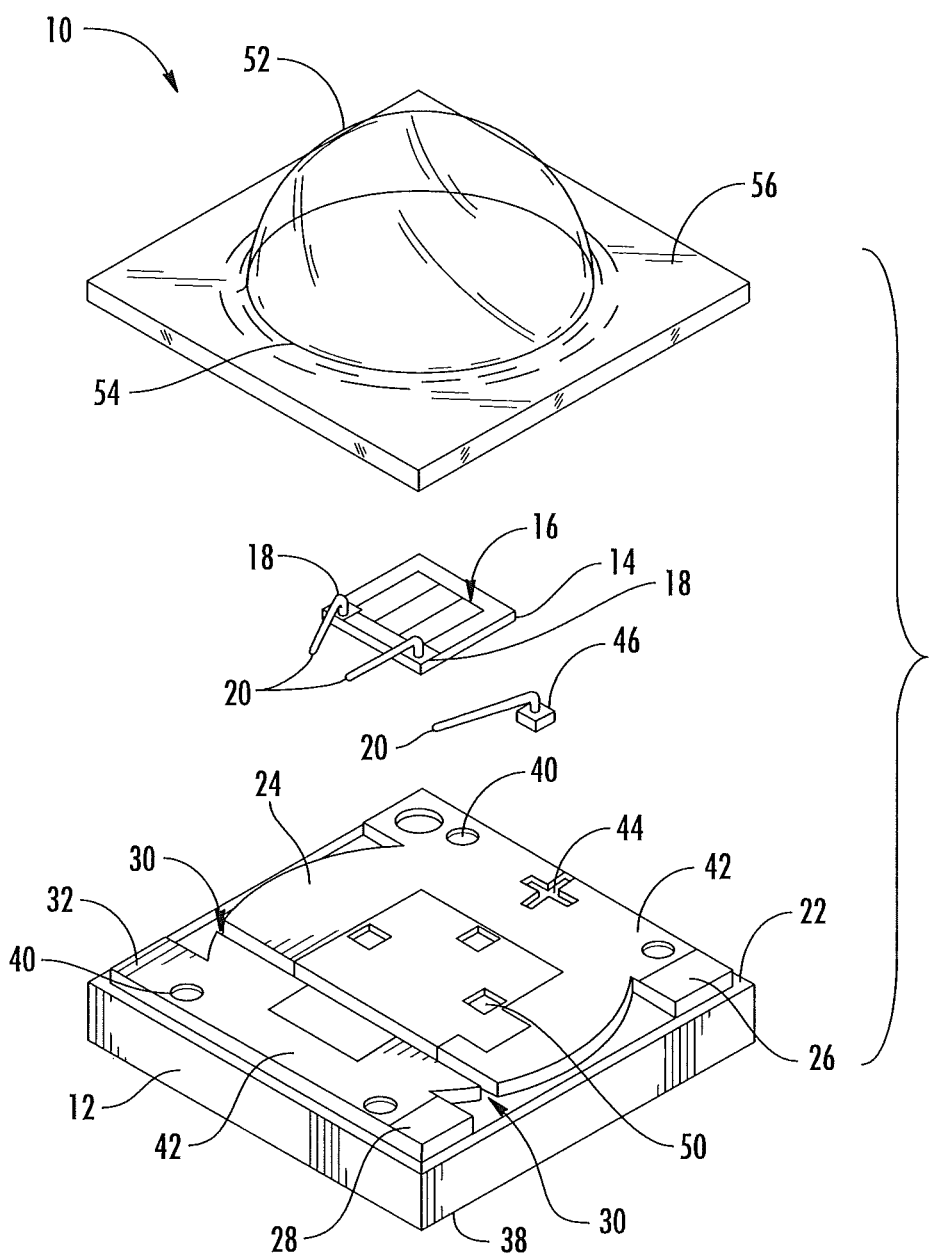
Figure 1G:
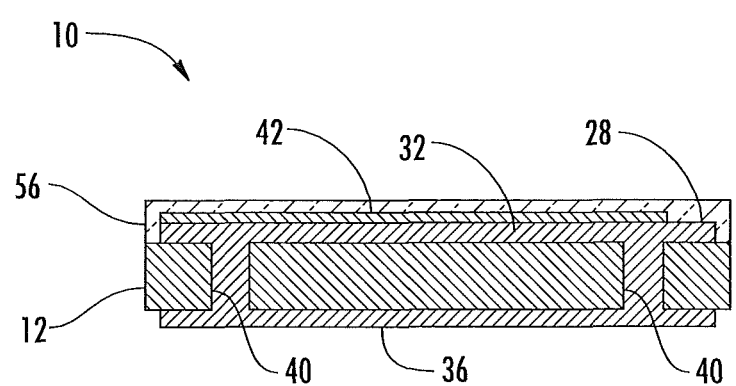

As shown in FIG. 1F, one or more solder dams 50 can be included around the area of attach pad 24 for mounting of LED chip 14, with the solder dams 50 serving to help center the LED chip 14 and to reduce movement of the LED chip 14 from the mounting area while the mounting solder or die attach material is in liquid form. When the die attach material encounters any one of dams 50, movement can be slowed or stopped. This can help reduce movement of LED chip 14 until the die attach material (e.g., solder, epoxy, silicone, flux) hardens.

Lenses are illustrated in connection with further embodiments of the subject matter. Both the term "optical element" and the term "lens" as used in this disclosure are intended in their broadest sense. Such an element may affect light by bending and/or concentrating light rays, by color mixing, or by a combination of these effects. A phosphor can also be used to provide wavelength conversion. A lens for use with an LED package of an embodiment of the subject matter may be made of glass or plastic, may be molded in place or elsewhere, or otherwise formed or attached to the package as desired. For example, the lens may be molded in place from silicone. In example embodiments, a clearance is again maintained between the edge of any of the plurality of interconnected LED chips and the edge of the lens. Referring to FIG. 1F, an optical element or lens 52 can be provided over a portion of submount 12. In one aspect, lens 52 can be provided over a portion of LED chip 14. Lens 52 can provide both environmental and/or mechanical protection. Lens 52 can be in any location over top surface 22 of submount 12, and either centered over submount 12 and LED chip 14, or non-centered with respect to submount 12 or LED chip 14. As FIG. 1F shows, lens 52 can comprise a substantially circular lens base 54. However, any size and/or shape of lens base 56 is contemplated herein. In some embodiments lens 52 can be formed in direct contact with LED chip 14 and top surface 22 of submount 12. In other embodiments there may be an intervening material or layer disposed between LED chip 14 and top surface 22. Direct contact to LED chip 14 may provide certain advantages such as improved light extraction and ease of fabricating. Lens 52 can be less than approximately 5 mm in diameter or less than approximately 4 mm in diameter. In some embodiments the lens may be about 3.1 mm in diameter. LED chips of various sizes and shapes may be used.

Lens 52 can be molded using different molding techniques and the lens can be many different shapes depending on the desired shape of the light output. One suitable shape as shown is hemispheric, with some examples of alternative shapes being ellipsoid bullet, flat, hex-shaped and square. Many different materials can be used for the lens such as silicones, plastics, epoxies or glass, with a suitable material being compatible with molding processes. Silicone is suitable for molding and provides suitable optical transmission properties. It can also withstand subsequent reflow processes and does not significantly degrade over time. It is understood that one or more portions of lens 52 can also be textured to improve light extraction or can contain materials such as phosphors or scattering particles.

LED package 10 can also comprise a protective layer 56 covering portions of top surface 22 of submount 12, and can be disposed between lens base 54 and the outermost edges of submount 12. Protective layer 56 can provide additional protection to LED package 10 components, for example, components (e.g., pads or traces) disposed on top surface 22 to reduce damage and contamination during subsequent processing steps and use. Protective layer 56 can be formed during formation of the lens 52 and can comprise the same material as the lens 52. It is understood, however, that LED package 10 can also be provided without the protective layer.

The lens arrangement of LED package 10 is also easily adapted for use with secondary lens or optics that can be included over lens 52 by an end user to facilitate beam shaping. Such secondary lenses are generally known in the art, with many of them being commercially available. Further embodiments of package 10 are contemplated, for example, a package having first and second contact pads 26 and 28 disposed along a same edge of side of package and/or adjacent pads 26 and 28 are contemplated (e.g., rather than opposing first and second contact pads 26 and 28). This can allow for contacts at one side of LED package 10. In this aspect, first and second surface mount pads 34 and 36 could be vertically aligned below pads such that first and second mount pads 34 and 36 could also be disposed along a same edge or side of package and/or adjacent each other.

Figure 2:
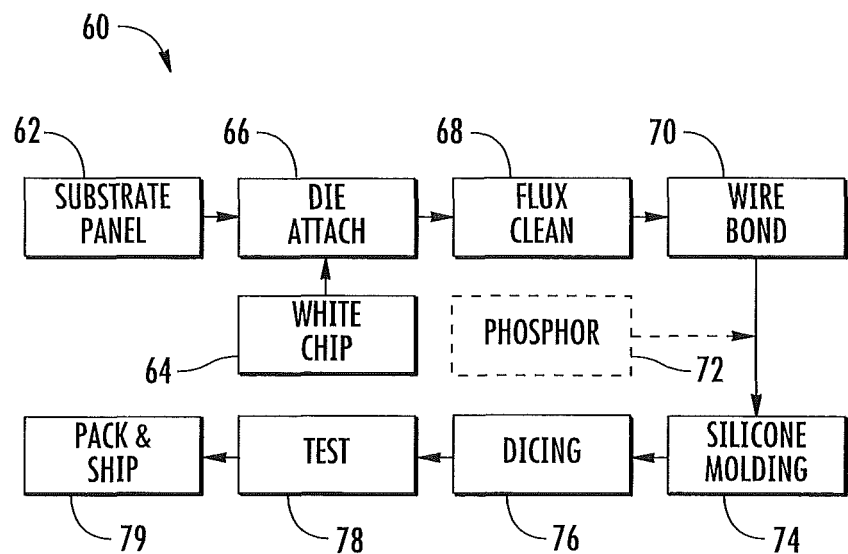
FIG. 2 is a flow diagram for one embodiment of a fabrication method according to the present subject matter.

The present subject matter can also provide improved methods for fabricating LED packages wherein multiple packages can be fabricated simultaneously. This can reduces cost and complexity in fabrication, and can allow for fabrication of packages with controlled features and emission characteristics. FIG. 2 shows one embodiment of an LED package fabrication method 60 according to the present subject matter. In step 62 a substrate or submount panel can be provided and diced in subsequent manufacturing steps to provide a plurality of individual submounts (e.g., 12, FIG. 1A). A panel can be provided to allow for the simultaneous fabrication of a plurality of packages. It is understood that a separate processing step may be required for providing conductive package features (e.g., pads, traces) on the panel. These features can include the attach pad, second trace, contact pads, surface mount pads, vias and metallized area, all of which can be arranged to assist in dissipating heat generated by the LED. The panel can comprise a plurality of such features arranged in sets, each of the sets can corresponding to one of a plurality of packages to be formed over the panel. Many different panel sizes can be used such as for example, approximately 2 inches (in.)×2 in., approximately 3 in.×4 in., approximately 2 in.×4 in.; approximately 3 in.×3 in., approximately 4 in.×4 in., and/or any other suitable size of panel can be used and provided.

In step 64 a plurality of LED chips can be provided, each of which is to be mounted to a respective one of the attach pads on the substrate panel. In one embodiment, a plurality of LED chips can be provided, where the LED chips and/or combinations of the LED chips and a phosphor are configured to emit white light can be used. In this step a plurality of ESD protection devices can also be provided, each of which can be mounted in conjunction with one of the attach pads to provide ESD protection for each LED package.

In step 66 each of the LED chips can be die attached to the one of the attach pads, and as mentioned above, many different mounting methods and materials can be used, with a suitable method being mounting using conventional solder materials with or with flux and related methods. In this step each of the ESD protection devices can also be mounted to a respective attach pad using the same mounting method and material. It is understood that the ESD protection device can also be mounted in other locations using other methods.

In step 68 the panel can undergo a solder flux clean step to remove any flux that may have accumulated during previous processing steps. In step 70 each LED chip and ESD protection device can be wire bonded to second electrical trace. The wire bonds can be formed using known processes and can be made of known conductive materials such as gold.

In some embodiments the LED chips can be provided and mounted to the panel without any optical conversion material. In other embodiments, an optical conversion material, such as phosphor, can be deposited over surfaces of the LED chip after wire bonding. In optional step 72 the optical conversion material or phosphor can be deposited on the LED chip and many different known phosphor deposition methods can be used such as electrophoretic deposition or EPD.

Figure 3A:
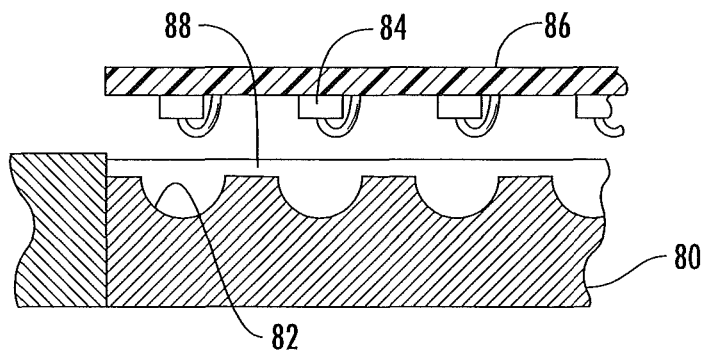
FIGS. 3A and 3B are sectional views illustrating one embodiment of a lens mold according to the present subject matter.
Figure 3B:
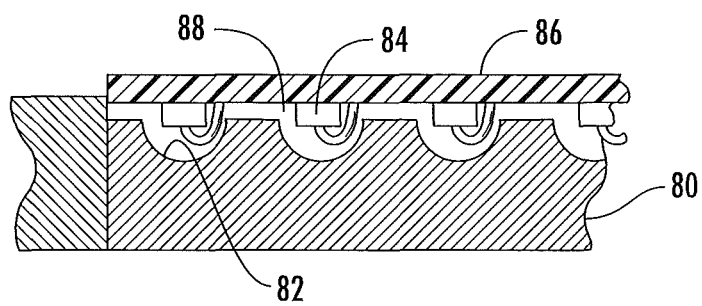

In step 74, a lens can be molded over each LED chip and many different molding methods can be used. In one embodiment a molding process is used that simultaneously forms lenses over the LED chips in the submount panel. One such molding process is referred to as compression molding processes. Referring now to FIGS. 3A and 3B, one embodiment of compression molding is shown wherein a mold 80 is provided having a plurality of cavities 82 each of which has an inverted shape of the lens, wherein each cavity 82 is arranged to align with a respective one of the LED chips 84 on a substrate panel 85. Mold 80 can be loaded with a lens material 88 in liquid form filling cavities 82. In one aspect, lens material 88 can comprise a liquid curable silicone material.

Figure 4A:
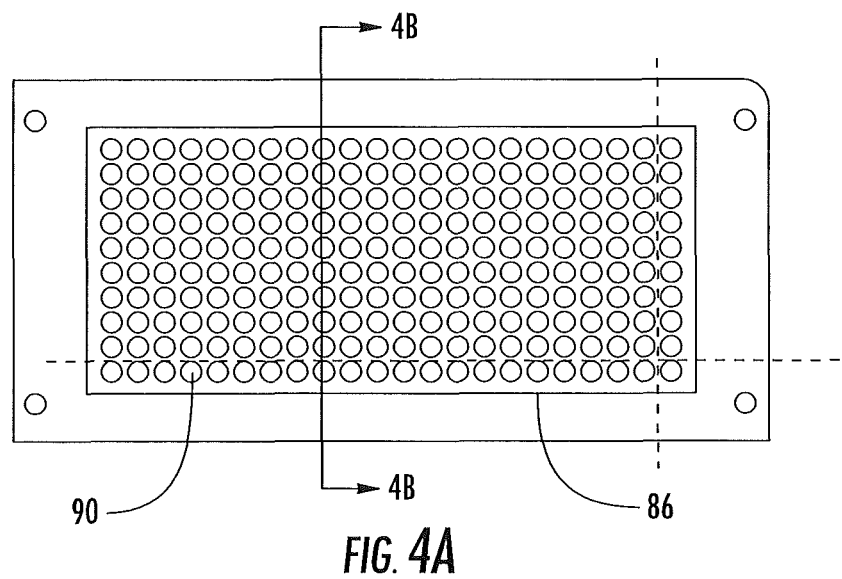
FIG. 4A is a top plan view illustrating one embodiment of a submount panel and lenses disposed over the submount panel according to the present subject matter.
Figure 4B:
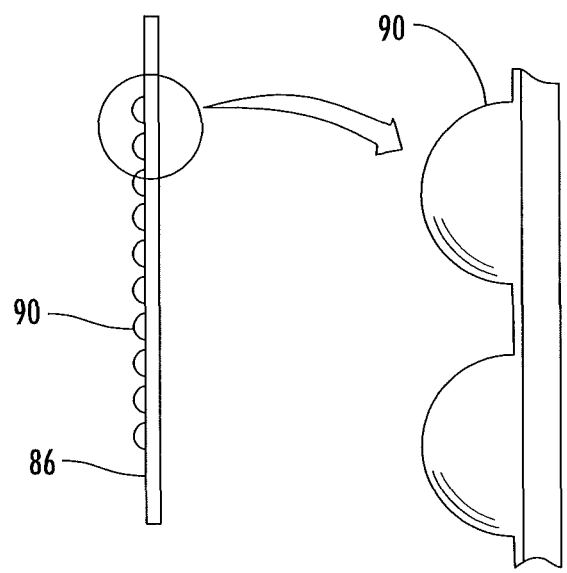
FIG. 4B is a sectional view illustrating the submount panel of FIG. 4A.

Referring to FIG. 3B, panel 86 can be moved toward mold 80 with each LED chip 84 becoming embedded in lens material 88 within a respective one of cavities 82. In one embodiment a layer of lens material 88 can remain between adjacent lenses thereby providing protective layer (e.g., 56, FIG. 1F) over a top surface of the submount. Lens material 88 can then be cured using known curing processes. Panel 86 can be removed from mold 80 and as shown in FIGS. 4A and 4B. The panel can comprise a plurality of lenses 90, each of which can be disposed over a respective one of the LED chips 84. The individual LED packages can then be separated or singulated from panel 86, for example, by sawing, cutting, laser etching, or dicing along dashed lines shown.

Referring again to FIG. 2, in step 76 the panel can be diced to singulate or separate individual LED packages. Different methods can be used such as known saw or laser singulation methods. When using this method a tape can be attached to the panel prior to singulation to hold and stabilize panel 86 and individual LED packages. Following singulation, the LED packages can be cleaned and dried.

In step 78 each of the singulated LED packages can be tested to ensure operation and to measure package output and optical characteristics. It is understood that packages can also be tested at different points in this method by probing the submount panel. In step 79 each LED package can be binned according to optical characteristics, and each LED package can be packaged according to each bin, and shipped to the customer.

Figure 5:
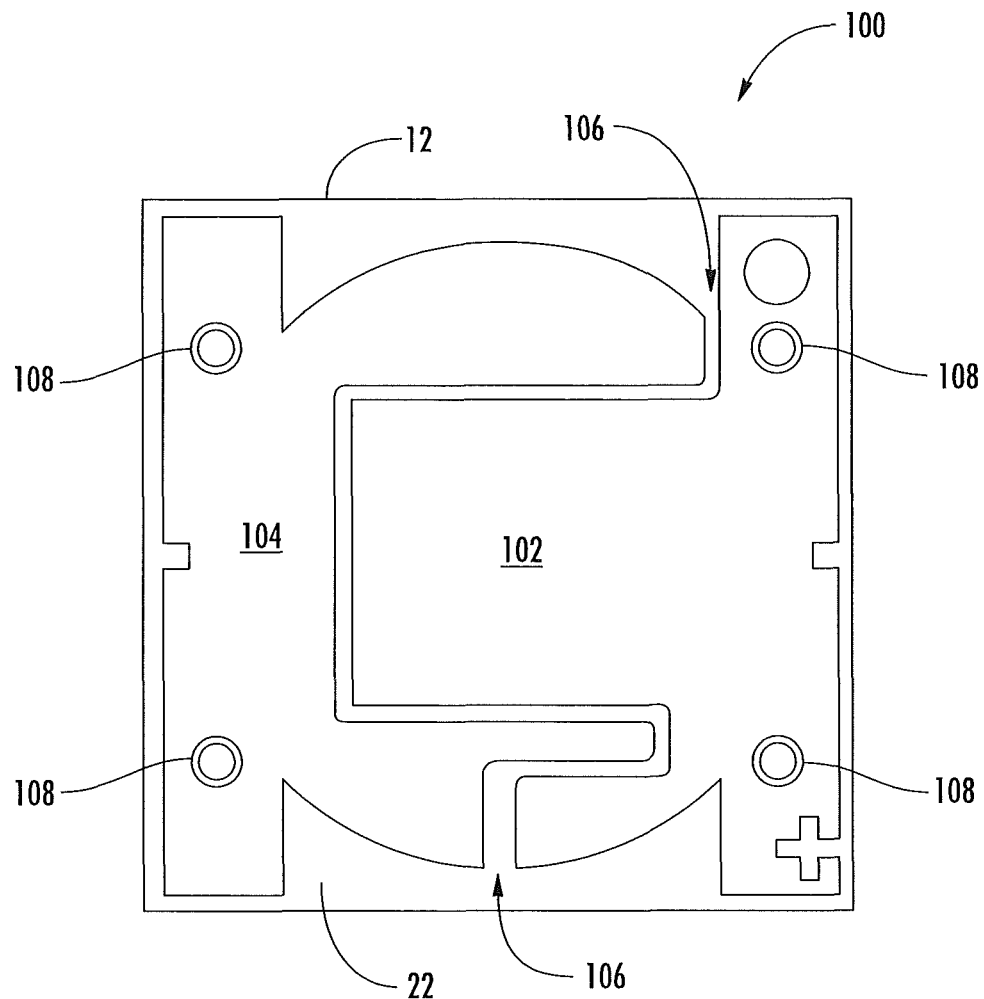
FIG. 5 is a top view illustrating a submount and electrical traces according to one embodiment of the present subject matter.
Figure 6:
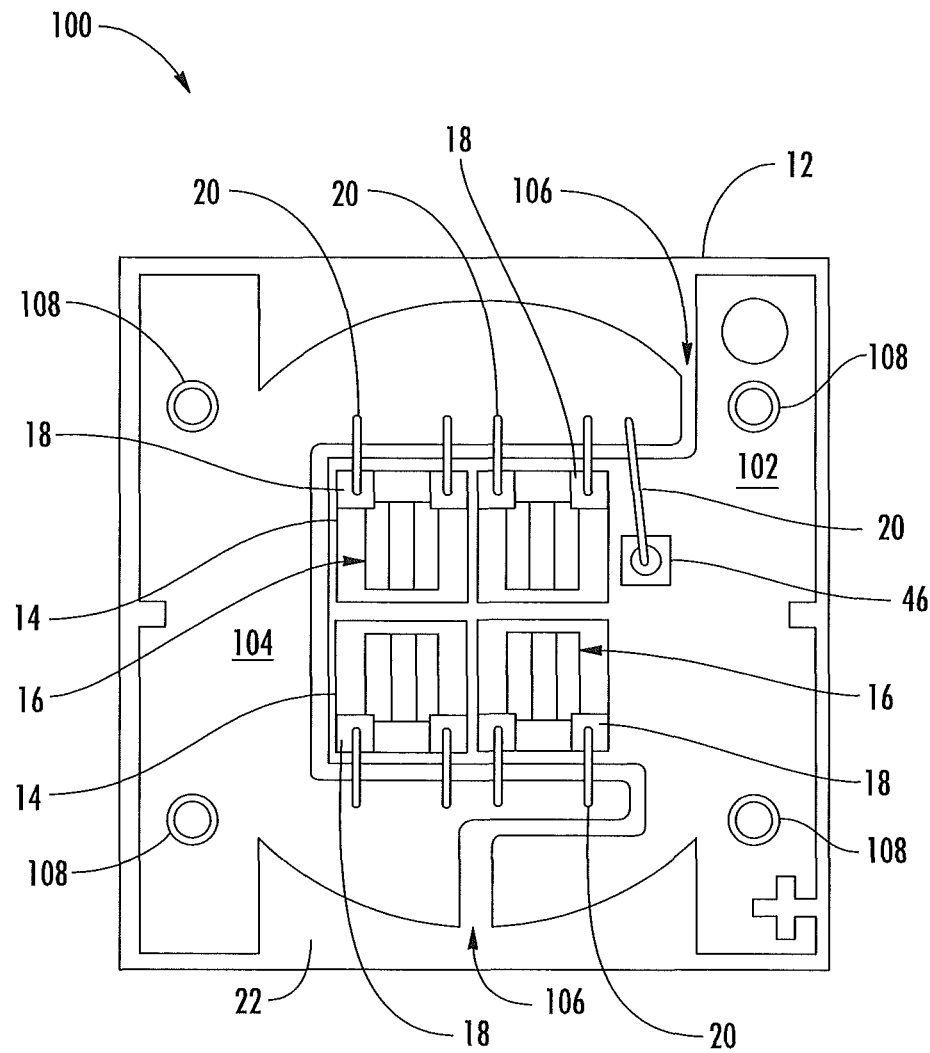
FIGS. 6 and 7 are top views illustrating a multi-chip LED package according to an embodiment of the present subject matter.
Figure 7:
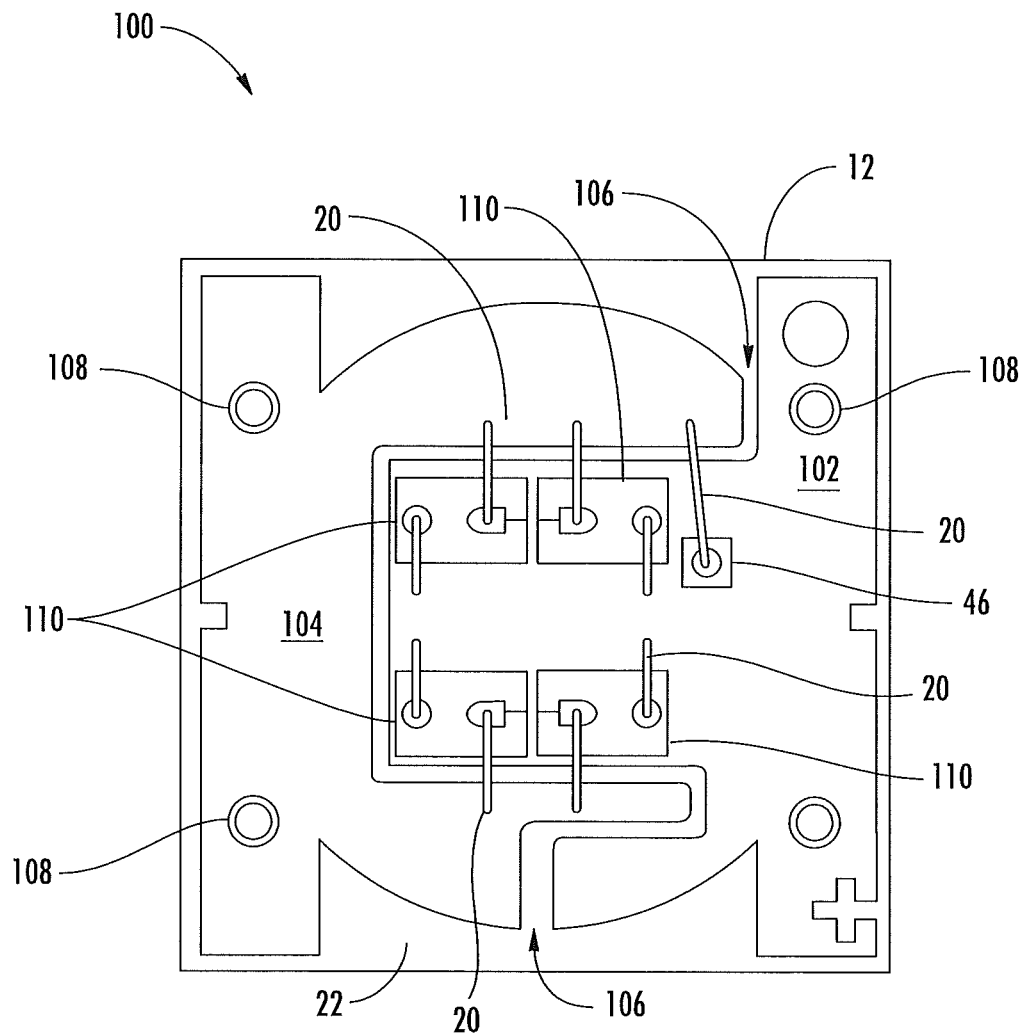

Multi-chip embodiments of the present subject matter now will be described more fully hereinafter with reference to the remaining figures, in which embodiments of the subject matter are shown. Like numbers refer to like elements throughout. FIG. 5 is a top view of submount 12 and electrically conductive traces of an LED package, generally designated 100. Package 100 can, but does not have to include an optical element, such as a lens described further below. FIGS. 6 and 7 are views of LED package 100 having one or more LED chips 14 (FIG. 6) and/or LED chips 110 (FIG. 7) disposed therein.

Referring to FIGS. 5 to 7, LED package 100 can comprise a submount 12. Submount 12 can comprise a ceramic or ceramic based material such as alumina (e.g., $Al_2O_3$) or aluminum nitride (AlN). Top surface 22 of submount 12 can comprise two electrically conductive traces or pads deposited or plated thereon. Together, the pair of electrically conductive traces or pads can be configured to provide electrical connectivity to one or more LED chips 14 (FIG. 6) or 110 (FIG. 7) which can be fixedly mounted or disposed over portions of submount 12. A first trace 102 can oppose a second trace 104. First trace 102 can be configured to electrically communicate to an anode portion of each LED chip mounted thereon, and second trace 104 can be configured to electrically communicate to a cathode portion of each LED chip via wire bonds 20 (FIGS. 6 and 7). First and second traces 102 and 104 can comprise a layer of electrically conductive material, such as metal. In one aspect, first and second traces 102 and 104 can comprise an integral layer of metal which is later etched to form a desired pattern.

In one aspect, a chemical etchant can be used to remove portions of the metal layer thereby forming a gap 106 between first and second traces 102 and 104 thereby physically and electrically separating first trace 102 from second trace 104. Mechanical removal of portions of metal to form gap 106 are also contemplated. First and second traces 102 and 104 can comprise portions of metal that has been physically or chemically deposited and/or plated over portions of submount 12. In further aspects, first and second traces 102 and 104 can be separately formed and attached to submount 12 via adhesive. Any suitable method of providing first and second traces 104 and 106 is contemplated. Portions of first and second traces 102 and 104 can comprise various filled or unfilled holes (e.g., thru-holes of vias), markings, and/or notches used for alignment and/or identification of electrical polarity (e.g., "+" or "−" signs). In one aspect, connection points 108 can be provided for enabling wires (not shown) to be connected from positive and negative sides of the power source to the LED package 100. In further embodiments, connection points 108 can comprise electrically conductive vias extending internally through submount 12. In other aspects, connection points 108 can comprise areas of metal or solder which has been deposited over portions of first and second traces 102 and 104.

FIG. 6 is a top-down view of LED package 100 according further embodiments of the subject matter. LED package 100 can include multiple LED chips 14 electrically connected to portions of the anode and cathode (e.g., first and second traces 102 and 104). LED chips 14 can be mounted over a portion of first trace 102 and wire bonded to a portion of second trace 104. In this embodiment, each LED chip 14 can comprise a vertically structured chip where an anode portion of each LED chip 14 can be disposed on a bottom contact of the chip and the cathode portion of each chip can comprise bond pads 18 disposed on the top of each LED chip 14. In this particular example, four LED chips 14 can be used. However, any number of LED chips 14 can be used, a plurality of chips optionally arranged in an array can be used. In this aspect, LED chips 14 are arranged in a square shaped array. Each of the LED chips 14 are electrically connected in parallel. LED chips 14 can optionally be electrically connected in series and/or in combinations of series and parallel arrangements.

FIG. 7 is a top-down view of an LED package 100 comprising a plurality of interconnected LED chips 110 disposed over first trace 102. In this embodiment, LED chips 110 comprise horizontally structured chips. In one aspect, LED chips 110 can comprise "sideview" or "sidelooker" chips. In this aspect, each of the first and second contacts (e.g., the anode and cathode) can be disposed on a same side (e.g., a top side) of each chip. For example, in this aspect the anode and cathode comprise bond pads 112. Each bond pad can be electrically connected to either the first trace 102 or the second trace 104 via wire bond 20. That is, there may be no direct metal-to-metal electrical connection (e.g., a solder connection) between LED chip 110 and first and/or second traces 102 and/or 104. Each LED chip 110 can be connected to first trace 102 via an adhesive, silicone, or epoxy which may be non-conductive. Electrically conductive solder, epoxy, or flux material may be used; however, it is not required as wire bonds 20 provide the electrical connection between each LED chip 110 and first and second traces 102 and 104. In this example embodiment, four LED chips 110 can be used; however, one chip, two or more chips, or more than four chips can be used.

As illustrated, each LED chip 14 can be connected to first trace 102 and second trace 104, thus, each LED chip 14 can be electrically connected in parallel to the remaining LED chips 110. Packages having LED chips 110 electrically connected in series alone and/or LED chips 100 electrically connected in a combination of parallel and series arrangements are also contemplated herein. A typical sideview chip can have rectangular top, angled sides, and a smaller, rectangular bottom. The sides of the rectangle can vary between about 100 and 500 microns, and the chip may have a thickness of approximately 100 to 150 microns.

Referring to FIGS. 6 and 7, LED package 100 can further comprise ESD protection device 46 disposed over a portion of first trace 102 and wire bonded to second trace 104. ESD protection device 46 can be reverse biased to LED chips 14 (FIG. 6) and chips 110 (FIG. 7). As shown, ESD protection device 46 can comprise a vertically structured device, however, horizontally structured devices are also contemplated herein. ESD protection device 46 can be in direct electrical attachment with a portion of first trace 102 via a conductive solder paste, and can electrically connect to a portion of second trace 104 via wire bond 20. Notably, wire bonds 20 extending from LED chips 14 (FIG. 6) and/or chips 110 (FIG. 7) can be arranged so that all of the wire bonds are disposed outside the group of chips used in LED package 100. That is, wire bonds 20 can extend from a center of package 100 towards outermost edges of package 100. This arrangement can advantageously allow the plurality of LED chips 14 (FIG. 6) and chips 110 (FIG. 7) to be spaced close together and comprise a relatively small footprint while maintaining a relatively high efficiency, brightness and light output. LED chips 14 (FIG. 6) and chips 110 (FIG. 7) can comprise a same color and/or differently colored chips can be combined in various color combinations to achieve a desired CRI, color temperature, aggregate wavelength, and/or other color-related characteristic.

In one aspect, LED chips 14 (FIG. 6) and chips 110 (FIG. 7) can be selected from various light color or wavelength bins for providing a combined light output with a high color rendering index (CRI). The desired color mixing may be achieved, for example, by using blue, green, cyan, amber, red and/or red-orange LED chips 14 (FIG. 6) or chips 110 (FIG. 7). An optional phosphor can be locally applied over each LED chip 14 (FIG. 6) or chip 110 (FIG. 7) and/or portions of package 100 (e.g., over traces and/or portions of an optical element or lens). An example of selecting chips from various color bins to produce desired color characteristics is described in commonly assigned U.S. Patent Application 2010/0140633, filed Apr. 17, 2009, which is entirely incorporated herein by reference. A detailed example of using groups of LED chips emitting light of different wavelengths to produce substantially white light can also be found in commonly assigned U.S. Pat. No. 7,213,940, which issued on May 8, 2007 and which is entirely incorporated herein by reference.

With respect to FIG. 6, LED chips 14 can comprise square chips that are approximately 700 microns (μ or μm) in size, meaning that chips can be approximately 700 microns wide per side. LED chips 14 could also be less than or approximately equal to 1000 μm in size, such as approximately 500 microns in size; approximately 300 μm in size; or less than approximately 300 μm. LED chips 110 (FIG. 7) can be substantially rectangular in shape, and can comprise any suitable dimension. LED package 100 can be configured to deliver at least approximately 80 lumens/Watt (lm/W or LPW) and a CRI of at least 80. LED package 100 can be configured to deliver at least approximately 89 LPW and a CRI of at least 82. Package 100 can comprise a surface mount design (SMD) type of package adapted to incorporate various sizes, structures, build, colors, design, and/or types of LED chips. Direct-attach chips, flip-chips, and chips with substrates made of sapphire, silicon carbide, silicon or other materials are contemplated herein.

Figure 8:
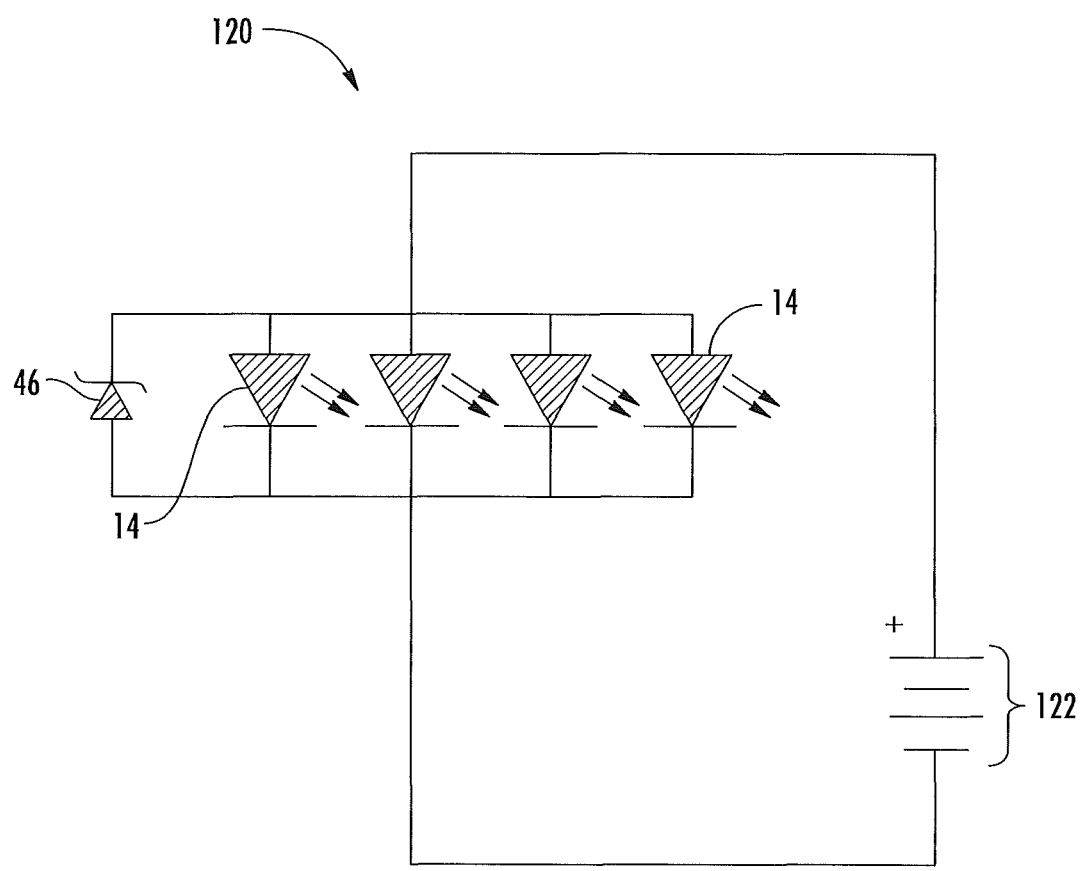
FIG. 8 is a schematic diagram illustrating the electrical connection between LED chips in FIGS. 6 and 7.

FIG. 8 schematically illustrates the electrical diagram or circuit of the LED package in FIGS. 6 and 7. Circuit 120 can comprise four LED chips 14 (or 110, FIG. 7) connected in parallel to form a single group of LED chips. Electrical signal or current for illuminating LED chips 14 can be supplied by a power source 122. ESD protection device 46 can be connected in parallel with each LED chip 14.

Figure 9:
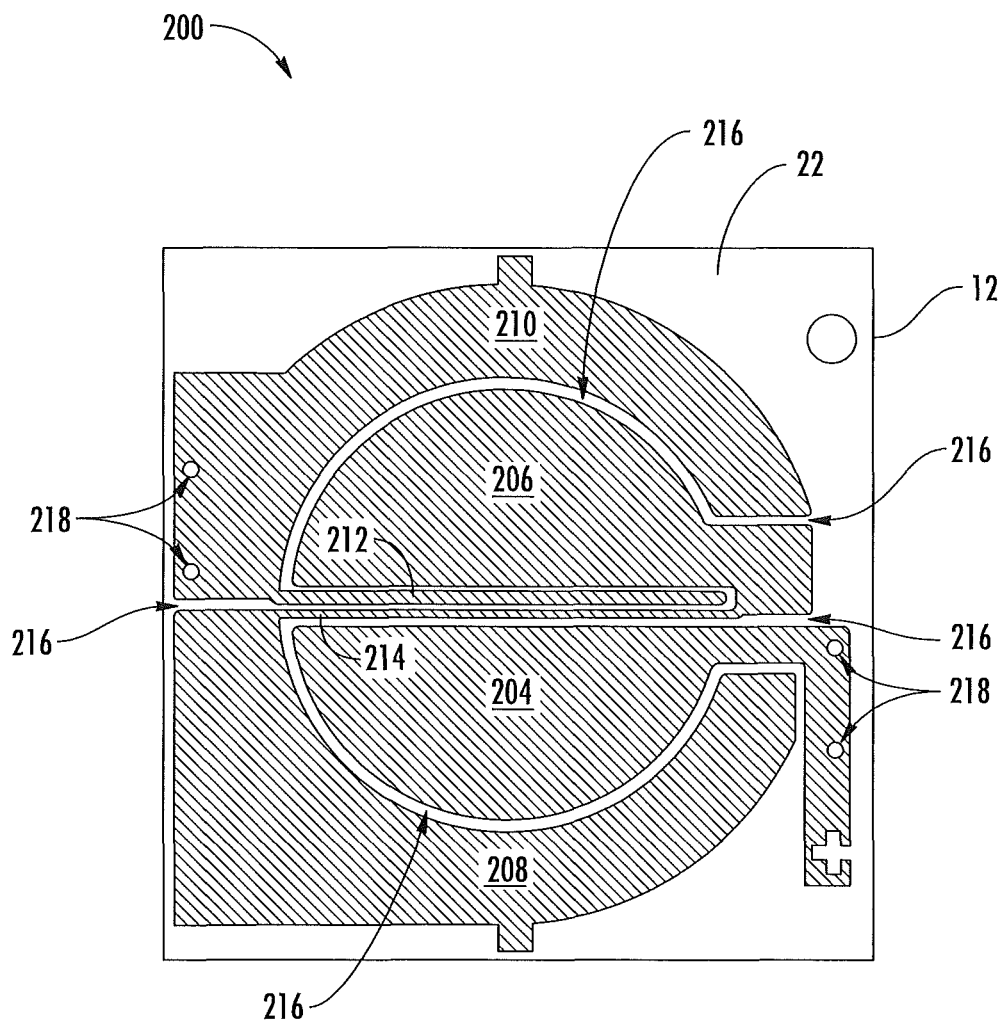
FIG. 9 is a top view illustrating a submount and electrical traces or pads according to another embodiment of the present subject matter.
Figure 10:
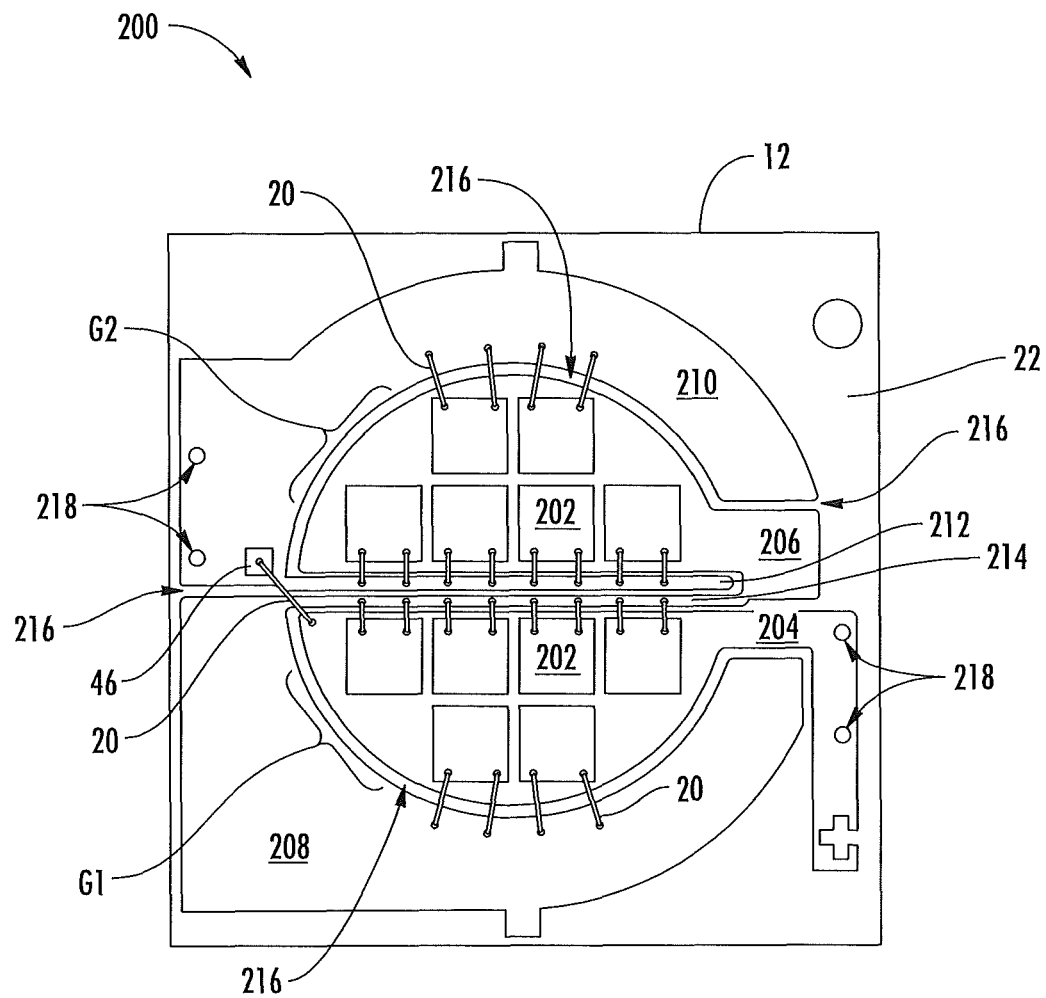
FIGS. 10-13 are top views illustrating various high-density, multi-chip LED packages according to further embodiments of the present subject matter.

FIGS. 9 and 10 are a top view of submount 12 and electrically conductive traces of an LED package, generally designated 200. FIG. 9 illustrates portions of conductive material, such as metal, in shaded lines. FIG. 10 illustrates LED chips 202 disposed over portions of LED package 200. LED chips 202 are schematically shown as squares, however, chips 202 can be any size, shape, structure, build, and can comprise any location, size, and/or shape of bond pad (18, FIG. 1F) and/or current spreading structure (16, FIG. 1F) desired. Submount 12 can comprise a rigid base of plastic or ceramic based material such as $Al_2O_3$ or AlN. Package 200 can comprise at least one electrically conductive layer, often comprised of metal, that can be patterned to provide electrically conductive traces configured to supply electrical connectivity to LED chips 202 (FIG. 10) disposed over submount 12. The layer of conductive material can comprise one or more semicircular portions or areas of material to which LED chips 202 (FIG. 10) can be attached.

A first layer or portion of conductive material 204 can comprise a first electrical trace to which anodes of one or more LED chips 202 (FIG. 10), or a first group of LED chips generally designated G1 can attach. As the shaded lines in FIG. 9 illustrate, a second layer or portion of conductive material 206 and an integral third layer or portion of conductive material 208 can integrally form a second electrical trace. Second portion of conductive material 206 can comprise a portion of material to which anodes of one or more LED chips 202 can attach, or a second group of LED chips generally designated G2 (FIG. 10). Third layer or portion of conductive material 208 can electrically connect to cathodes of some of LED chips 202 in first group G1 via wire bonds 20, and a fourth layer or portion of conductive material 210 can electrically connect to cathodes of some LED chips 202 in second group G2 via wire bonds 20. Fourth portion of conductive material 210 can comprise a third electrical trace.

Fourth portion of conductive material 210 can comprise a first thin fillet or leg portion 212. Second and third portion of conductive material 206 and 208 can be interconnected by a second thin fillet or second leg portion 214 opposing first leg portions 212. One or more LED chips 202 in first and second groups G1 and G2, respectively, can electrically connect to portions of first and second leg portions 212 and 214, respectively, via wire bonds 20. That is, LED chips 202 in first group G1 can comprise anodes directly connected to first portion of conductive material 204 and cathodes either connected to third portion of conductive material 208 or second leg portion 214. Similarly, LED chips 202 in second group G2 can comprise anodes directly connected to second portion of conductive material 206 and cathodes either connected to fourth portion of conductive material 210 or first leg portion 212.

First and second leg portions 212 and 214 can be centrally disposed with respect to submount 12 and can be disposed substantially parallel to each other and physically and electrically separated by one or more gaps generally designated 216. More than one gap 216 can be disposed over submount 12 for physically and/or electrically separating portions of conductive material (e.g., portions 204, 206, 208, and/or 210) from each other and/or from other traces. First and second leg portions 212 and 214 can comprise a centrally located connection bus, or a central bus to which wire bonds 20 from some of the cathodes of LED chips 202 are connected. The central bus or central connection bus within the meaning of this disclosure is a part of the metal layer of submount 12 where portions of different LED chips 202 or different terminals of LED chips 202 can be disposed for allowing connections that enable relatively high chip-density. Such a central bus typically comprises one or more connection rails or legs providing at least some of the connection portions. In this example, wire bonds 20 extending from LED chips 210 of first group G1 can be electrically connected to second leg portion 214 and wire bonds 20 extending from LED chips 202 second group G1 can be electrically connected to second leg portion 212.

Each of first, second, third, and fourth portions of conductive material 204, 206, 208, and 210, respectively, can comprise a layer of material, such as metal, that can be initially deposited or plated over submount 12 and then subsequently etched to form the desired pattern and/or number of desired portions. Etchant can physically or chemically remove portions of the metal layer and can leave one or more gaps 216. In other aspects, each of first, second, third, and fourth portions of conductive material 204, 206, 208, and 210, respectively, can be separately formed and attached or mounted to submount 12 via adhesive, glue, etc. In further aspects, each of first, second, third, and fourth portions of conductive material 204, 206, 208, and 210, respectively, can be molded into a portion of submount 12, or produced in any other suitable fashion.

Package 200 can further comprise one or more connection points generally designated 218. In one aspect, connection points can comprise thru-holes and/or electrically conductive vias for connecting to an external power source (not shown). In other aspects, connection points 218 can comprise solder pads adapted to connect to wires (not shown) from the external power source (not shown). Connection points 218 can comprise Ag vias and/or an additional metal or solder pad deposited over portions of the initially deposited metal layer.

FIG. 10 is a top-down view of LED package 200 according to some example embodiments of the subject matter. LED package 200 makes use of submount and conductive traces as described in FIG. 9. LED package 200 can comprise twelve LED chips 202 arranged in two groups generally designated G1 and G2. Six LED chips 202 can be disposed over and/or attached to a portion first portion of conductive material 204 and can be connected in parallel. The anodes can be on the bottom of each LED chip 202 and can electrically communicate with first portion of conductive material 204, which is in turn connected to the positive terminal of a power source (not shown) supplying current to the package via connection points 218. Six LED chips 202 can be disposed over a portion of second portion of conductive material 206 and can also electrically connect in parallel. The anodes of LED chips 202 can electrically communicate with third portion of conductive material 206.

Still referring to FIG. 10, the cathodes of each LED chip 202 can be connected via wire bonds 20 to portions of package 200 as follows. Wire bonds from the cathodes of LED chips 202 can be connected to metal layer portions of the submount. Wire bonds 20 can electrically connect first group G1 of LED chips 202 to second leg portion 214 of the central bus of package 200, and wire bonds 20 can connect second group G2 of LED chips 202 to first leg portion 212 of central bus of package 200.

LED package 200 can further comprise an ESD protection device 46, which can be disposed over and/or attached or mounted to a portion of fourth portion of conductive material 210. A wire bond 20 can electrically connect ESD protection device 46 to first portion of conductive material 204. First portion of conductive material 204 can be connected to a positive terminal of a power source (not shown) for supplying current to the LED package 200. Fourth portion of conductive material 210 can be connected to the negative terminal of a power source (not shown) for supplying current to the LED package 200. Wire bonds 20 connected between LED chips within each group G1 and G2 of six LED chips 202 in LED package 200 can be arranged so that all of the wire bonds in a given group (e.g., G1 or G2) can be disposed on the outside of each respective group of LED chips 202. This can advantageously allow LED chips 202 in groups G1 and G2 to be spaced close together and a density of the LED chips 202 in groups G1 and G2 allows LED package 200 to be relatively small while still have a relatively high efficiency and light output. Also, the patterning of portions of conductive material (e.g., 204, 206, 208, and 210) over submount 12 together with the arrangement of wire bonds 20 interconnecting the LED chips 20 within groups G1 and G2 allows for each LED chip in each group to be electrically connected in parallel while the groups themselves are electrically connected in series. That is, the first group G1 of LED chips 202 can be electrically connected in series with the second group G2 of LED chips.

LED chips 202 and ESD chip 46 of LED package 200 can be mounted to submount 12 and/or portions of conductive material (e.g., 204, 206, 208, and/or 210) using conductive adhesive, solder, flux, eutectic material, epoxy, silicone, and/or a welding process, or in any of various other ways. LED package 200 can further comprise an optical element such as a lens (FIG. 1F) which can be placed over a portion of package 200 for affecting (e.g., increasing, decreasing, diffusing, focusing, creating a specific beam pattern or beam shape) light emitted by the one or more LED chips 202. Both the optical element and the distortion it can introduce when the package is viewed are omitted in FIG. 10 for clarity of illustration, but an example lens is discussed later with respect to FIG. 21. In addition, optical element, for example, a lens (FIG. 1F) may affect light by bending and/or concentrating light rays, by color mixing, or by a combination of these effects. An optional phosphor can also be applied over portions of LED chips 202, lens (FIG. 1F), and/or other portions of LED package 200 (e.g., traces or wire bonds) for providing color tuning and/or wavelength conversion. A space or clearance can be maintained between the edge of any one of the plurality of interconnected LED chips 202 and the edge of the lens (FIG. 1F). In some embodiments, the clearance can be approximately 0.2% to 0.8% of a maximum width across the LED chips 202. The clearance can also be from approximately 0.3% to 0.65% the width across the LED chips 202. For example, if a maximum width across the LED chips 202 is approximately 5.6 mm, the lens clearance can be approximately 1.7 mm, or approximately 0.303% the maximum width of the LED chips.

LED chips 202 in package 200 of FIG. 10 can be selected from various light (e.g., radiant flux, "RF") or color bins to provide a combined light output with a high CRI. In some example embodiments, a lens (52, FIG. 1F) disposed over LED packages disclosed herein can be less than approximately 12 mm in diameter. In some embodiments, the lens can be less than approximately 10 mm in diameter, less than approximately 9 mm in diameter, or less than approximately 8 mm in diameter. In some embodiments the lens may be approximately 9.1 mm in diameter and may use identical LED chips of about 1000 microns in size, meaning the chips are about 1000 microns wide on a given side. However, chips of various different sizes can also be used. The chips 202 can be or less than or approximately equal to 2000 microns in size, less than or approximately equal to 1000 microns in size, or less than or approximately equal to 700 microns in size, or less than or approximately equal to 500 microns in size. Also, mixed or different chip sizes can be used in a single package (see e.g., FIG. 13).

Figure 11:
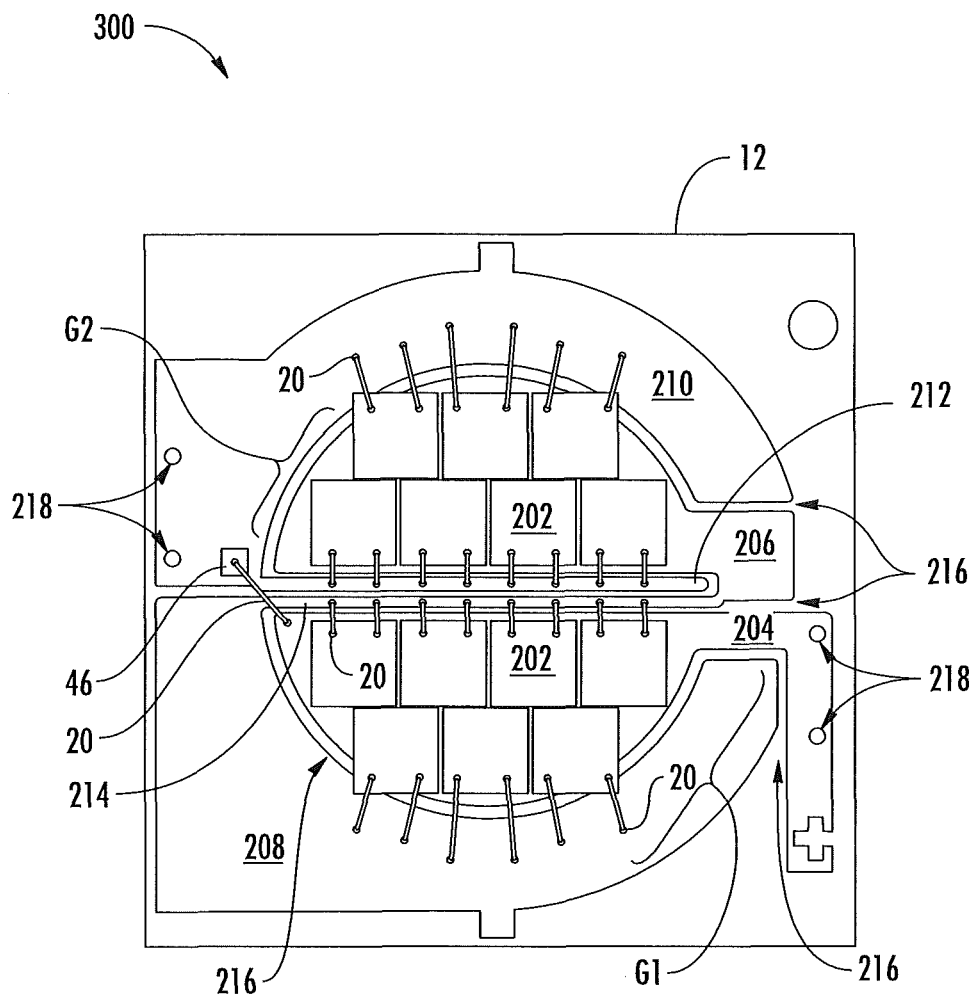
Figure 12:
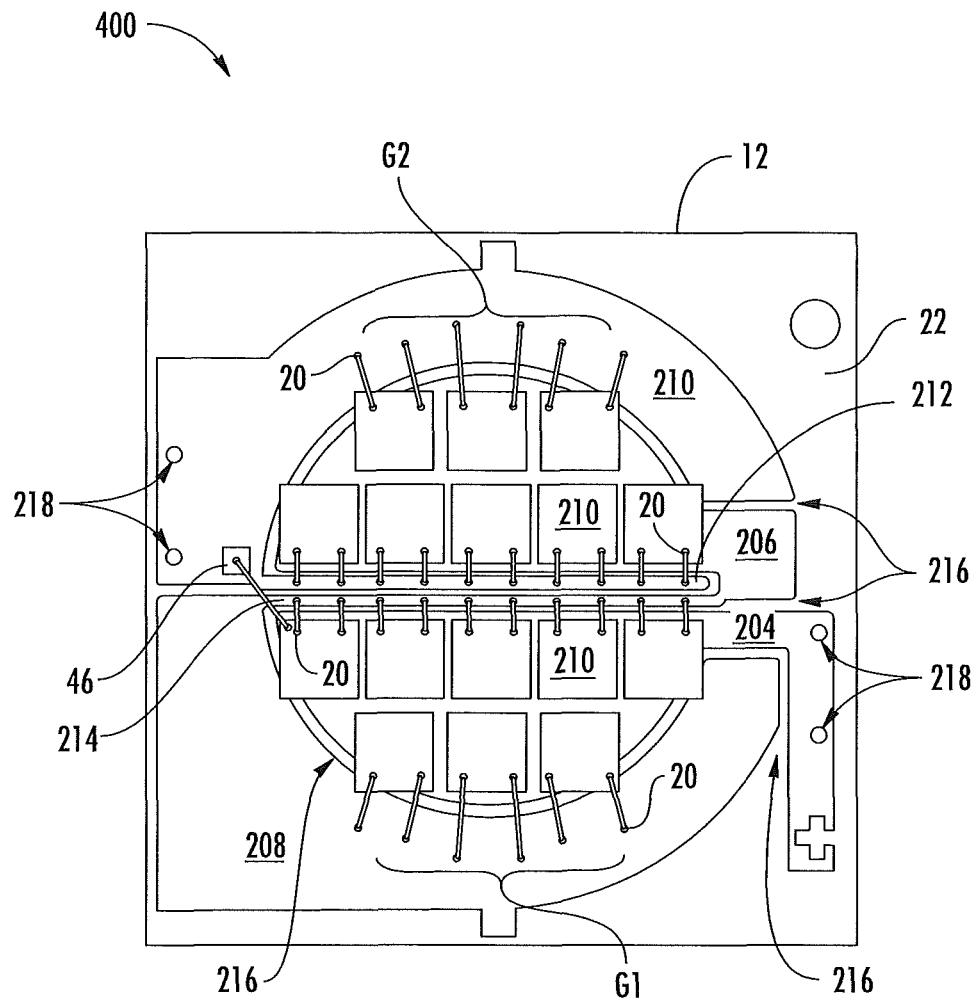

FIGS. 11 and 12 are top-down views of LED packages similar in form and function to LED package 200 shown in FIG. 10, one difference being that a greater number of LED chips 202 can be used in each group. FIG. 11 is a top-down view of an LED package 300 according to some example embodiments of the subject matter. LED package 300 makes use of submount and conductive traces or portions of conductive material as previously described with respect to FIGS. 9 and 10. LED package 300 can comprise fourteen LED chips 202 arranged in two groups, first group G1 and second group G2. Each group can comprise seven LED chips 202 which can be electrically connected in parallel. First group G1 can be electrically connected in series with second group G2. First group G1 can comprise seven LED chips 202 mounted to first portion of conductive material 204 and second group G2 can comprise seven LED chips 202 mounted to second portion of conductive material 206 of the submount and are also connected in parallel. As before, the anodes of each LED chip 202 can be directly in contact with either first or second portions of conductive material 204 and 206, and cathodes of each LED chip 202 can be wire bonded to one of third or fourth portions of conductive of material 208 and 210, or to one of first or second leg portions 212 or 214. LED package 300 can comprise any size, color, or shape of LED chip 202, and can further include an optical element (not shown), such as a lens as previously described.

FIG. 12 is a top-down view of an LED package 400. LED package 400 can comprise sixteen LED chips 202. First group G1 and second group G2 can each comprise eight LED chips 202. First group G1 of LED chips 202 can be directly attached or mounted over portions of first portion of conductive material 204. Second group G2 of LED chips 202 can be directly attached or mounted over portions of second portion of conductive material 206. As before, the anodes of the LED chips 202 can directly contact portions conductive material disposed over submount 12. The cathodes of each LED chip 202 in package 400 can be connected via wire bonds 20 to conductive portions of the submount. Wire bonds 20 can connect cathodes of second group G2 of LED chips 202 to first leg portion 212 of a central bus of submount 12 and/or fourth portion of conductive material 210. Wire bonds 20 can also connect cathodes of first group G1 of LED chips 202 to second leg portion 214 or third portion of conductive material 208. Notably, wire bonds 20 are concentrated in the middle and/or outermost edges of each group G1 and G2, advantageously allowing for closer packed arrangements of LED chips 202.

Packages 300 and 400 can also include ESD protection devices 46 and/or a lens (not shown). A lens can advantageously affect light by bending, refracting, diffusing, and/or concentrating or shaping light rays, by color mixing, and/or by a combination of these effects. A phosphor can optionally be provided over portions of each LED chip 202, over only one of a plurality of LED chips 202, over two or more LED chips of a plurality of LED chips 202, over a portion of the lens, and/or over one or more portions of each package. Clearance can be maintained between the edge of any of the plurality of interconnected LED chips and the edge of the lens as previously described.

Figure 13:
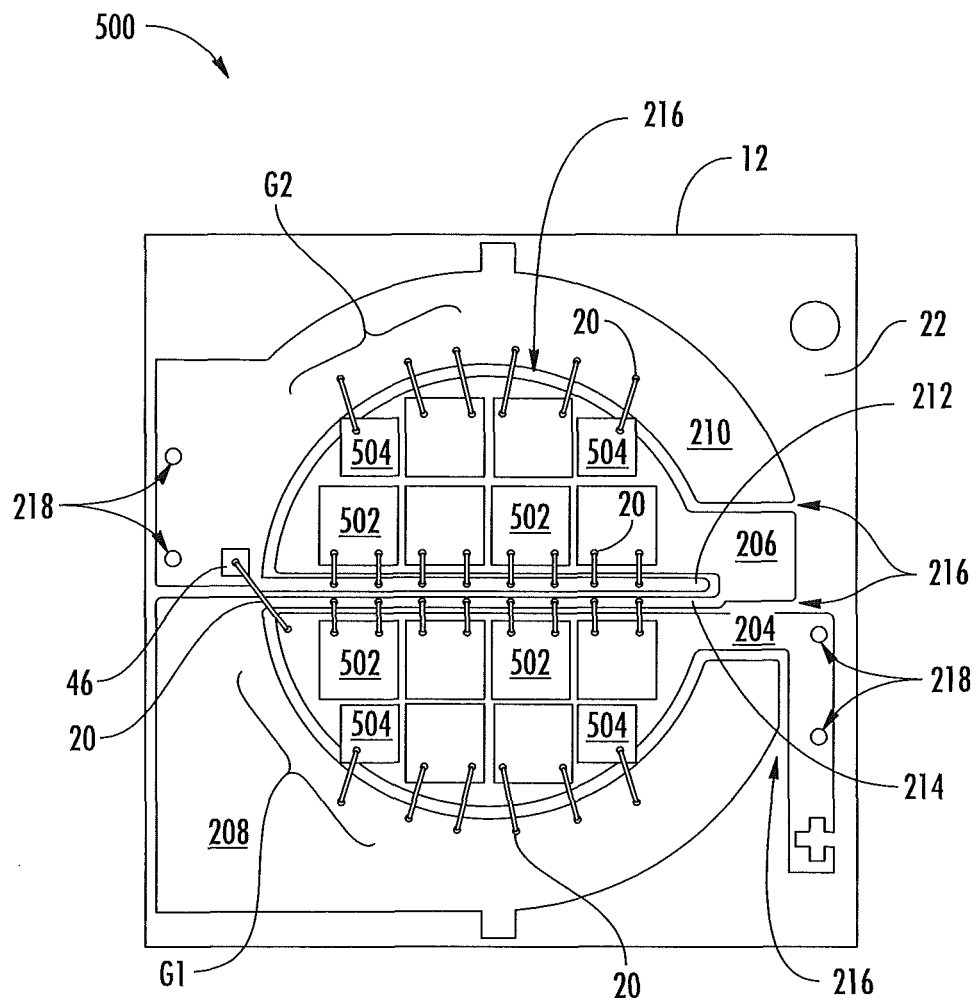

FIG. 13 is a top-down view of a light emitter or LED package 500 in which different sizes of LED chips are used. LED package 500 makes use of submount and conductive traces or portions of conductive material as described in FIGS. 9 to 12. LED package 500 can comprise sixteen LED chips, including chips of two different sizes, a first dimension denoted 502, and a second dimension denoted 504. LED chips 502 and 504 can be arranged in first group G1 and second group G1. First group G1 can comprise six LED chips 502 and two LED chips 504. LED chips 504 can be smaller in size than LED chips 502. LED chips 504 can comprise a vertically structured LED chip where an anode is directly attached to first or second portions of conductive material 204 or 206 and cathodes can be wire bonded to other portions and/or legs of conductive material. Differently sized LED chips 502 and 504 can be connected in parallel and first group G1 can be connected in series with second group G1. Notably, differently sized LED chips 502 and 504 can be arranged such that wire bonds 20 are disposed along the outside of each of first group G1 and second group G2 of LED chips. This can allow the differently sized LED chips 502 and 504 in each group to be placed close together. Also, the patterning of the portions of conductive material over submount 12 together with the arrangement of wire bonds 20 provides LED chips 502 and 504 within a group electrically connected in parallel while each group G1 and G2 of chips can be connected in series. It is further contemplated than more than two groups of LED chips can be provided over submount 12 and/or more than sixteen LED chips can be provided over submount 12. It is also contemplated that various numbers of LED chips of various sizes can be combined in different ways to form a package according to embodiments of the subject matter. LED chips of two different sizes, three different sizes, and/or four or more different sizes can be used. Larger LED chips of approximately 1000 microns in size, meaning the chips are about 1000 microns wide on a given side, can be used. However, various sizes larger and/or smaller than approximately 100 microns can be used. Larger chips can be less than or approximately 2000 microns in size, less than or approximately 1000 microns in size, less than or approximately 700 microns in size, or less than or approximately 500 microns in size. Smaller chips can comprise approximately 1000 microns or less, approximately 700 microns or less, approximately 500 microns or less, approximately 300 microns or less, or smaller than approximately 300 microns.

The ability to use multiple LED chips of different sizes can advantageously allow designers of lighting package, products, and/or fixtures to "tune" the multi-chip LED package to a desired combination of voltage, current density and/or light output. Smaller chips can also be used to fill in spaces between and/or around larger chips to achieve greater chip density. LED chips of different sizes have different current densities for the same drive current, as larger chips have a lower forward voltage for the same drive current than smaller chips due to current density. LED chips of different sizes can be mixed together in one group of chips, such as the embodiment described with respect to FIGS. 6 and 7, or in two or more groups of chips where the groups are connected in series, such as those described with respect to FIGS. 10-13. An LED package as shown in FIG. 13 can comprise an efficiency of at least, 80, 85, or 90 LPW and a CRI of at least 80. The LED package can have an efficiency of approximately 95 LPW and a CRI of at least 82. The efficiency of such an LED package with a warm white color, often desired for incandescent replacement lighting, may be as much as approximately 100 LPW. However, if the package is binned for a cool white color, an efficiency of as much as approximately 150 LPW can be achieved. The design of an LED package of FIG. 13 can again be adapted so that various types of LED chips can be used, such as direct-bond chips, flip-chips, and chips with substrates made of sapphire, silicon carbide, silicon or other materials.

Figure 14:
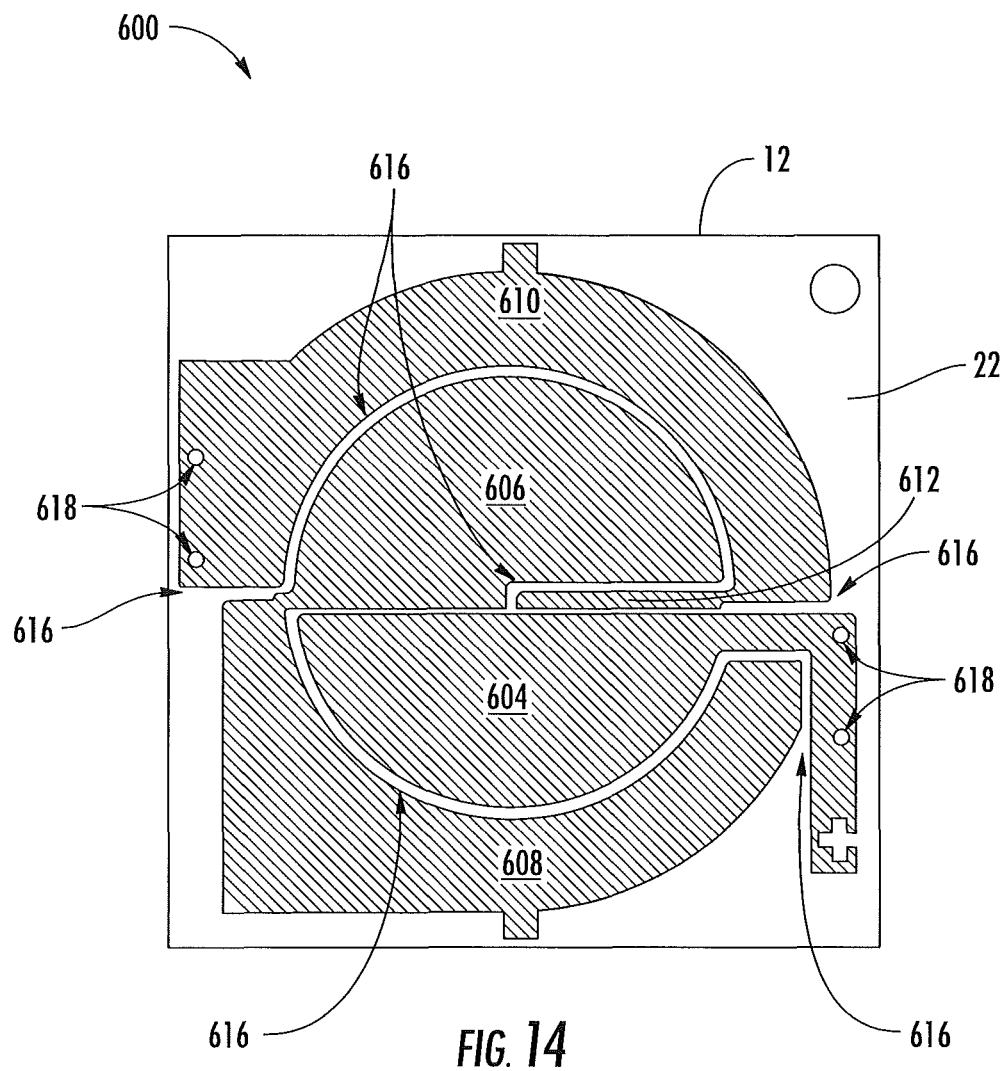
FIG. 14 is a top view illustrating a submount and electrical traces or pads according to another embodiment of the present subject matter.

FIG. 14 is a top-down view of a further embodiment of a light emitter package, such as an LED package, generally designated 600. LED package 600 can comprise a submount 12 a pattern of electrical traces or portions of conductive material disposed over submount 12 for allowing for various sizes, shapes, number, and/or groups of LED chips to be arranged thereon. Package 600 can comprise a rigid submount 12 of plastic, or a ceramic material as previously described. Package 600 can comprise at least one electrically conductive layer, often comprised of metal, that can be patterned to provide electrically conductive traces configured to supply electrical connectivity to vertically structured LED chips 602 (FIG. 15) disposed over submount 12. The layer of conductive material can comprise one or more semicircular portions or areas of material to which vertically structured LED chips 602 (FIG. 15) can be attached. A first layer or portion of conductive material 604 can comprise a first electrical trace to which anodes of one or more LED chips 602 (FIG. 15), or a first group of LED chips generally designated G1 can attach.

Figure 15:
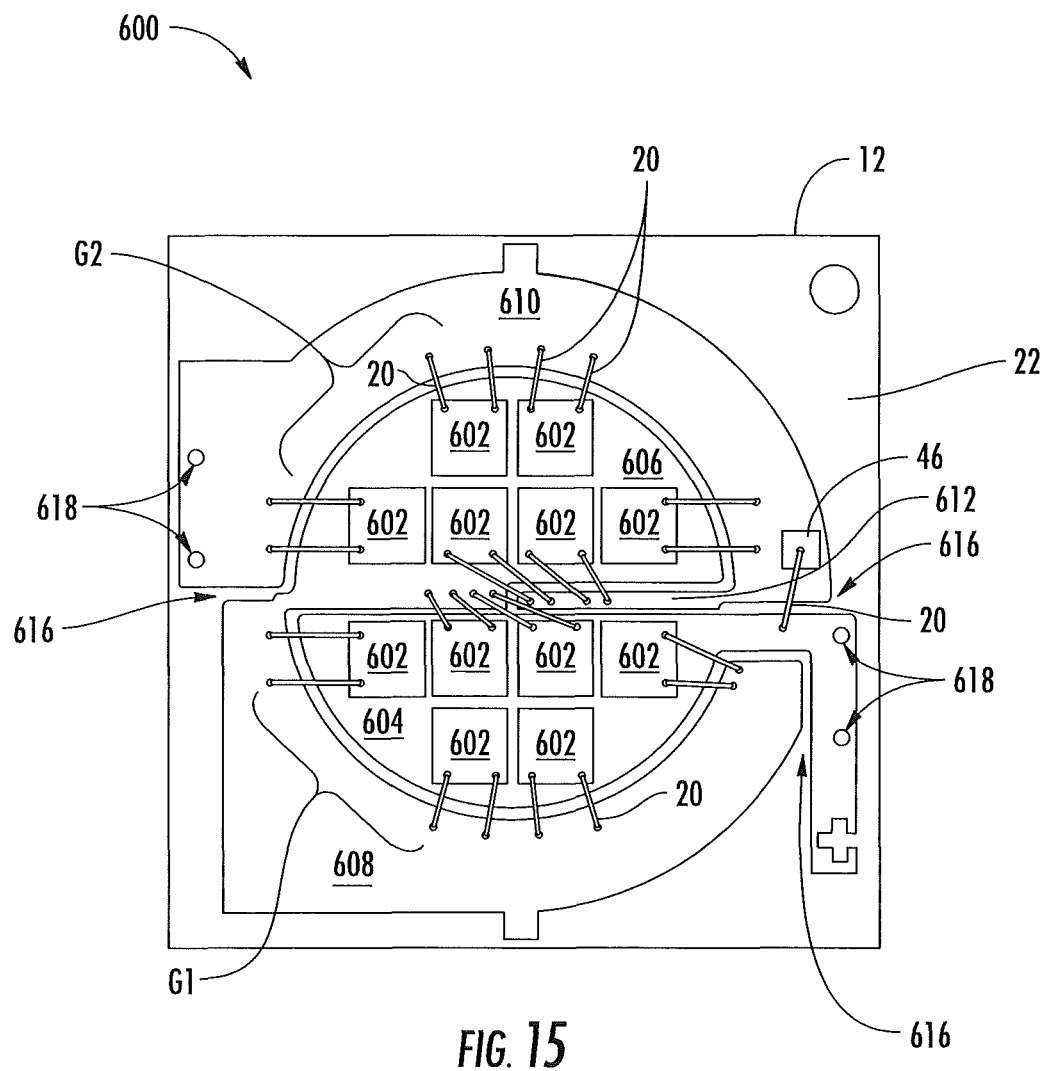
FIGS. 15 and 16 are top views illustrating various high-density, multi-chip LED packages according to the present subject matter.

As the shaded lines in FIG. 14 illustrate, a second layer or portion of conductive material 606 and an integral third layer or portion of conductive material 608 can integrally form a second electrical trace. Second portion of conductive material 606 can comprise a portion of material to which anodes of one or more LED chips 602 can attach, or a second group of LED chips generally designated G2 (FIG. 15). Third layer or portion of conductive material 608 can electrically connect to the cathodes of some LED chips 602 in first group G1 via wire bonds 20, and a fourth layer or portion of conductive material 610 can electrically connect to the cathodes of some LED chips 602 in second group G2 via wire bonds 20. Fourth portion of conductive material 610 can comprise a third electrical trace. Fourth portion of conductive material 610 can comprise a first thin fillet or leg portion 612 that can be centrally disposed with respect to submount 12. Second and third portion of conductive material 606 and 608 can be interconnected by a portion of material disposed adjacent first leg portion 612, which can also be centrally disposed with respect to submount 12.

In one aspect, LED chips 602 in first group G1 can comprise anodes directly connected to first portion of conductive material 604 and cathodes either connected to third portion of conductive material 608 or second portion of conductive material 606. LED chips 602 in second group G2 can comprise anodes directly connected to second portion of conductive material 606 and cathodes either connected to fourth portion of conductive material 610 or first leg portion 612. Like the submount shown in FIG. 10, first leg portion 612 and the adjacent portion of material (e.g., disposed between second and third portions of conductive material 606 and 608) can form a centrally located connection bus, or more simply, a central bus to which wire bonds 20 from some of the cathodes of the LED chips 602 can be connected. More than one gap 616 can be disposed over submount 12 for physically and/or electrically separating portions of conductive material (e.g., portions 604, 606, 608, and/or 610) from each other and/or from other traces.

The conductive layer from which first through fourth portions of conductive material 604 to 610 can be formed can initially be deposited on submount 12 then subsequently etched to form the desired pattern. In one aspect, etching can produce one or more gaps 616 which can physically and/or electrically separate portions of the conductive layer. In other aspects, first through further portions of conductive material 604 to 610 can be separately formed or shaped and then affixed or attached to submount 12 via adhesive, glue, epoxy, solder, or any suitable material. In further aspects, first through fourth portions of conductive material 604 to 610 can be molded in a portion of submount 12 and/or produced in any other suitable fashion using known techniques and/or materials. The conductive layer of material from which first through fourth portions of conductive material 604 to 610 can be formed can also include various holes, notches, and/or visual identifiers used for alignment during manufacturing. Package 600 can further comprise one or more connection points 618 for connecting wires from the positive and negative sides of an external power source (not shown) to LED package 600. Connection points 618 can also comprise thru-holes filled with a conductive material to form one or more electrically conductive vias capable of transferring electrical current through submount 12 and/or through portions of package 600.

FIG. 15 is a top-down view of LED package 600 further comprising twelve LED chips 602 arranged in more than one group. For illustration purposes, two groups of LED chips 602 are illustrated, first group G1 and second group G2. However, more than two groups of LED chips 602 are contemplated herein. First group G1 comprises six LED chips 602 in direct electrical communication with first portion of conductive material 604 and connected to either second or third portions of conductive material 606 or 608 via wire bonds 20 such that each LED chip 602 of first group G1 is electrically connected in parallel. The anodes of each LED chip 602 can be disposed on a bottom of the chips and can be directly attached to first portion of conductive material 604. Second group G2 comprises six LED chips that are also electrically connected in parallel. The anodes of the LED chips 602 of second group can directly connect with second portion of conductive material 606 and connected to fourth portion of conductive material 610 including first leg portion 612 via wire bonds. Notably wire bonds 20 can be disposed about outermost edges of each group and/or centrally disposed with respect to submount 12 thereby advantageously allowing for tightly packed groups of LED chips 602. This can advantageously allow for higher packaging densities of LED chips, thereby allowing for brighter more efficient packages.

LED package 600 can comprise a vertically or horizontally structured ESD protection device 46. First portion of conductive material 604 of package 600 can be connected to a positive terminal of a power source (not shown) via connection points 618. Fourth portion of conductive material 610 can be connected to a negative terminal of a power source (not shown) via connection points 618. Electrical current can then flow from the external power source (not shown) into package 600 and into the plurality of LED chips 602 thereby illuminating the LED chips 602.

Package 600 can further comprise an optical element such as a lens (see e.g., FIG. 1F) which is not shown for clarity of illustration purposes, but can be placed on top of the package and/or over portions of the LED chips 602 for focusing, diffusing, bending, and/or concentrating light rays, by color mixing or color tuning, or by a combination of these effects. An optical conversion material such one or more phosphor materials can also be applied to portions of LED chips 602, lens (FIG. 1F), and/or package components to provide wavelength conversion and produce white, warm white, and/or cool white light. Any color of phosphor material can be used in any package described herein. For example, a blue, yellow, green, or red phosphor can be applied over LED chips 602. In general, LED chips (e.g., 602) used in any package described herein can comprise any color and/or a mixture of colors including any one of a blue shifted yellow (BSY) chip, a cyan chip, a red chip, a yellow chip, a green chip, a red-orange chip, an amber chip, and/or combinations thereof. LED chips 602 can be selected from various wavelength color bins to provide a combined light output with a high CRI.

Packages described herein, for example, package 600 can comprise an efficiency of at least, 80, 85, or 90 LPW and a CRI of at least 80. LED package 600 can also have an efficiency of about 95 LPW and a CRI of at least 82. Various types of LED chips can be used in LED package 600, for example, direct-bond or direct-attach chips, flip-chips, and chips with substrates made of sapphire, silicon carbide, silicon or other materials. The efficiency of LED package 600 with a warm white color, often desired for incandescent replacement lighting, may be as much as about 100 LPW. However, if the package is binned for a cool white color, an efficiency of as much as about 150 LPW can be achieved.

Figure 16:
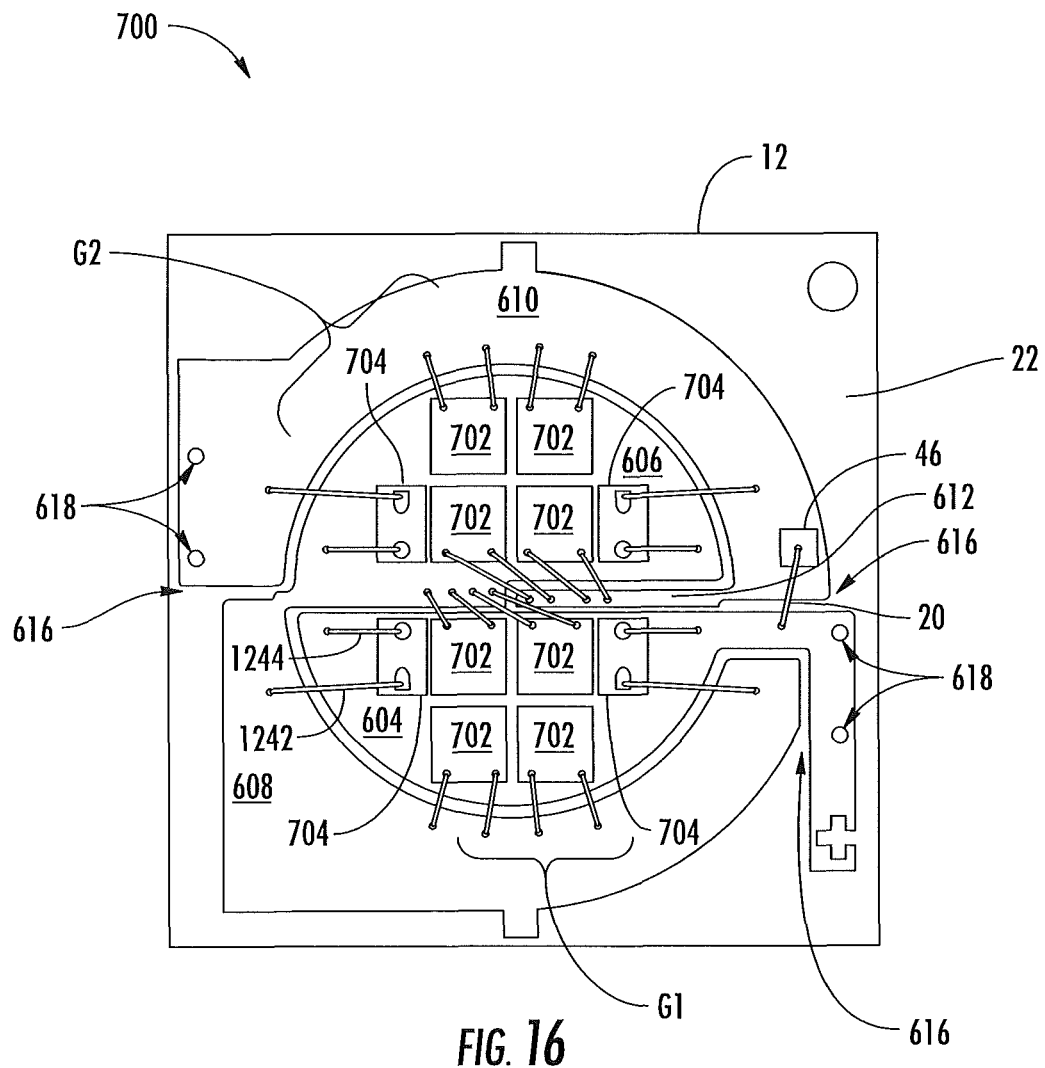

FIG. 16 is a top-down view of a light emitter or LED package 700 according to an embodiment of the present subject matter. LED package 700 can comprise submount 12 and portions of conductive material (e.g., 604 to 610) disposed over submount 12 as described in FIGS. 14 and 15. LED package 700, however, can comprise two different types or structures of LED chips. For example, LED package 700 can comprise a first type of LED chip 702 and a second type of LED chip 704. First and second groups G1 and G2 of LED chips can be used, where each group comprises first and second types of LED chips 702 and 704 electrically connected in parallel.

First type of LED chips 702 can comprise vertically structured LED chips directly attached to either first or second portions of conductive material 604 or 606. Second type of LED chips 704 can comprise horizontally structured sidelooker or sideview LED chips each of which can have wire bonds 20 connected to the top of the chip to both the anode and the cathode. Second type of LED chips 704 can also comprise a non-square shape, such as a rectangular shape. In this aspect, each of first and second group G1 and G2 can include six total chips, including four first type of LED chips 702 which can comprise square chips, and two second type of LED chips 704 which can be rectangular in shape. More than two groups of LED chips are contemplated herein. Each group of a plurality of LED chips (e.g., first and second groups G1 and G2) can be electrically connected in series. Wire bonds 20 can be disposed along the outside perimeter of each group of LED chips, thereby, allowing for an increased packing density. Any of various types (e.g., structure, color, size, etc.) of LED chips can be used alone, or different types can be combined.

Package 700 can further comprise an optical element such as a lens (see e.g., FIG. 1F) which is not shown for clarity of illustration purposes, but can be placed on top of the package and/or over portions of first and second types if LED chips 702 and 704 for focusing, diffusing, bending, and/or concentrating light rays, by color mixing or color tuning, or by a combination of these effects. An optical conversion material such one or more phosphor materials can also be selectively applied to portions of one or more and/or each of first and second types of LED chips 702 and 704, lens (FIG. 1F), and/or package components to provide wavelength conversion and produce white, warm white, and/or cool white light. Any color of phosphor material can be used in any package described herein. For example, a blue, yellow, green, or red phosphor can be applied over one or both types of LED chips and/or over only one, more than one, or each LED chip. In general, LED chips used in any package described herein can comprise any color and/or a mixture of colors including any one of a blue shifted yellow (BSY) chip, a cyan chip, a red chip, a yellow chip, a green chip, a red-orange chip, an amber chip, and/or combinations thereof. The efficiency of LED package 700 with a warm white color, often desired for incandescent replacement lighting, may be as much as about 100 LPW. However, if the package is binned for a cool white color, an efficiency of as much as about 150 LPW may be achieved.

Figure 17:
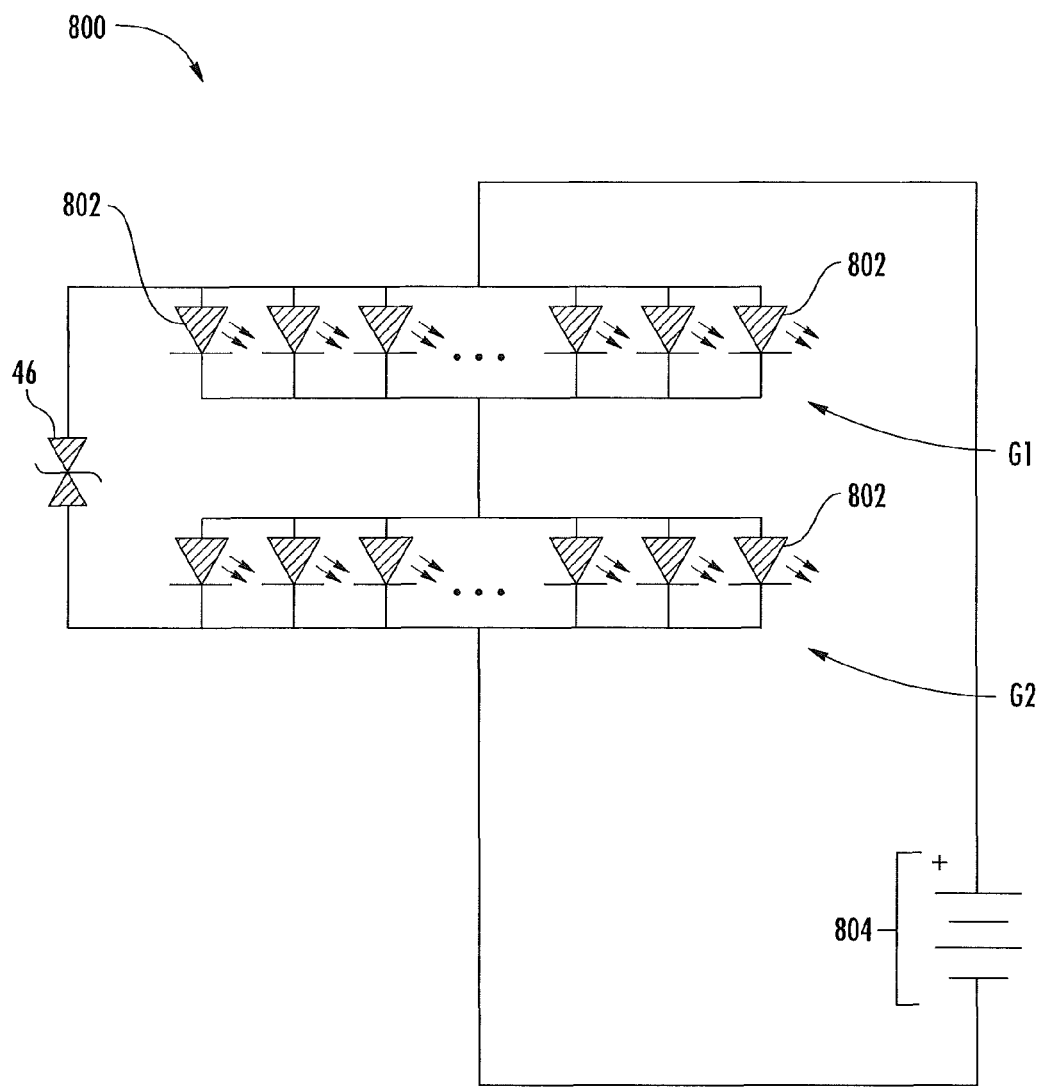
FIG. 17 is a schematic diagram illustrating the electrical connection between LED chips in FIGS. 10 to 16.

FIG. 17 is a generalized, schematic diagram of the circuit of the LED packages shown and described with respect to FIGS. 10 to 16. Circuit 800 can comprise multiple LED chips 802 in first group G1 and second group G1. Each LED chip 802 in first and second groups G1 and G2 can be connected in parallel. Each LED chip 802 within each group can be the same, or the chips 802 can be a combination of different structures, types, colors, sizes, shapes, etc. First group G1 can be electrically connected in series with second group G2. A power source 804 can supply power to illuminate the plurality of LED chips 802. ESD protection device 46 can be connected in parallel across the entire LED circuit spanning both groups of LED chips.

Figure 18:
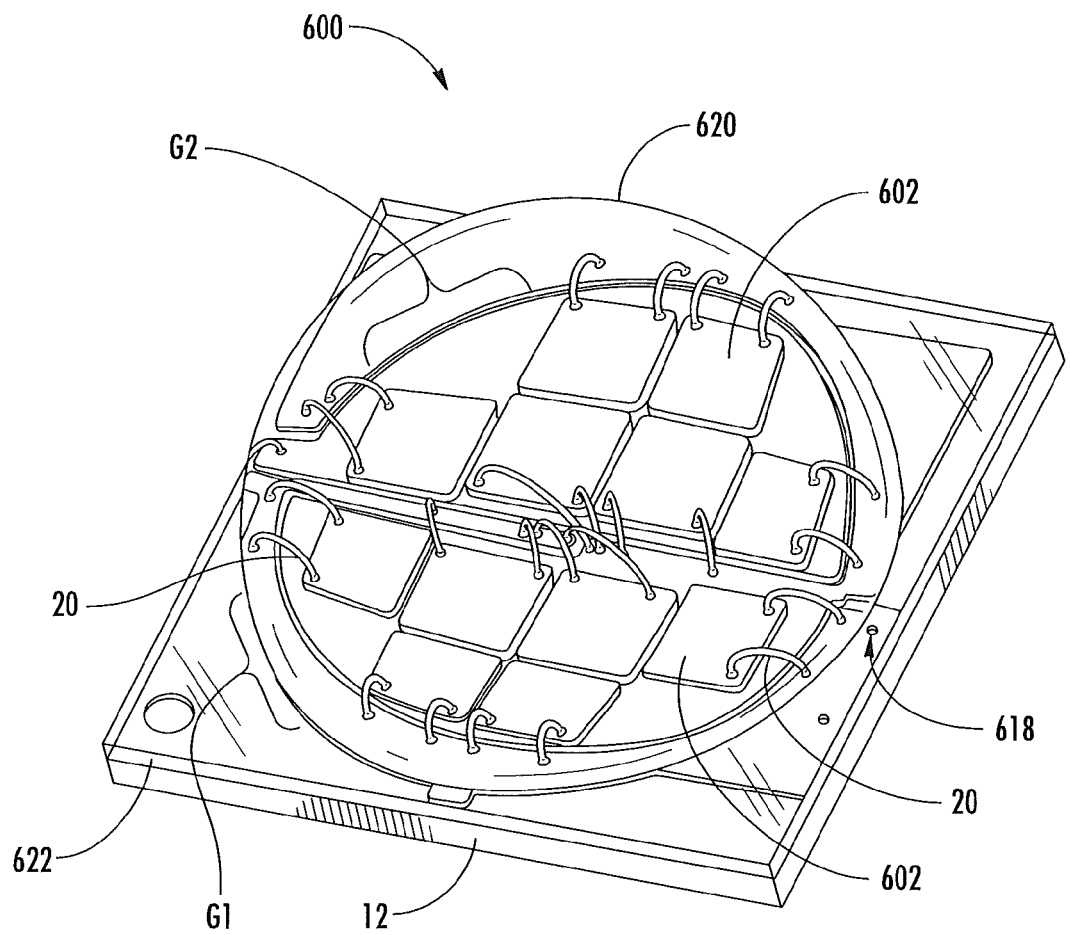
FIG. 18 is a top perspective view illustrating a further embodiment of a high-density, multi-chip LED package according the present subject matter.

FIG. 18 is a perspective view of LED package 600 previously shown and described with respect to FIGS. 14 and 15. In FIG. 18, an optical element, such as a lens 620 is visible over the two groups of six LED chips 602 and submount 12. The distortion or exaggeration introduced by the lens can also be seen. In the view of FIG. 18, package 600 can be positioned so that the plus sign in the metal layer is in the top left corner. As previously mentioned a lens for use with any LED package shown or described herein can comprise glass, plastic, can be molded in place or elsewhere, or otherwise formed or attached to the package as desired. For example, lens 602 can comprise a molded silicone such as shown and described with respect to FIGS. 3A to 4B. FIG. 18 illustrates lens 620 used with the embodiment of the LED package previously shown in FIGS. 14 and 15, however, essentially the same type, shape, and/or general appearance of lens 620 can be used with any of the embodiments described herein, with appropriate adjustment in the size of lens 620 for the number of LED chips 602 used and/or size of substrate 12 used.

Figure 19:
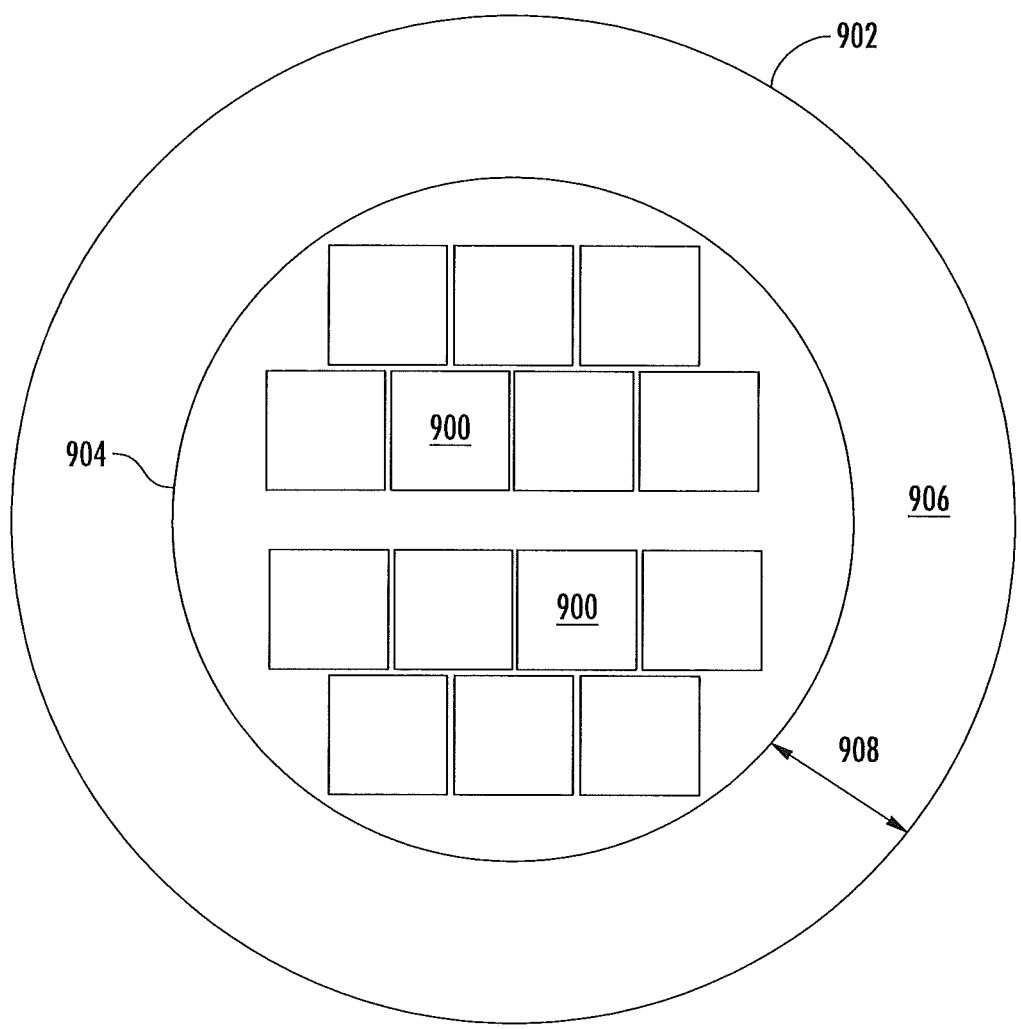
FIG. 19 is a schematic illustration illustrating LED chips and lens size according to the present subject matter.

FIG. 19 is purely schematic and illustrates determination of an amount of clearance between LED chips 900 and an edge of a lens 902 for embodiments of the present subject matter. In this example, fourteen identical LED chips 900 are represented by squares. An outer edge of lens 902 is represented by a first circle. A second, inner circle 904 can circumscribe the plurality of LED chips 900 at a widest point. LED chips 900 can, but do not have to be centrally disposed below lens. Area 906 represents a clearance area, with the size of the clearance defined by a length 908. As previously described, this size, in example embodiments, can be approximately 0.2% to 0.8% of a maximum width across the LED chips. The clearance can also be from approximately 0.3% to 0.65% of the width of the LED chips.

High density multi-chip package as described herein, especially as exemplified by the embodiments shown in FIGS. 10 to 18 can comprise a plurality of LED chips, where each LED chip can be identical, or where combinations of more than one type, size, structure, color, etc., of LED chip can be used. Vertical chips, flip-chip, and sideview chips are contemplated, and sideview style chips have also been shown in some of these specific embodiments. LED chips having a low reabsorption, especially for blue light, can assist in improving light output. Square submounts have been shown, but submounts of various shapes and/or sizes are contemplated herein. Submounts can comprise a ceramic or ceramic based material, a metal material, a plastic material, or combinations thereof. A plastic submount can have a metal slug to assist with heat dissipation and heat sinking. Various semiconductor materials can be used within LED chips, including silicon carbide and sapphire. The layouts provide for high-density, efficient packages provided in part by placement of wire bonds needed to interconnect the LED chips. The specific submount metal pattern designs can advantageously minimize light absorption by the submount, and also help increase light output.

The characteristics described above can provide a high-density package light that described to be used in a solid-state replacement for a bright halogen bulb such as the now popular MR16 halogen multi-reflector bulb. In example embodiments, the package size can be approximately 10 mm on a given side. It is possible, by the use of smaller LED chips, fewer, and/or larger LED chips to achieve high efficiency in a small package, for example, a package less than approximately 5 mm on a side or less than approximately 3.5 mm on a side. In one aspect, four 1000 micron LED chips can be replaced with one 2000 micron LED chip. A package can also be scaled to exactly the maximum size that would fit in an LED bulb of a form factor appropriate for a specific incandescent or halogen bulb, such as the previously mentioned MR16 bulb.

Figure 20A:
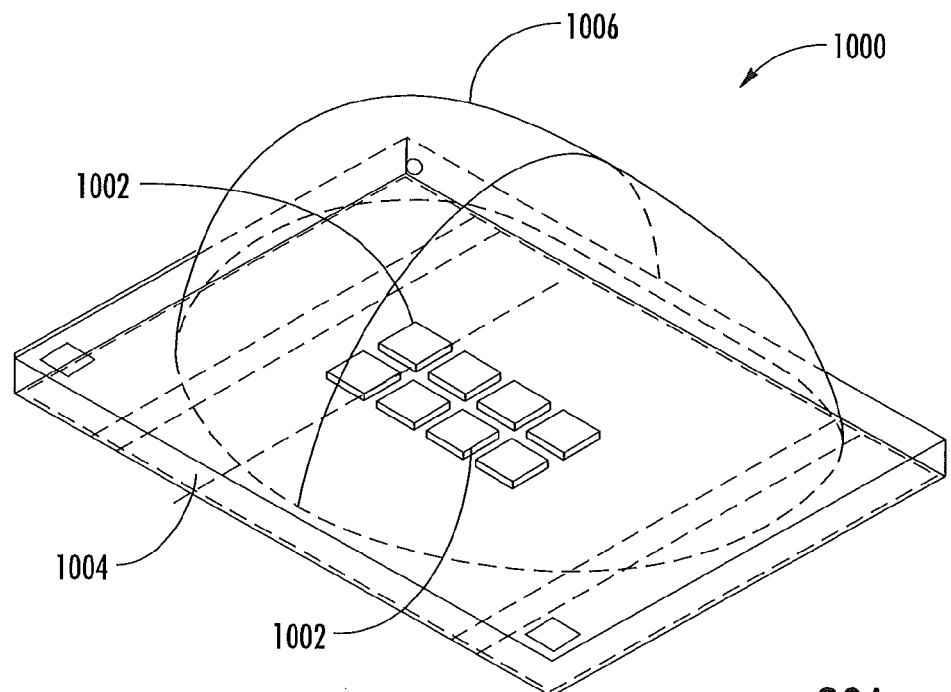
FIGS. 20A to 20E are top perspective, top, side, and end views illustrating further embodiments of LED packages according to the present subject matter.

FIG. 20A is a perspective drawing of an embodiment of an inventive light emitter package, such as LED package generally designated 1000 including an array of eight LED chips 1002. The array of LED chips 1002 can be disposed over a submount 1004, which can be similar in form and function to previously described submount 12; however, submount 1004 can comprise a non-square shape. In one aspect, submount 1004 can comprise a rectangular shape and can comprise $Al_2O_3$, AlN, any ceramic or ceramic based material, a metal, a plastic, or combinations thereof. Notably, an asymmetric lens 1006 can be provided and/or overmolded on a portion of submount 1004. Lens 1006 can be disposed over portions of the array of LED chips 1002.

Figure 20B:
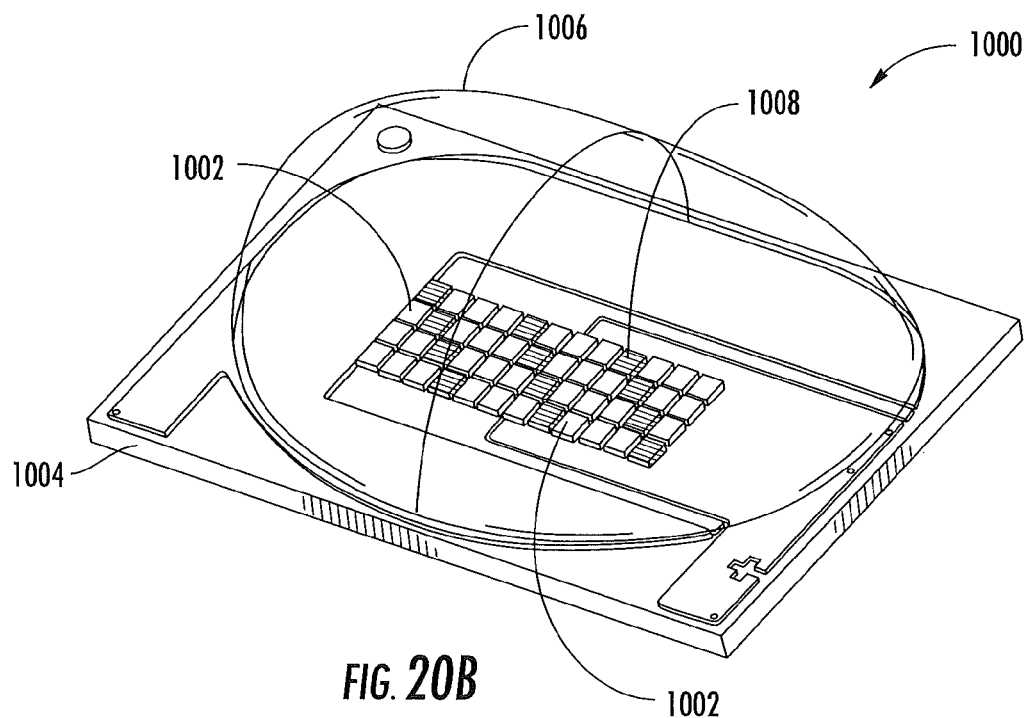

FIG. 20B is a perspective drawing of an alternative embodiment of LED package 1000. LED package 1000 can comprise an LED array comprised of forty-eight LED different types of chips, designated 1002 and 1008. LED chips 1002 and 1008 can comprise two dissimilar colored LED chips illustrating that color mixing can be achieved within an array of LED chips. The structure of package 1000 can otherwise be the same. In one aspect, LED chips 1002 and 1008 can comprise a combination of one or more blue, BSY, red, green, yellow, cyan, red-orange, and/or amber chips used alone and/or with any combination of red, blue, yellow, and/or green phosphor materials.

Figure 20C:
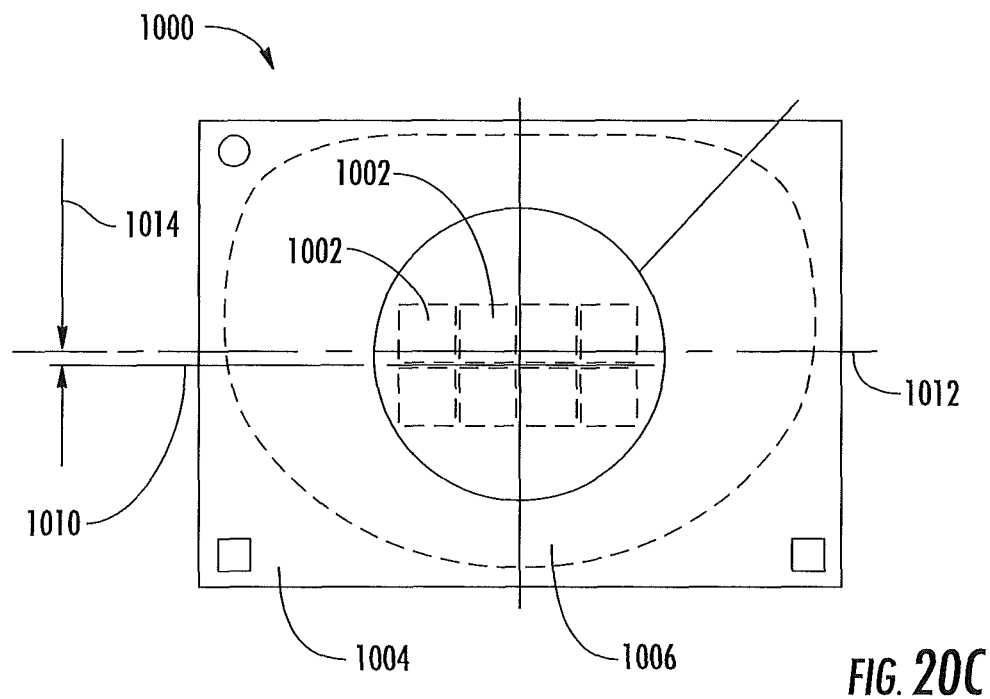
Figure 20D:
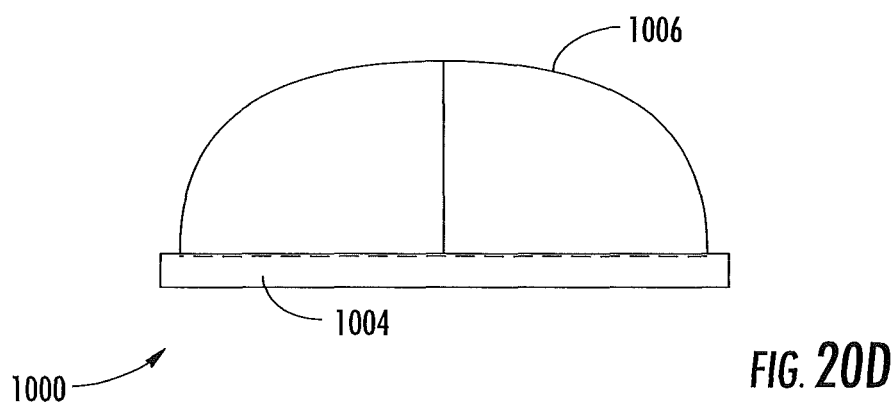
Figure 20E:
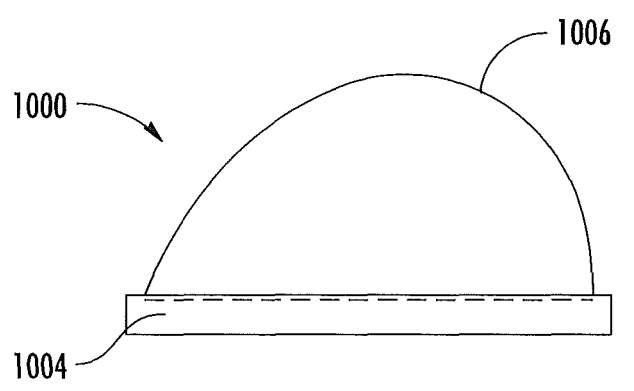

Light emitted by LED package 1000 can be directed towards a preferential side. For example, in FIGS. 20A and 20B, light from the array of LED chips 1002 and/or 1008 can be directed into the page and to the right. Such preferential-side light directing is best illustrated in FIGS. 20C to 20E. Package 1000 can comprise an asymmetrical, asymmetric, and/or asymmetrically shaped lens 1006. In FIG. 20C, direction of preferential-side illumination is toward the top of the figure; in FIG. 20E, direction of preferential-side illumination is to the right of the figure.

Preferential-side illumination is also achieved by the relative position of the array of LED chips 1002 and lens 1006. FIG. 20C is a front (top) view of package 1000. FIG. 20C shows the array of LED chips 1002 comprising a centerline 1010 (i.e., also called an emitter axis) and lens 1006 can comprise a lens centerline 1012. Lens centerline 1010 can be offset from LED chip centerline 1010 by an offset distance 1014. As the broken line in FIG. 20C denotes, lens 1006 can comprise a non-circular base. In one aspect, lens 1006 can comprise a substantially kidney bean shape that may be asymmetric about one or more axes. Offset distance 1014 can be on the order of approximately 0.24 mm for LED array dimensions of approximately 2.08 mm by 4.23 mm within submount dimensions of approximately 8.22 mm by 11.25 mm. Numerous other dimensional sets are possible and contemplated herein. FIGS. 20D and 20E are side and end views of package 1000, further illustrating asymmetric lens 1006.

Figure 21A:
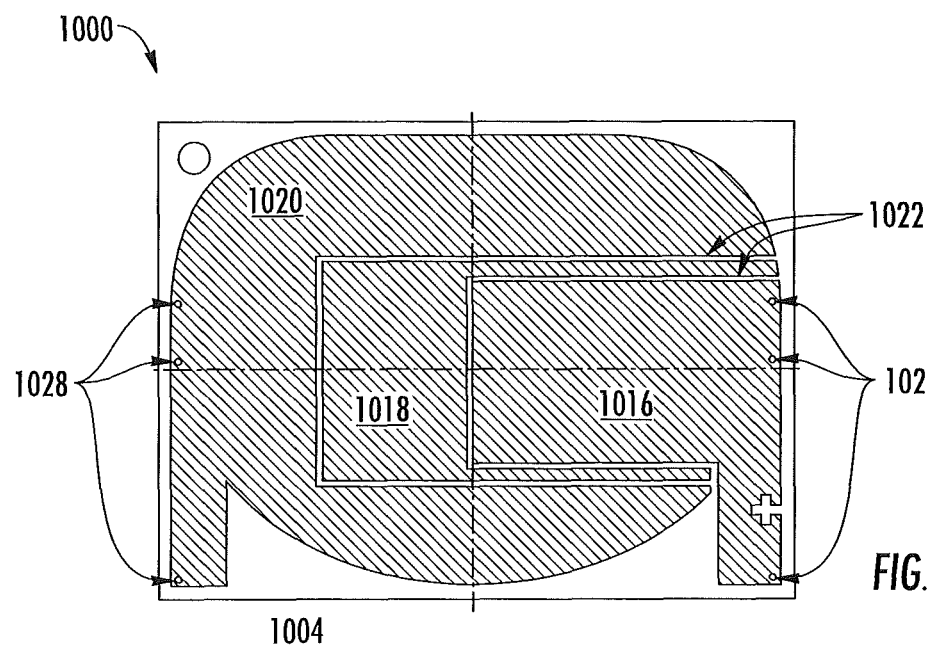
FIGS. 21A to 21C are a top, side, and bottom views, respectively, illustrating a submount and electrical traces according to another embodiment of the present subject matter.
Figure 23:
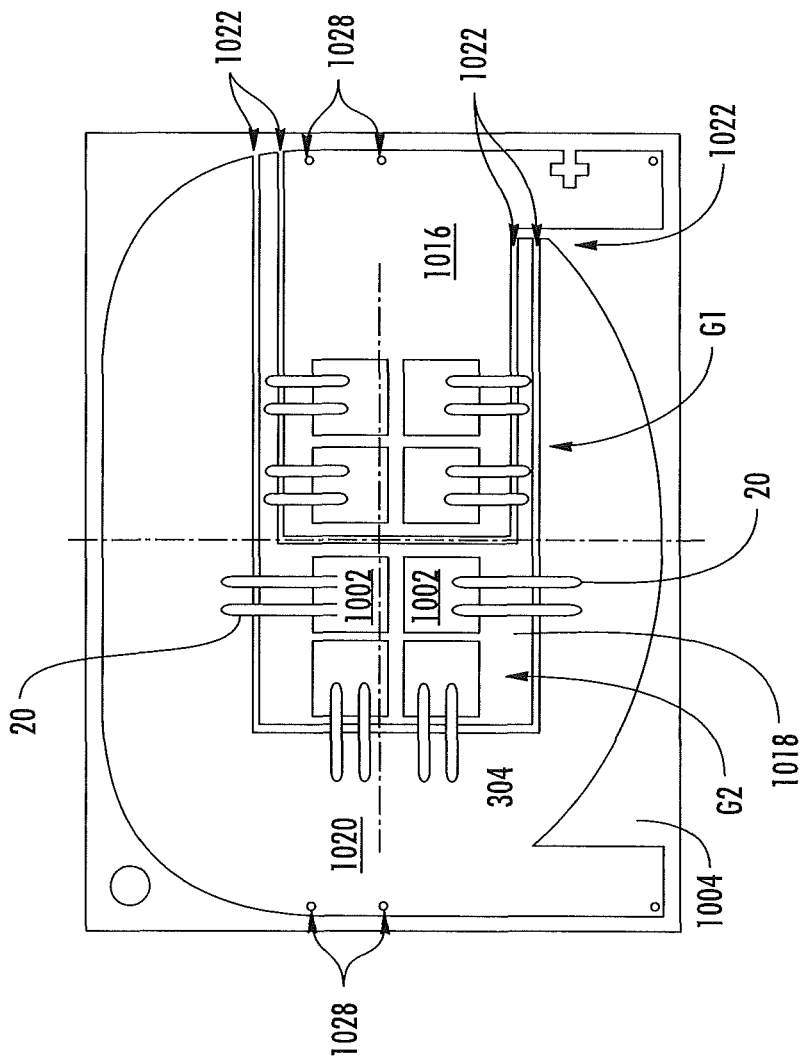
FIG. 23 is a top view illustrating a multi-chip LED package according to an embodiment of the present subject matter.

FIG. 21A is a front (top) view of submount 1004 of package 1000 of FIGS. 20A to 20E. FIG. 21A illustrates electrical traces (e.g., portions of conductive material), such as layers of metal, in shaded lines. FIG. 23 illustrates LED chips 1002 disposed over portions of LED package 1000. LED chips 1002 are schematically shown as squares, however, chips 1002 can comprise any size, shape, structure, build, and can comprise any location, size, and/or shape of bond pad (18, FIG. 1F) and/or current spreading structure (16, FIG. 1F) desired. Submount 1004 can comprise a rigid base of plastic or ceramic based material such as $Al_2O_3$ or AlN. Package 1000 can comprise at least one electrically conductive layer, often comprised of metal, that can be patterned to provide electrically conductive traces configured to supply electrical connectivity to LED chips 1002 (FIG. 23) disposed over submount 1004. The layer of conductive material can comprise one or more asymmetrical portions or areas of material to which LED chips 1002 (FIG. 23) can be attached.

Submount 1004 can comprise three contact pads or electrical traces. A first electrical trace or a first contact pad 1016 can comprise a positive electrical polarity. A second electrical trace or an intermediate contact pad 1018 can be disposed adjacent first contact pad 1016. A third electrical trace or a third contact pad 1020 can be disposed on a side of intermediate contact pad 1018 which opposes first contact pad 1016. Each contact pad can comprise one or more layers of metal deposited over a ceramic or ceramic based submount 1004 by a metallization process. A first subset or group of LED chips cam be secured with respect to one of the positive and negative contact pads. A second subset or group of LED chips can be secured with respect to one of the at least one intermediate contact pads. The first and second groups of LED chips can be mutually-exclusive and have the same number of LEDs chips. In certain of these embodiments, the array includes eight LED chips, and certain others, the array includes forty-eight LED chips.

The geometric configuration of the first, intermediate, and third contact pads 1016, 1018, and 1020, respectively, can be arranged such that an array of LED chips 1002 can be conveniently laid out in a substantially rectangular pattern such as shown in FIGS. 20A and 20B. Numerous other patterns are possible as are numerous other geometric configurations of the contact pads. Such other configurations and patterns are not limited by the embodiments shown. One or more gaps 1022 can be disposed between first contact pad 1016 and intermediate contact pad 1018, and between intermediate contact pad 1018 and third contact pad 1020.

Figure 21B:
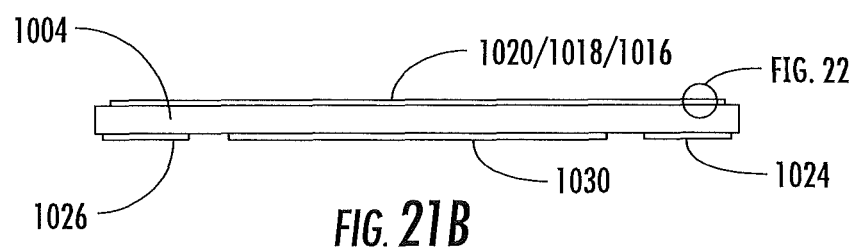
Figure 21C:
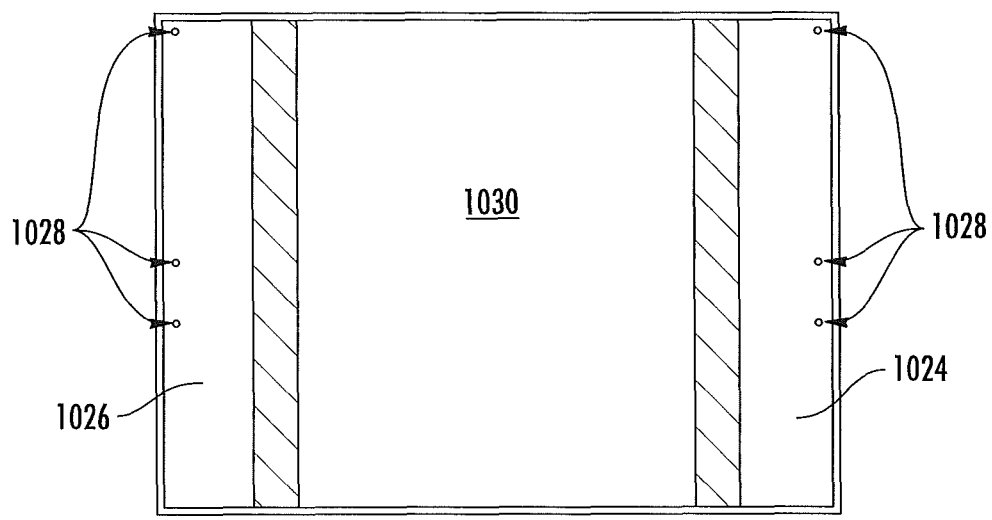

FIG. 21B is an edge view of submount 1004 onto which first, intermediate, and third contact pads 1016, 1018, and 1020, respectively, can be deposited. In one aspect, contact pads can be deposited in a single uniform layer in which chemical etching and/or physical removal of metal can form gaps 1022 thereby defining first, intermediate, and third contact pads 1016, 1018, and 1020, respectively. FIG. 21C is a back (bottom) view of submount 1004 illustrating mounting pads for allowing package 1000 to be mounted over surfaces of an external power source including, for example, a circuit board, PCB, MCPCB, flex circuit, heat sink, etc. A first mounting pad 1024 and a second mounting pad 1026 can be deposited over portions of submount 1004 via a metallization process. First and second mounting pads 1024 and 1026 can electrically communicate to first contact pad 1016 and third contact pad 1020, respectively, by allowing electrical current to pass along one or more electrically conductive vias 1028. Vias 1029 can pass electrical current from the external power source internally through portions of submount 1004 via metallization, thereby enabling mounting pads 1024 and 1026 to serve as electrical connections to a printed circuit board or other substrate or structure for package 1000. A thermally conductive mounting pad 1030 can be electrically isolated from first and second mounting pads 1024 and 1026, and can provide good thermal conductivity for submount 1004.

In FIGS. 21A and 21C, three electrically conducive vias 1028 are shown for each polarity and can connect first contact pad 1016 and first mounting pad 1024 allowing electrical current to pass therebetween. Vias 1028 can further electrically connect third contact pad 1020 and second mounting pad 1026 allowing electrical current to pass therebetween, and into the plurality of LED chips 1002 (FIG. 23).

Figure 22:
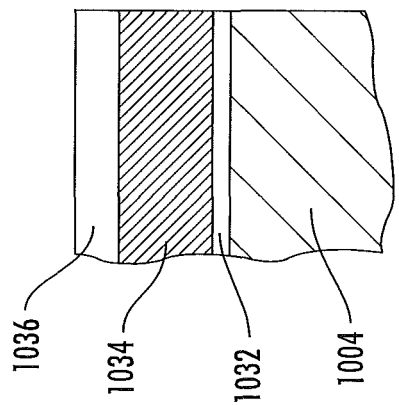
FIG. 22 is a detailed view illustrating the upper right corner of the submount and electrical traces according to FIG. 21B.

FIG. 22 is a detailed view of the upper right corner of submount 1004 of package 1000 shown in FIG. 21B. That is, FIG. 22 illustrates contact pad metallization layers. Submount 1004 can comprise a ceramic based material, such as $Al_2O_3$ or AlN. A first layer 1032 can be deposited over submount, and can comprise a layer of titanium (Ti). A second layer 1034 can comprise a layer of copper (Cu) deposited over the Ti layer. A third layer 1036 can comprise a layer of silver (Ag) deposited over a portion of the Cu layer. Note that all of these layers are not shown in their proper relative thicknesses. In one aspect, the ceramic based submount 1004 can comprise a base layer of ceramic material of approximately 0.50 mm. First layer 1032 can comprise approximately 0.06 microns, second layer 1034 can comprise approximately 50 microns, and third layer 1036 can comprise approximately 3.5 microns.

FIG. 23 is front view of submount 1004 of package 1000. FIG. 23 illustrates first, intermediate and third contact pads 1016, 1018 and 1020, respectively, deposited onto ceramic based submount 1004 via metallization. A plurality and/or array of LED chips 1002 can be provided over portions of contact pads. In one aspect, eight LED chips 1002 can be disposed over portions of contact pads. In one aspect, first group G1 can comprise four LED chips 1002 electrically connected in parallel disposed directly over first contact pad 1016 and wire bonded to portions of intermediate contact pad 1018. Second group G1 can comprise four LED chips 1002 electrically connected in parallel and disposed directly over portions of intermediate contact pad 1018 and wire bonded to portions of third contact pad 1020. First group G1 can mutually exclusive from and in series with second group G2. More than two groups of LED chips 1002 are contemplated herein.

In this embodiment, LED chips 1002 can be bonded onto the corresponding contact pads with the cathode side (n-type material) directly disposed over and/or mounted to first or intermediate contact pads 1016 or 1018. The opposite sides of LED chips 305 are the anode sides (p-type material) can be wire bonded to different contact pads to complete the electrical circuit of package 1000. FIG. 23 also shows gaps 1022 between contact pads which provide electrical isolation therebetween. Although not shown, an ESD protection device can be provided over portions of contact pads.

Figure 24:
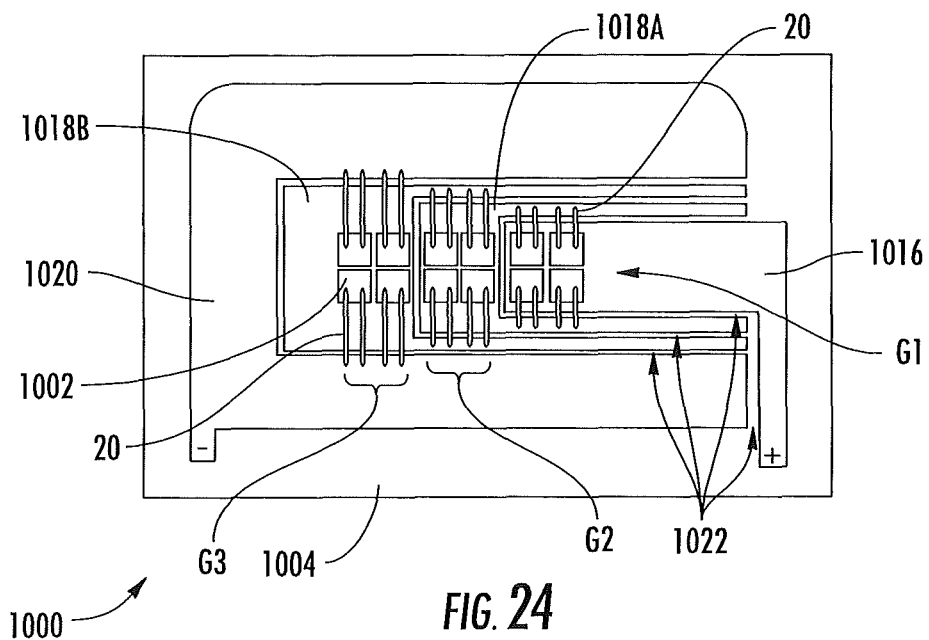
FIG. 24 is a top view illustrating a multi-chip LED package according to a further embodiment of the present subject matter.

FIG. 24 is front view of submount 303 of package 302. FIG. 24 illustrates first and third contact pads 1016 and 1020, as well as two intermediate contact pads, a first intermediate contact pad 1018A and a second intermediate contact pad 1018B deposited onto ceramic based submount 1004 via metallization. Any number of contact pads is contemplated. Twelve LED chips 1002 can be mounted in three groups, first group G1, second group G2, and a third group G3. Each group of LED chips 1002 can be bonded or mounted onto a positive contact pad and can be wire bonded to a negative contact pad. For example, first group G2 can comprise LED chips 1002 directly attached to portions of first contact pad 1016 and wire bonded to portions of first intermediate contact pad 1018A. Second group G2 can comprise four LED chips 1002 attached to first intermediate contact pad 1018A and wire bonded to portions of second intermediate contact pad 1018B. Third group G3 can comprise four LED chips 1002 attached to portions of second intermediate contact pad 1018B and wire bonded to third contact pad 1020. In this embodiment, LED chips 1002 can be bonded onto the corresponding contact pads with the cathode side (n-type material) contacting the contact pads. The opposite sides of LED chips 1002 are the anode sides (p-type material), and these can be wire bonded to other contact pads to complete the electrical circuit of package 1000.

FIG. 24 illustrates the wire bonding connections as follows: The anode sides of each of the four LED chips of first group G1 can be bonded to first contact pad 1016 are wire bonded to first intermediate contact pad 1018A with two wire bonds 20 extending from each LED chip 1002. The anode sides of each of the four LED chips of second group G2 can be bonded to first intermediate contact pad 1018A and wire bonded to second intermediate contact pad 1018B via two wire bonds 20 extending from each LED chip 1002. The anode sides of each of the four LED chips of third group G3 can be bonded to second intermediate contact pad 1018B are wire bonded to negative contact pad (e.g., third contact pad 1020) via two wire bonds 20, The second wire bond connection on each LED 1002 provides electrical redundancy for each LED chip. FIG. 24 also shows gaps 1022 disposed between portions of first, intermediate, and third contact pads which provide electrical isolation and/or physical separation therebetween. LED chips of each group G1, G2, and G3 can be electrically connected in parallel. First group G1 can be in series with second group G2 and third group G2. Each group can be electrically connected in series.

Figure 25:
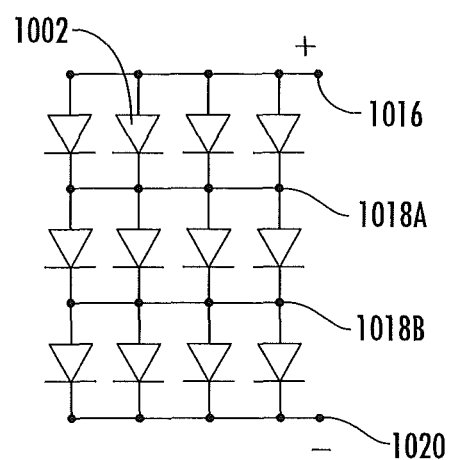
FIG. 25 is schematic partial circuit diagram illustrating the electrical connectivity of the LED chips of the package of FIG. 24.
Figure 26:
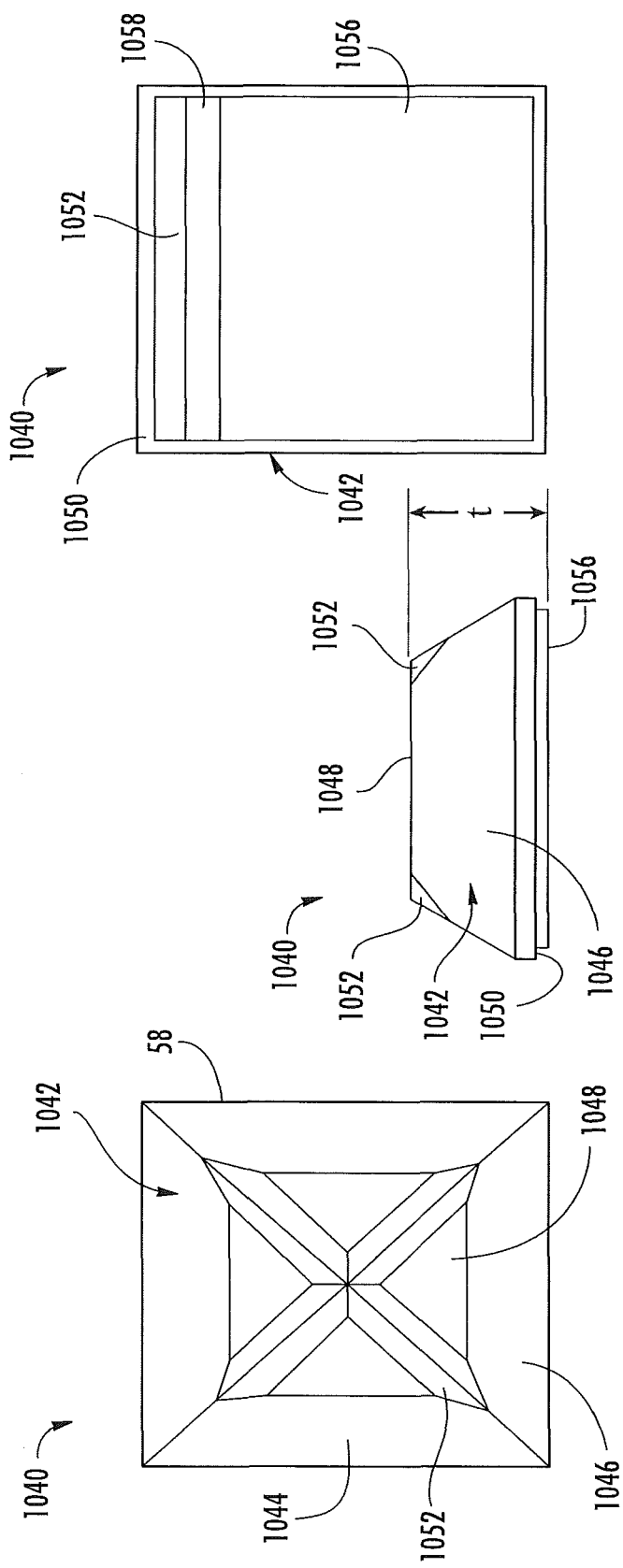
FIGS. 26A to 26C are top, side, and bottom views, respectively, illustrating an LED chip according to an embodiment of the present subject matter.

FIG. 25 is simple circuit diagram illustrating the electrical connectivity of LED chips 1002 within package 1000. In essence, the connectivity is three serial groups of four LED chips 1002, where LED chips in each group are wired in parallel. Positive contact (e.g., first contact pad 1016) can be connected to a positive terminal of a DC driver circuit (not shown) and negative contact pad (e.g., third contact pad 1020) can be connected to the negative terminal of such driver circuit. First intermediate contact pad 1018A and second intermediate contact pad 1018B can form common connection points for the LED chips 1002 as indicated in FIG. 25. (Package 1000 of FIG. 20B, with its forty-eight LED chip array can be electrically arranged in two groups of twenty-four parallel wired LED chips 1002 and 1008 and each group can be connected in series with each other.) Other serial/parallel configurations are possible.

FIGS. 26A to 28 illustrate various embodiments of LED chips that can be incorporated into the novel LED or light emitter packages shown and disclosed herein. Notably, LED chips described herein can also comprise direct attached chips (e.g., no wire bonds necessary) for improvements in brightness and light extraction per package or device. FIGS. 26A to 28 illustrate various embodiments of an LED chip and/or chips which can be partially disposed over portions of a package submount in any package described herein.

Referring to FIGS. 26A to 26C, an LED chip 1040 can comprise a substrate, generally designated 1042, which can be beveled and/or of a bevel cut, thereby providing a chip having angled or beveled surfaces disposed between an upper face and a lower face. Specifically, the figures illustrate an embodiment where LED chip 1040 is a substantially square-shaped chip where adjacent surfaces 1044 and 1046 can comprise substantially the same length. Notably, LED chip 1040 can comprise a bondpad-down design which allows for eutectic direct die attach and eliminates the need for wire bonds, which enables superior performance from improved thermal management.

In one aspect and as illustrated in FIG. 26B, LED chip 1040 can have a thickness t of approximately 0.335 mm (e.g., 335 μm) or various sub-ranges of thicknesses t from 0.15 to 0.34 mm, such as approximately 0.15 to 0.17 mm (e.g., 150 to 170 μm); 0.17 to 0.2 mm (e.g., 170 to 200 μm); 0.2 to 0.25 mm (e.g., 200 to 250 μm); 0.25 to 0.30 mm (e.g., 250 to 300 μm); and 0.30 to 0.34 mm (300 to 340 μm).

In one aspect, LED chip 1040 can have an area (e.g., product of the maximum lengths of adjacent sides 1044 and 1046) of approximately 0.74 $mm^2$ or less, for example, 0.72 $mm^2$ or less. In other aspects, LED chips 1040 can be various sub-ranges of surface area from approximately 0.25 to 0.72 $mm^2$, for example, approximately 0.25 to 0.31 $mm^2$; 0.31 to 0.36 $mm^2$; 0.36 to 0.43 $mm^2$; 0.43 to 0.49 $mm^2$; 0.49 to 0.56 $mm^2$; 0.56 to 0.64 $mm^2$; and 0.64 to 0.72 $mm^2$. In one aspect, an upper face 1048 of LED chip 1040 can comprise a smaller surface area than a lower face 1050. One or more beveled or angled sides, such as adjacent surfaces 1044 and 1046 can be disposed between upper and lower faces 1048 and 1050, respectively. In some aspects but not necessarily in all, at least one groove, such as an X-shaped groove 1052 can be disposed in upper face 1048 of LED chip 1040. Multiple X-shaped grooves and/or other shaped grooves can also be provided. In one aspect, grooves 1052 can improve light extraction. Grooves 1052 can be provided by sawing or cutting into upper surfaces of the chips prior to singulation from a wafer or after singulation. Notably, physical attributes of LED chip 1040 such as beveled sides, X-shaped grooves, and other attributes can unexpectedly contribute to brighter, more efficient LED devices and packages when combined with novel optical elements, such as lenses or encapsulant, shown and described herein.

As illustrated by FIG. 26C, LED chip 1040 can comprise electrical contacts on the same surface, for example, a bottom surface or face 1050. Electrical contacts can comprise an anode 1054 and a cathode 1056 which can collectively occupy at least approximately 90% of the active diode region. Anode 1054 can be at least partially disposed over and electrically communicate with a first electrical element or trace (e.g., contact pad, or portion of conductive material) of an LED package. Cathode 1056 can be at least partially disposed over and electrically communicate with second electrical element or trace (e.g., contact pad and/or portion of conductive material having an opposite polarity as first electrical element) of the LED package. A gap 1058 can be disposed between anode 1054 and cathode 1056. In one aspect, gap 1058 can for example be approximately 75 μm wide/thick or less. Notably, direct attach LED chips (e.g., LED chip 1040) do not require the use of wire bonds for receiving electrical current. This can be advantageous, as wire bonds can block, absorb, and/or otherwise interfere with light and can hinder package efficiency and/or brightness.

In one aspect, LED chip 1040 can comprise a direct attach type of chip that is horizontally structured such that electrically connecting chip to electrical components of an LED package via wire bonding is not required. That is, LED chip 1040 can comprise a horizontally structured device where each electrical contact (e.g., the anode and cathode) can be disposed on the bottom (or top) surface of LED chip 1040. In this aspect both contacts are on the bottom of LED chip 1040. Die attaching LED chip 1040 using any suitable material and/or technique (e.g., solder attachment, preform attachment, flux or no-flux eutectic attachment, silicone epoxy attachment, metal epoxy attachment, thermal compression attachment, and/or combinations thereof) can directly electrically connect LED chip 1040 to electrical elements of an LED package such as traces, contact pads, or portions of conductive material that is disposed over a package submount, without requiring wire bonds. In one aspect, a eutectic direct die-attach process can be used to connect LED chip 1040 to conductive pads of an LED package.

Figure 27:
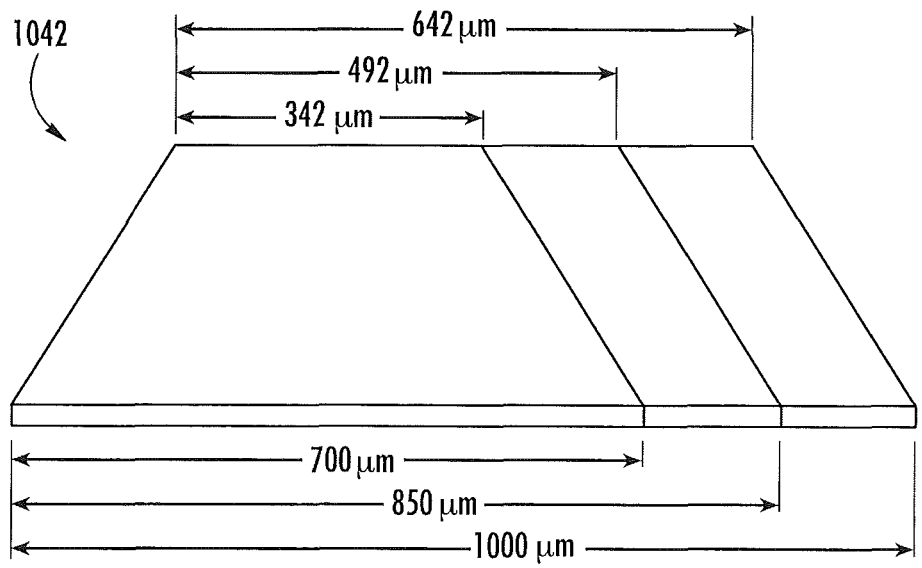
FIGS. 27 and 28 are schematic diagrams illustrating dimensions associated with the LED chips of FIGS. 26A to 26C.
Figure 28:
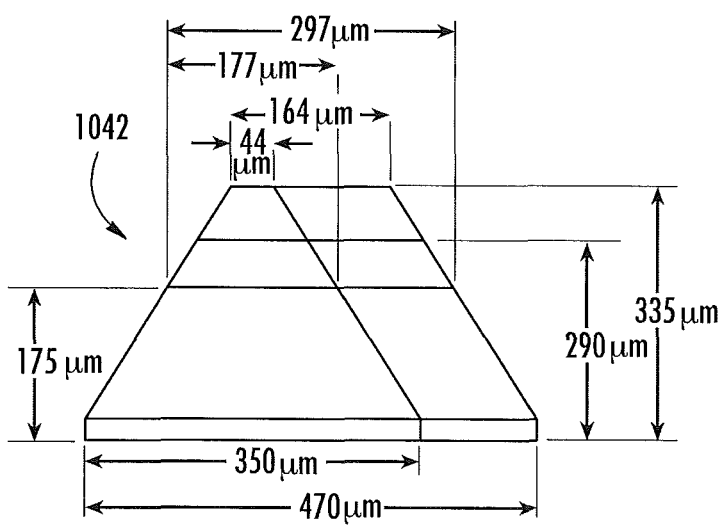

FIGS. 27 and 28 illustrate various measurements of LED chip substrate 1042. FIG. 27 illustrate an embodiment of an LED chip 1040 where substrate 1042 can comprise an approximately square chip that has approximately equal adjacent sides 1044 and 1046. FIG. 28 illustrates an embodiment of an LED chip where the substrate of LED chip 1040 can comprise a substantially non-square shape, such as a rectangular shape where adjacent sides or surfaces 1044 and 1046 can be different lengths. As FIG. 27 illustrates and in one aspect, each of the adjacent sides 1044 and 1046 can be approximately 1 mm in length (e.g., 1000 μm) or less in at least one direction. In other aspects, each of the adjacent sides 1044 and 1046 can comprise approximately 0.85 mm (e.g., 850 μm) in length or less in at least two directions, such as approximately 0.70 mm (e.g., 700 μm), 0.50 mm (e.g., 500 μm), 0.40 mm (e.g., 400 μm), and 0.30 mm (e.g., 300 μm) or less. LED chip 1040 can comprise a thickness t of approximately 0.40 mm or less (e.g., 400 μm or less) such as 0.34 mm (e.g., 340 μm) or less. LED chips 1040 can also comprise square chips, such as chips that are approximately 1000 μm×1000 μm in size; approximately 800 μm×800 μm in size; approximately 500 μm×500 μm in size; and/or approximately 350 μm×350 μm in size.

FIG. 28 illustrates various maximum dimensions for rectangular chips where adjacent sides 1044 and 1046 are different, for example, where side 1044 is smaller than side 1043. FIG. 28 illustrates various dimensions of the smaller and larger sides 1044 and 1046 of LED chip substrate 1042 thickness. In one aspect, adjacent sides 1044 and 1046 can comprise approximately 350 μm×470 μm and can comprise a thickness, or height, of approximately 175 μm. In other aspects, substrate thickness t (FIG. 26B) can comprise a height of approximately 290 μm. In further aspects, substrate thickness t can comprise a height of approximately 335 μm (e.g., 0.335 mm). In one aspect, upper face 1046 can comprise a rectangle of approximately 177 μm×297 μm in length and width. In other aspects, upper face can be a rectangle of approximately 44 μm×164 μm in length and width. Such LED chips 1040 can have a ratio between area of upper face 1048 and maximum area of adjacent sides 1044 and 1046 of approximately 0.4 or less. It has been found that the light extraction can be improved as the ratio of the area of upper face 1048 to the maximum area of sides 1044 and 1046 can be reduced. Notably, LED chips 1040 selected for use have been improved to advantageously increase light extraction efficiency.

Figure 32:
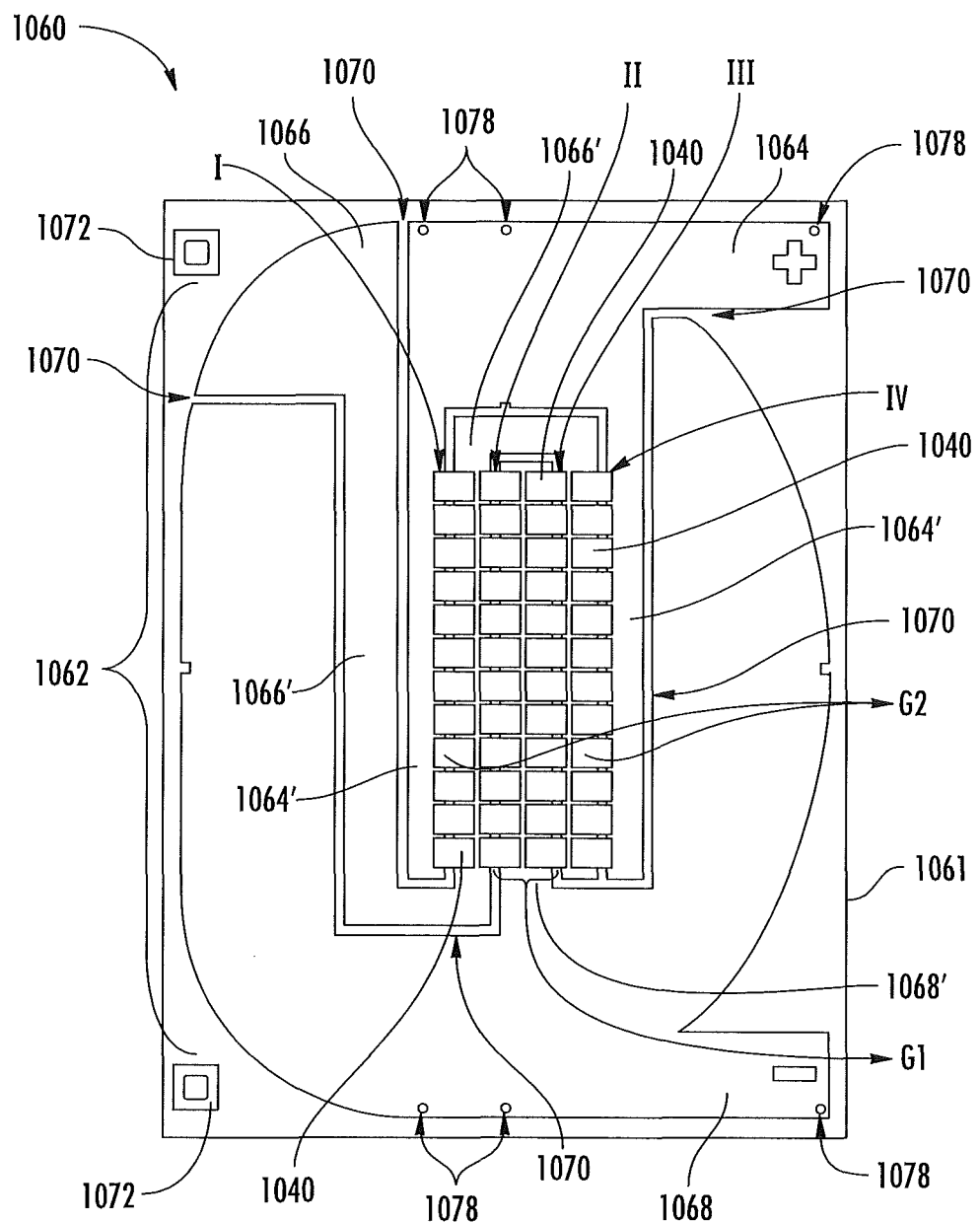
FIG. 32 is a top view illustrating a multi-chip LED package according to another embodiment of the present subject matter.
Figure 36:
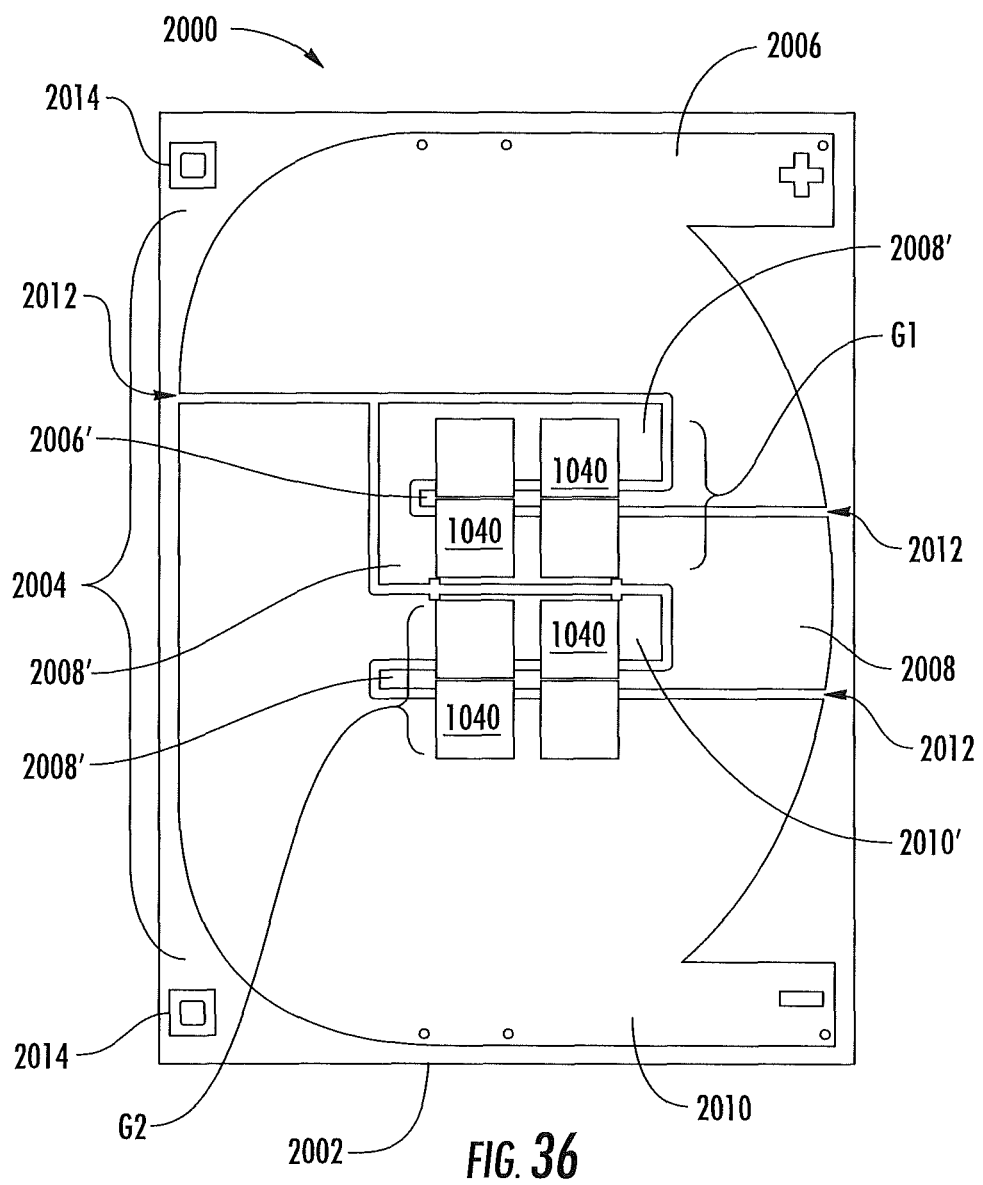
FIG. 36 is a top view of a multi-chip LED package according to another embodiment of the present subject matter.

In one aspect in accordance with the disclosure herein and materials submitted herewith, an LED package can for example utilize LED chips 1040 as disclosed herein, and can comprise an array of LED chips 1040, wherein the array can be in a tightly packed square or rectangular configuration as illustrated, for example, in FIGS. 32 and 36. An asymmetric lens as previously disclosed in FIGS. 20A to 20E can be disposed over a portion of each LED chip 1040. As described below, the LED package can for example comprise more than one, and in some instances three areas of conductive pads and/or portions of conductive material disposed over a submount. Such conductive pads or portions of conductive material can comprise a positive contact pad, an intermediate contact pad, and a negative contact pad. One or more of the pads can be different in configuration from the others.

FIGS. 29 to 32 illustrate a further embodiment of a light emitter package. Light emitter package can comprise an LED package generally designated 1060. Notably, package 1060 can accommodate horizontally structured direct attached LED chips which do not require wire bonds (e.g., chips 1040). For example, package 1060 can comprise LED chips 1040 having a horizontal chip structure where both the positive and negative electrical contacts can be disposed on a same surface, such as the bottom surface. As wire bonds can interfere with, absorb, and/or block light, horizontally structured direct attach LED chips 1040 can advantageously allow for brighter, more efficient packages where the positive and negative electrical contacts are adapted to electrically communicate to conductive portions of the package submount without requiring separate electrical connectors such as wire bonds.

FIG. 29 is a top view of a submount 1061 and electrically conductive traces of LED package 1060. Submount 1061 can comprise a rigid plastic or ceramic based substrate as previously described (e.g., same or similar to submount 12). In one aspect, submount 1061 comprises AlN or $Al_2O_3$. Submount 1061 can be approximately 0.5 mm thick, or between approximately 0.4 and 0.6 mm thick. Submount 1061 can comprise any size and/or shape. For example, submount 1061 can comprise a square shape (FIG. 11) or a rectangular shape such as that shown in FIG. 29. Where submount is substantially rectangular, it can comprise a length of approximately 11 mm and a width of approximately 8 mm, such as, for example 11.25×8.22 mm. In other aspects submount 1061 can comprise at least one side that is greater than approximately 3.5 mm, 5 mm, 9 mm, or 11 mm.

As illustrated in shaded lines of FIG. 29, package 1060 can comprise at least one electrically conductive layer of material generally designated 1062, often comprised of metal, that can be patterned to provide electrically conductive traces configured to supply electrical connectivity to LED chips 1040 (FIG. 32) disposed over submount 1061. Conductive layer 1062 can be disposed on a front or top side of submount 1061 and can comprise one or more portions or areas of material to which LED chips 1040 (FIG. 32) can be attached. Notably, conductive layer 1062 can extend over the majority of a top surface of submount 1061, for example, to within approximately 0.1 mm to 1 mm of each outer edge of submount 1061, in some aspects to within 0.5 mm of each edge. Conductive layer 1062 can comprise at least three conductive pads, or portions of material and can include at least one positive contact pad and a negative contact pad and an intermediate contact pad.

Conductive layer 1062 can comprise a first layer or portion of conductive material such as a first contact pad 1064 comprising a first electrical trace. As the shaded lines in FIG. 29 illustrate, a second intermediate portion of conductive material such as a second contact pad 1066 and a third portion of conductive material such as a third contact pad 1068 comprising second and third electrical traces, respectively, can also be disposed over submount 1061. First contact pad 1064 can comprise portions of material to which anodes 1052 (FIG. 26C) of one or more LED chips 1040 (FIG. 32) can attach. Third contact pad 1068 can electrically connect to cathodes 1056 (FIG. 26C) of LED chips 1040 (FIG. 32) can attach. Second contact pad 1066 can comprise an intermediate conductive pad to which anodes and cathodes of LED chips 1040 (FIG. 32) in adjacent rows can attach. First and third contact pads 1064 and 1068 can comprise electrically separated positive and negative contact pads.

First, second, and third contact pads 1064, 1066, and 1068, respectively, can each comprise portions of material which are centrally disposed with respect to submount 1061. That is, first, second, and third contact pads 1064, 1066, and 1068 can each comprise one or more legs or fillet portions 1064', 1066', and 1068' which can be adjacent to each other and can be physically and electrically separated from each other by one or more gaps generally designated 1070. Gap portions 1058 (FIG. 26C) of LED chips 1040 which are disposed between anode 1054 and cathode 1056 can align over gaps 1070 of package 1060. Notably, leg portions 1066' of second, intermediate contact pad 1066 can be adjacent to and disposed between leg portions 1064' and 1068' of first and third contact pads, respectively.

Leg portions 1066' of second contact pad 1066 can be interdigitated and/or interlocking with respect to leg portions 1064' and 1068' of first and third contact pads such that second, intermediate contact pad 1066 can connect groups of LED chips 1040 in series by electrically communicating with anodes and cathodes of different LED chips 1040 within the different groups. Centrally disposed leg portions 1064', 1066', and 1068' of first, second, and third contact pads 1064, 1066, and 1068 comprise a centrally located connection bus, or a central bus to which cathodes and/or anodes of different LED chips 1040 are connected. The central bus or central connection bus within the meaning of this disclosure is a part of the metal layer of submount 1061 where portions of different LED chips 1040 or different terminals of LED chips 1040 can be disposed for allowing connections that enable relatively high chip-density. Such a central bus typically comprises one or more connection rails or legs providing at least some of the connection portions.

Each of first, second, and third contact pads 1064, 1068, and 1068, respectively, can comprise a layer of material, such as metal, that can be initially deposited or plated over submount 1061 and then subsequently etched to form the desired pattern and/or number of desired portions. Etchant can physically or chemically remove portions of the metal layer and can leave one or more gaps 1070. In other aspects, each of first, second, and third contact pads 1064, 1066, and 1068, respectively, can be separately formed and attached or mounted to submount 1061 via adhesive, glue, etc. In further aspects, each of first, second, and third contact pads 1064, 1066, and 1068, respectively, can be molded into a portion of submount 1061, or produced in any other suitable fashion.

Package 1060 can further comprise one or more connection points generally designated 1072. In one aspect, connection points can comprise thru-holes and/or electrically conductive vias for connecting to an external power source (not shown). In other aspects, connection points 1072 can comprise solder pads adapted to connect to wires (not shown) from the external power source (not shown). Connection points 1072 can comprise Ag vias and/or an additional metal or solder pad deposited over portions of the initially deposited metal layer. An optional layer of white solder mask can be disposed within gaps 1070 and outside conductive layer 1062, such as in the white areas of FIG. 29 outside of the shaded areas which indicate metallized areas. The optional layer of solder mask can be from approximately 10 to 13 µm thick, where used.

FIGS. 30 and 31 are side and bottom (back) views, respectively, of LED package 1061. FIG. 30 is an edge view of submount 1061 onto which a conductive layer 1062 comprised of first, second, and third contact pads 1064, 1066, and 1068, respectively, can be deposited. In one aspect, contact pads can be deposited in a single uniform layer in which chemical etching and/or physical removal of metal can form gaps 1070 thereby defining first, second, and third contact pads 1064, 1066, and 1068, respectively. Each portion of conductive layer 1062 can comprise a first layer of electrolytic Ag, a second layer of electrolytic Cu, and a third, layer of Ti. The Ti and Ag layers are optional. Where used, the electrolytic Ag layer can comprise a thickness of approximately 0.2 µm to 0.3 µm, approximately 0.3 µm to 0.4 µm, or approximately 0.4 µm to 0.5 µm. The Cu layer can comprise a thickness ranging from approximately 40 to 50 µm, approximately 50 µm, or a range from approximately 50 to 60 µm. Where used, the Ti layer can comprise a thickness of approximately 0.04 to 0.06 µm.

FIG. 31 illustrates placement of mounting pads for allowing package 1060 to be mounted over surfaces of an external power source including, for example, a circuit board, PCB, MCPCB, flex circuit, heat sink, etc. A first mounting pad 1074 and a second mounting pad 1076 can be deposited over portions of submount 1061 via a metallization process. First and second mounting pads 1074 and 1076 can electrically communicate to first contact pad 1064 and third contact pad 1068, respectively, by allowing electrical current to pass along one or more electrically conductive vias 1078. Vias 1078 can pass electrical current from the external power source (not shown) internally through portions of submount 1061 via metallization, thereby enabling mounting pads 1074 and 1076 to serve as electrical connections to a printed circuit board or other substrate or structure for package 1060. A thermally conductive mounting pad 1080 can be electrically isolated from first and second mounting pads 1074 and 1076, and can provide good thermal conductivity for submount 1061. Optional areas of solder mask 1082 can be disposed between portions of thermally conducive mounting pad 1080 and first and second mounting pads 1074 and 1076. Solder mask 1082 can optionally comprise a green solder mask.

In FIGS. 30 and 31, three electrically conducive vias 1078 are shown for each polarity and can connect first contact pad 1064 and first mounting pad 1074 allowing electrical current to pass therebetween. Vias 1078 can further electrically connect third contact pad 1068 and second mounting pad 1076 allowing electrical current to pass therebetween, and into the plurality of LED chips 1040 (FIG. 32).

FIG. 32 is another top view of submount 1061 of package 1060 comprising one or more LED chips 1040 attached thereto. LED chips 1040 are schematically illustrated as squares, but can comprise any shape and can further and optionally comprise a top surface groove (e.g., X-shaped groove FIG. 26A). As FIG. 32 illustrates, a plurality and/or array of LED chips 1040 can be provided over portions of contact pads. In one aspect, 48 LED chips 1040 can be disposed over portions of contact pads. In one aspect, LED chips 1040 can be arranged in four segments (or strings) designated I to IV of LED chips 1040. Each segment I, II, III, and IV can comprise twelve LED chips 1040 electrically connected in parallel. First segment I and fourth segment IV can comprise a first group G1 of LED chips 1040 that is electrically connected in parallel. Second segment II and third segment III can comprise a second group G2 of LED chips 1040 that can also be electrically connected in parallel.

First group G1 can be electrically connected in series with second group G2 of LED chips 1040. First group G1 and second group G2 can be mutually-exclusive and have the same number (e.g., 24) of LED chips 1040. More than two groups of LED chips 1040, and/or more than four segments of LED chips 1040 are contemplated herein. The parallel and/or series connections can all be non-wire bond connections. Although not shown for illustration purposes, an asymmetric lens 1006 (FIG. 20A) can be provided and/or overmolded on a portion of submount 2002. Lens 1006 (FIG. 20A) can also be disposed over portions of the array and groups of LED chips 1002. In this aspect, LED package 1060 can be configured to refract light toward a preferential direction as previously described.

FIGS. 33 to 36 illustrate a further embodiment of a light emitter package for use with light emitters such as LED chips. Light emitter package can comprise an LED package, generally designated 2000. Notably, LED package 2000 can also comprise direct attached and/or horizontally structured LED chips 1040 (FIGS. 26A to 26C) which do not require wire bonds. For example, package 2000 can comprise LED chips 1040 having a horizontal chip structure where both the positive and negative electrical contacts can be disposed on a same surface, such as the bottom surface. As wire bonds can interfere with, absorb, and/or block light, horizontally structured direct attach LED chips 1040 can advantageously allow for brighter, more efficient packages where the positive and negative electrical contacts are adapted to electrically communicate to conductive portions (e.g., conductive pads) of the package submount without requiring wire bonds.

In one aspect, an array of eight LED chips 1040 can be disposed within package 2000 and mounted over a submount 2002. Submount 2002 can comprise a rigid plastic or ceramic based substrate as previously described (e.g., same or similar to submount 12). In one aspect, submount 2002 comprises AlN or $Al_2O_3$. Submount 2002 can be approximately 0.5 mm thick, or between approximately 0.4 and 0.6 mm thick. Submount 2002 can comprise any size and/or shape. For example, submount 2002 can comprise a square shape (FIG. 11) or a rectangular shape such as that shown in FIG. 29. Where submount is substantially rectangular, it can comprise a length of approximately 11 mm and a width of approximately 8 mm, such as, for example 11.25×8.22 mm. In other aspects submount 2002 can comprise at least one side that is greater than approximately 3.5 mm, 5 mm, 9 mm, or 11 mm.

As illustrated in shaded lines of FIG. 33, package 2000 can comprise at least one electrically conductive layer of material generally designated 2004, often comprised of metal, that can be patterned to provide electrically conductive traces configured to supply electrical connectivity to LED chips 1040 (FIG. 36) disposed over submount 2002. Conductive layer 2004 can be disposed on a front or top side of submount 2002 (opposing a bottom or back side) and can comprise one or more portions or areas of material to which LED chips 1040 (FIG. 36) can be attached. Notably, conductive layer 2004 can extend over the majority of a top surface of submount 2002, for example, to within approximately 0.1 mm to 1 mm of each outer edge of submount 2002, in some aspects to within 0.5 mm of each edge.

Conductive layer 2004 can comprise a first layer or portion of conductive material such as a first contact pad 2006 comprising a first electrical trace. As the shaded lines in FIG. 33 illustrate, a second intermediate portion of conductive material such as a second contact pad 2008 and a third portion of conductive material such as a third contact pad 2010 comprising second and third electrical traces, respectively, can also be disposed over submount 2002. First contact pad 2006 can comprise portions of material to which anodes 1052 (FIG. 26C) of one or more LED chips 1040 (FIG. 36) can attach. Third contact pad 2010 can electrically connect to cathodes 1056 (FIG. 26C) of LED chips 1040 (FIG. 36) can attach. Second contact pad 2008 can comprise an intermediate conductive pad to which anodes and cathodes of LED chips 1040 (FIG. 36) in adjacent rows can attach.

First, second, and third contact pads 2006, 2008, and 2010, respectively, can each comprise portions of material which are centrally disposed with respect to submount 2002. That is, first, second, and third contact pads 2006, 2008, and 2010 can each comprise one or more legs or fillet portions 2006', 2008', and 2010' which can be adjacent to each other and can be physically and electrically separated from each other by one or more gaps generally designated 2012. Notably, leg portions 2008' of second, intermediate contact pad 2008 can be adjacent to and disposed between leg portions 2006' and 2010' of first and third contact pads, respectively. Leg portions 2008' of second contact pad 2008 can be interdigitated and/or interlocking with respect to leg portions 2006' and 2010' of first and third contact pads such that second, intermediate contact pad 2008 can connect groups of LED chips 1040 in series by electrically communicating with anodes and cathodes of different LED chips 1040 within the different groups. Centrally disposed leg portions 2006', 2008', and 2010' of first, second, and third contact pads 2006, 2008, and 2010 comprise a centrally located connection bus, or a central bus to which cathodes and/or anodes of different LED chips 1040 are connected. The central bus advantageously allows for tighter, more centralized packing of a plurality of LED chips 1040.

Each of first, second, and third contact pads 2006, 2008, and 2010, respectively, can comprise a layer of material, such as metal, that can be initially deposited or plated over submount 2002 and then subsequently etched to form the desired pattern and/or number of desired portions. Etchant can physically or chemically remove portions of the metal layer and can leave one or more gaps 2012. In other aspects, each of first, second, and third contact pads 2006, 2008, and 2010, respectively, can be separately formed and attached or mounted to submount 2002 via adhesive, glue, etc. In further aspects, each of first, second, and third contact pads 2006, 2008, and 2010, respectively, can be molded into a portion of submount 2002, or produced in any other suitable fashion.

Package 2000 can further comprise one or more connection points generally designated 2014. In one aspect, connection points can comprise thru-holes and/or electrically conductive vias for connecting to an external power source (not shown). In other aspects, connection points 2014 can comprise solder pads adapted to connect to wires (not shown) from the external power source (not shown). Connection points 2014 can comprise Ag vias and/or an additional metal or solder pad deposited over portions of the initially deposited metal layer. An optional layer of white solder mask can be disposed within gaps 2014 and outside conductive layer 2004, such as in the white areas of FIG. 33 outside of the shaded areas which indicate metallized areas. The optional layer of solder mask can be from approximately 10 to 13 μm thick, where used.

FIGS. 34 and 34 are side and bottom (back) views, respectively, of LED package 2000. FIG. 34 is an edge view of submount 2002 onto which a conductive layer 2004 comprised of first, second, and third contact pads 2006, 2008, and 2010, respectively, can be deposited. In one aspect, contact pads can be deposited in a single uniform layer in which chemical etching and/or physical removal of metal can form gaps 2012 thereby defining first, second, and third contact pads 2006, 2008, and 2010, respectively. Each portion of conductive layer 2004 can comprise a first layer of electrolytic Ag, a second layer of electrolytic Cu, and a third, layer of Ti. The Ti and Ag layers are optional. Where used, the electrolytic Ag layer can comprise a thickness of approximately 0.2 μm to 0.3 μm, approximately 0.3 μm to 0.4 μm, or approximately 0.4 μm to 0.5 μm. The Cu layer can comprise a thickness ranging from approximately 40 to 50 μm, approximately 50 μm, or a range from approximately 50 to 60 μm. Where used, the Ti layer can comprise a thickness of approximately 0.04 to 0.06 μm.

FIG. 35 illustrates placement of mounting pads for allowing package 2000 to be mounted over surfaces of an external power source including, for example, a circuit board, PCB, MCPCB, flex circuit, heat sink, etc. A first mounting pad 2016 and a second mounting pad 2018 can be deposited over portions of submount 2002 via a metallization process. First and second mounting pads 2016 and 2018 can electrically communicate to first contact pad 2006 and third contact pad 2018, respectively, by allowing electrical current to pass along one or more electrically conductive vias 2020. Vias 2020 can pass electrical current from the external power source (not shown) internally through portions of submount 2002 via metallization, thereby enabling mounting pads 2016 and 2018 to serve as electrical connections to a printed circuit board or other substrate or structure for package 2000. A thermally conductive mounting pad 2022 can be electrically isolated from first and second mounting pads 2016 and 2018, and can provide good thermal conductivity for submount 2002. Optional areas of solder mask 2024 can be disposed between portions of thermally conducive mounting pad 2022 and first and second mounting pads 2016 and 2018. Solder mask 2024 can optionally comprise a green solder mask.

In FIGS. 34 and 35, three electrically conducive vias 2020 are shown for each polarity and can connect first contact pad 2006 and first mounting pad 2016 allowing electrical current to pass therebetween. Vias 2020 can further electrically connect third contact pad 2010 and second mounting pad 2018 allowing electrical current to pass therebetween, and into the plurality of LED chips 1040 (FIG. 36).

FIG. 36 is another top view of package 2000 comprising one or more LED chips 1040 attached thereto. LED chips 1040 are schematically illustrated as squares, but can comprise any shape and can further and optionally comprise a top surface groove (e.g., X-shaped groove FIG. 26A). As FIG. 36 illustrates, a plurality and/or array of LED chips 1040 can be provided over portions of contact pads. In one aspect, eight LED chips 1040 can be disposed over portions of contact pads. In one aspect, LED chips 1040 can be arranged in two groups, a first group G1 and a second group G2. First group G1 and second group G2 can be mutually-exclusive and have the same number (e.g., 4) of LED chips 1040. Each LED chip 1040 within each of first and second groups G1 and G1 can be electrically connected in parallel. First and second groups G1 and G2 can each comprise four LED chips 1040. First group G1 of LED chips 1040 can be electrically connected in series with second group G2 of LED chips 1040. More than two groups of LED chips 1040 and/or more than eight LED chips 1040 are contemplated herein. The parallel and/or series connections can all be non-wire bond connections, and any suitable combination of series and/or parallel electrical connections can be used. An asymmetric lens 1006 (FIG. 20A) can be provided and/or overmolded on a portion of submount 2002. Lens 1006 (FIG. 20A) can also be disposed over portions of the array and groups of LED chips 1002. In this aspect, LED package 2000 can be configured to refract light toward a preferential direction as previously described.

Notably, packages described in FIGS. 29 to 36 can exhibit and/or deliver approximately 100 lumens per watt (LPW) or more at 1.5 amps (A) and/or 9 watts (W), which is brighter and more efficient than conventional LED packages. Chromaticity of these packages can vary from warm white (WW) of approximately 3500 K to 4000 K (e.g., or less than approximately 4500 K) to cool white (CW) of approximately 4500 to 7000 K. In each case, package 1060 and package 2000 can comprise interlocking positive (e.g., first), negative (e.g., third), and second (intermediate) contact pads having an array of LED chips 1040 directly attached thereto via non-wire bond connections. Portions of the positive and negative contact pads can be adjacent to each other. The positive contact pad can be adjacent to intermediate contact pad along at least three, or more than three sides. The negative contact pad can also be adjacent to the intermediate contact pad along at least three, or more than three sides.

Despite the specific examples provided above and herein, an LED package can comprise any combination of series and/or parallel electrical connections along with any LED chip arrangement or configuration. Regarding the LED packages, the present subject matter has been described in detail with reference to certain embodiments and configurations thereof, but other versions are possible. While the principles of this subject matter have been described in connection with specific embodiments, it should be understood clearly that these descriptions are made only by way of example and are not intended to limit the scope of the subject matter.

We claim:

1. A method of providing a light emitter package, the method comprising:
   providing a submount having a planar upper surface;
   providing an array of light emitter chips disposed over a portion of the planar upper surface of the submount in a rectangular arrangement;
   connecting each light emitter chip of the array of light emitter chips to conductive portions of the submount via non-wire bond connections; and
   providing a lens over the array of light emitter chips, wherein the lens is asymmetric about a central axis of the submount that is orthogonal to the planar upper surface of the submount.

2. The method of claim 1, wherein directly connecting each light emitter chip comprises connecting the bottom side of each light emitter chip to conductive portions of the submount via a eutectic direct die attach process.

3. The method of claim 1, wherein conductive portions of the submount comprise a positive contact pad, a negative contact pad, and at least one intermediate contact pad.

4. The method of claim 3, further comprising providing portions of intermediate contact pad between portions of the positive and negative contact pads.

5. The package of claim 1, wherein providing an asymmetric lens comprises overmolding the asymmetric lens.

6. The method of claim 1, wherein each light emitter chip comprises a horizontal chip structure having positive and negative electrical contacts disposed on a same side.

7. The method of claim 6, wherein the positive and negative electrical contacts are disposed on a bottom side of each light emitter chip.

8. A light emitter package comprising:
an array of light emitter chips disposed on a submount in a rectangular arrangement and connected without wire bonds, wherein the array of light emitter chips comprises a center point coincident with the center point of the submount;
a lens disposed over the array of light emitter chips, and wherein the lens is asymmetric about the center point of the array of light emitter chips; and
a positive electrical pad, an intermediate electrical pad, and a negative electrical pad.

9. The package of claim 8, wherein a portion of the intermediate contact pad is disposed between portions of the positive and negative contact pads.

10. The package of claim 8, wherein a portion of the positive contact pad is adjacent to a portion of the negative contact pad.

11. The package of claim 8, wherein the positive contact pad is adjacent to intermediate contact pad along at least three sides.

12. The package of claim 8, wherein the negative contact pad is adjacent to intermediate contact pad along at least three sides.

13. The package of claim 8, wherein the array defines an LED chip-populated area having an aspect ratio greater than 1.

14. The package of claim 8, wherein the array defines an LED chip-populated area having an aspect ratio greater than 2.

15. The package of claim 8, wherein the array defines an LED chip-populated area having an aspect ratio greater than 3.

16. A light emitter package comprising:
a submount comprising a ceramic material having a planar upper surface;
an array of light emitter chips disposed on a portion of the planar upper surface of the submount, wherein each light emitter chip comprises a horizontal chip structure having positive and negative electrical contacts disposed on a same side, wherein the positive and negative electrical contacts are adapted to electrically communicate to conductive portions of the submount; and
a lens overmolded on the planar upper surface of the submount and covering a portion of the array, wherein the lens is asymmetric about a central axis of the submount that is orthogonal to the planar upper surface of the submount.

17. The package of claim 16, wherein the package is adapted to deliver approximately 100 lumens per watt (LPW) or more at 1.5 amps (A) and/or 9 watts (W).

18. The package of claim 16, wherein the package is configured to refract light emitted by the array of light emitter chips toward a preferential direction.

19. The package of claim 18, wherein:
the array of light emitter chips defines an emitter axis; and
the lens has an outer surface and a centerline which is offset from the emitter axis toward the preferential direction.

20. The package of claim 1, wherein the package comprises a first contact pad, a second contact pad, and a third contact pad.

21. The package of claim 20, wherein each of the first, second, and third contact pads comprise centrally disposed leg portions.

22. The package of claim 21, wherein leg portions of the second contact pad are disposed between leg portions of the first and third contact pads.

23. The package of claim 16, wherein the light emitter chips comprise light emitting diode (LED) chips.

24. The package of claim 23, wherein the LED chips are approximately 1000 µm×1000 µm in size.

25. The package of claim 23, wherein the LED chips are approximately 350 µm ×350 µm in size.

26. The package of claim 23, wherein the package comprises an array of eight LED chips.

27. The package of claim 23, wherein the package comprises an array of forty-eight LED chips.

* * * * *

UNITED STATES PATENT AND TRADEMARK OFFICE
CERTIFICATE OF CORRECTION

| | | |
|---|---|---|
| PATENT NO. | : 9,172,012 B2 | Page 1 of 1 |
| APPLICATION NO. | : 13/796045 | |
| DATED | : October 27, 2015 | |
| INVENTOR(S) | : Andrews et al. | |

It is certified that error appears in the above-identified patent and that said Letters Patent is hereby corrected as shown below:

In The Claims

Column 40, lines 23-25 please revise claim 20 as follows:

20. The package of claim 16, wherein the package comprises a first contact pad, a second contact pad, and a third contact paid.

Signed and Sealed this
Twenty-second Day of March, 2016

Michelle K. Lee
*Director of the United States Patent and Trademark Office*